(12) United States Patent
Nichols et al.

(10) Patent No.: US 7,983,436 B2
(45) Date of Patent: Jul. 19, 2011

(54) BAFFLE VIBRATION REDUCING

(75) Inventors: George Nichols, Dover, MA (US);
Michael D. Rosen, Weston, MA (US);
Hal P. Greenberger, Natick, MA (US)

(73) Assignee: Bose Corporation, Framingham, MA (US)

( * ) Notice: Subject to any disclaimer, the term of this patent is extended or adjusted under 35 U.S.C. 154(b) by 317 days.

(21) Appl. No.: 12/423,572

(22) Filed: Apr. 14, 2009

(65) Prior Publication Data

US 2009/0208026 A1    Aug. 20, 2009

Related U.S. Application Data

(60) Division of application No. 10/999,419, filed on Nov. 30, 2004, now Pat. No. 7,551,749, which is a continuation-in-part of application No. 10/226,507, filed on Aug. 23, 2002, now Pat. No. 6,985,593.

(51) Int. Cl.
*H04R 1/02* (2006.01)
*H04R 7/00* (2006.01)

(52) U.S. Cl. ........................................ 381/335; 181/163

(58) Field of Classification Search .................. 381/71.1, 381/71.2, 150, 308, 335, 386; 181/155, 156, 181/163
See application file for complete search history.

(56) References Cited

U.S. PATENT DOCUMENTS

| | | |
|---|---|---|
| 2,358,823 A | 9/1944 | O'Connor et al. |
| 2,768,702 A | 10/1956 | Lowry |
| 2,993,091 A | 7/1961 | Guss |
| 3,202,773 A | 8/1965 | Tichy |
| 3,649,776 A | 3/1972 | Burton |
| 3,688,864 A | 9/1972 | Guss |
| 3,815,707 A | 6/1974 | Burhoe |
| 4,008,374 A | 2/1977 | Tiefenbrun |
| 4,039,044 A | 8/1977 | Heil |
| 4,182,931 A | 1/1980 | Kenner |
| 4,213,008 A | 7/1980 | Helffrich |
| 4,325,454 A | 4/1982 | Humphrey |
| 4,504,704 A | 3/1985 | Ohyaba et al. |
| 4,590,333 A | 5/1986 | Strohbeen |

(Continued)

FOREIGN PATENT DOCUMENTS

DE        19637847       3/1998

(Continued)

OTHER PUBLICATIONS

Chinese Office Action for Application No. 200510003434.9 dated Nov. 11, 2010, 11 pages.

(Continued)

*Primary Examiner* — Brian Ensey

(57) ABSTRACT

An apparatus for reducing baffle vibration includes a baffle that is subject to vibration. A first transducer that is seated in the baffle includes a first diaphragm that is acoustically coupled to a listening area in a vehicle and also acoustically coupled to a cavity in the vehicle. A first input signal applied to the first transducer causes the first diaphragm to move in a first direction, thereby generating an acoustic output. A second transducer is mechanically coupled to the first transducer. The second transducer includes a second diaphragm that is acoustically coupled to the first diaphragm and also acoustically coupled to the listening area. A second input signal applied to the second transducer causes the second diaphragm to move in a second direction that is substantially opposite to the first direction to reduce a vibration imparted to the baffle while substantially maintaining the acoustic output.

34 Claims, 26 Drawing Sheets

U.S. PATENT DOCUMENTS

| | | | |
|---|---|---|---|
| 4,733,749 A | 3/1988 | Newman et al. | |
| 4,783,820 A | 11/1988 | Lyngdorf et al. | |
| 4,875,546 A | 10/1989 | Krnan | |
| 4,882,760 A | 11/1989 | Yee | |
| 4,903,300 A | 2/1990 | Polk | |
| 5,023,914 A | 6/1991 | Arnold | |
| 5,092,424 A | 3/1992 | Schreiber et al. | |
| 5,119,431 A | 6/1992 | Hamby | |
| 5,212,732 A | 5/1993 | Hipps et al. | |
| 5,253,301 A | 10/1993 | Sakamoto et al. | |
| 5,388,162 A | 2/1995 | Sohn | |
| 5,532,437 A | 7/1996 | Simplicean et al. | |
| 5,537,479 A | 7/1996 | Kreisel et al. | |
| 5,594,804 A | 1/1997 | Kim | |
| 5,621,804 A | 4/1997 | Beppu | |
| 5,664,020 A | 9/1997 | Goldfarb et al. | |
| 5,703,337 A | 12/1997 | Geisenberger | |
| 5,850,460 A | 12/1998 | Tanaka et al. | |
| 6,031,919 A | 2/2000 | Funahashi et al. | |
| 6,031,925 A | 2/2000 | Shteyn | |
| 6,195,442 B1 | 2/2001 | Griffin et al. | |
| 6,353,670 B1 | 3/2002 | Gasner | |
| 6,493,452 B1 | 12/2002 | Koizumi et al. | |
| 6,628,792 B1 | 9/2003 | Paddock | |
| 6,678,384 B2 * | 1/2004 | Kowaki et al. | 381/386 |
| 6,878,384 B2 | 4/2005 | Cruise et al. | |
| 6,985,593 B2 * | 1/2006 | Nichols et al. | 181/163 |
| 2002/0150275 A1 | 10/2002 | Guenther | |
| 2004/0008858 A1 | 1/2004 | Steere et al. | |
| 2004/0008859 A1 | 1/2004 | Zhao | |
| 2004/0017920 A1 | 1/2004 | Nishikawa et al. | |
| 2004/0105565 A1 | 6/2004 | Butters et al. | |
| 2004/0208338 A1 | 10/2004 | Pan et al. | |
| 2005/0129258 A1 | 6/2005 | Fincham | |

FOREIGN PATENT DOCUMENTS

| | | |
|---|---|---|
| EP | 0410352 | 1/1991 |
| EP | 0771133 | 5/1997 |
| EP | 1257147 | 11/2002 |
| EP | 1427247 | 6/2004 |
| GB | 2258365 | 2/1993 |
| GB | 2387987 | 10/2003 |
| JP | 54023519 | 2/1979 |
| JP | 07170597 | 7/1995 |
| JP | 8019089 | 1/1996 |
| JP | 10178693 | 6/1998 |
| JP | 11027784 | 1/1999 |
| JP | 11178085 | 7/1999 |
| WO | 9967975 | 12/1999 |
| WO | 02052892 | 7/2002 |

OTHER PUBLICATIONS

Office Action dated Jun. 6, 2008 from China Application No. 03147033.5.

The European Search Report, dated Apr. 18, 2008, in corresponding EP Application Application No. 05111421.3.

Linwitz Lab, Dipole Woofer, Nov. 15, 2002, pp. 1-6, http://www.linkwitzlab.com/woofer.htm.

D.B. Keele, Jr, Kef Reference Series Model Four Speakers, Audio/Jun. 1996, pp. 50-55.

http:/lwww.linkwitzlab.com/woofer.htm, (Aug. 11, 2003).

Office Action dated Jun. 12, 2009, for China Application No. 03147033.5, filed Aug. 23, 2003.

Examination Report for application No. 03102533.1, dated Oct. 30, 2009.

* cited by examiner

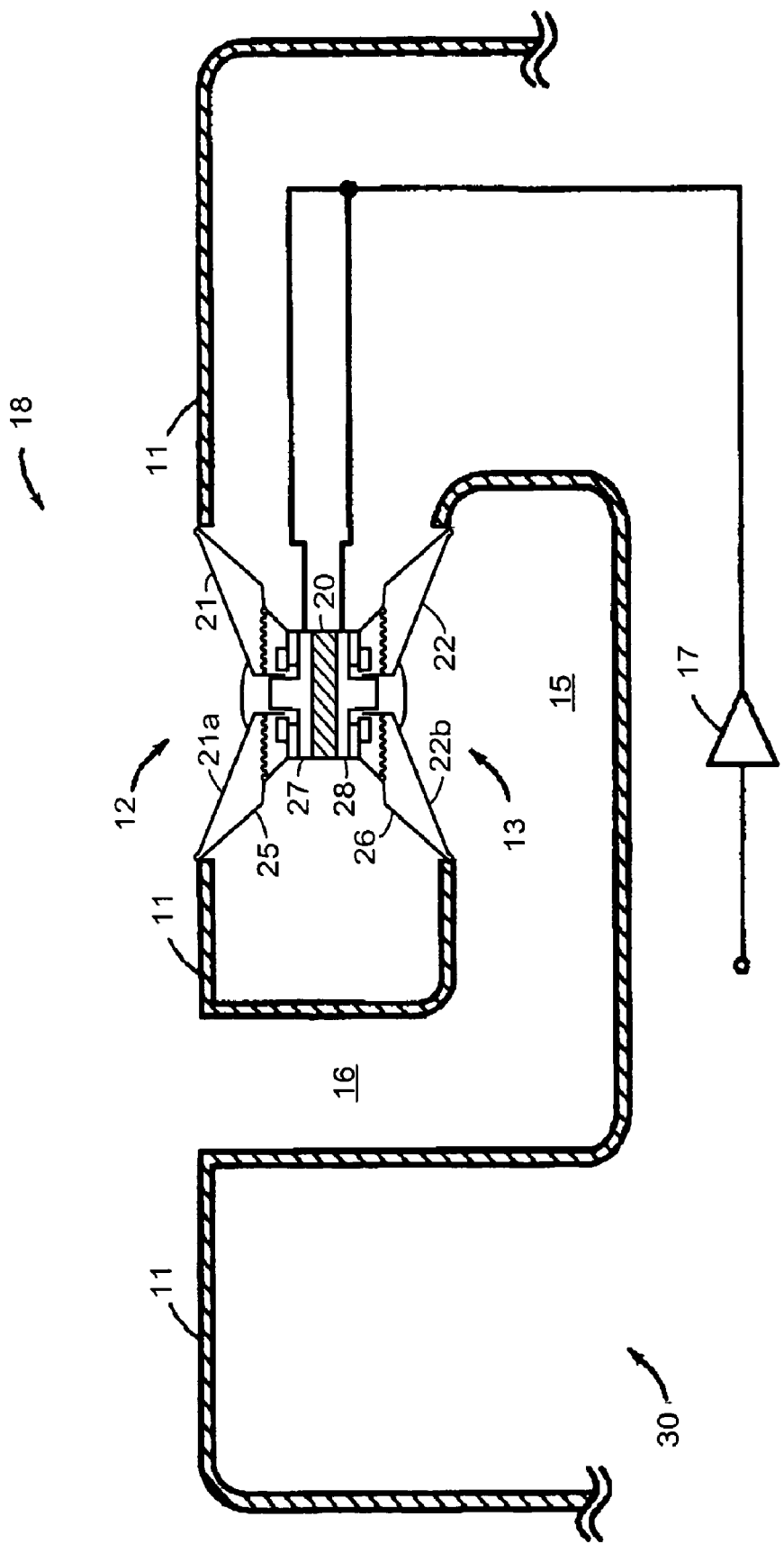

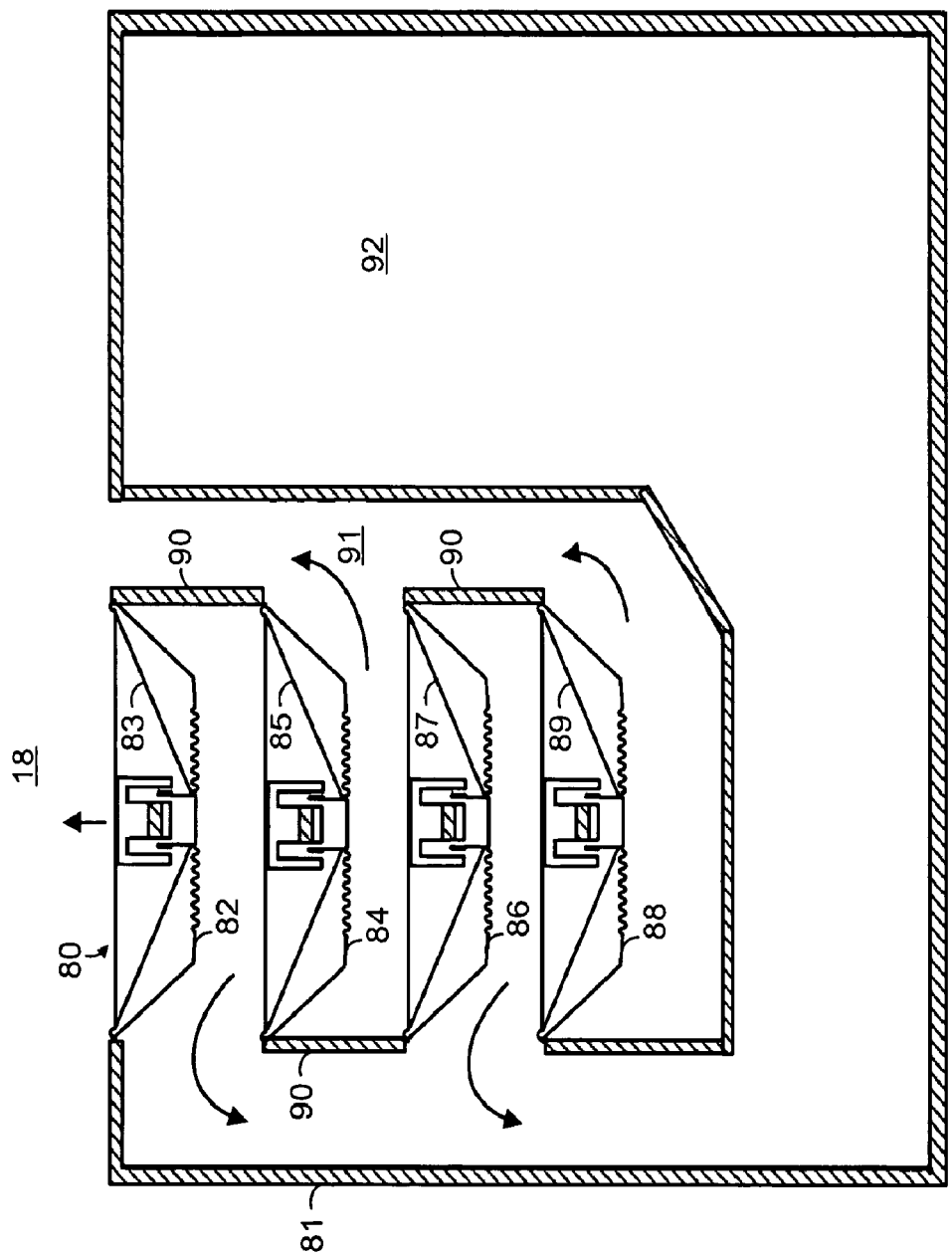

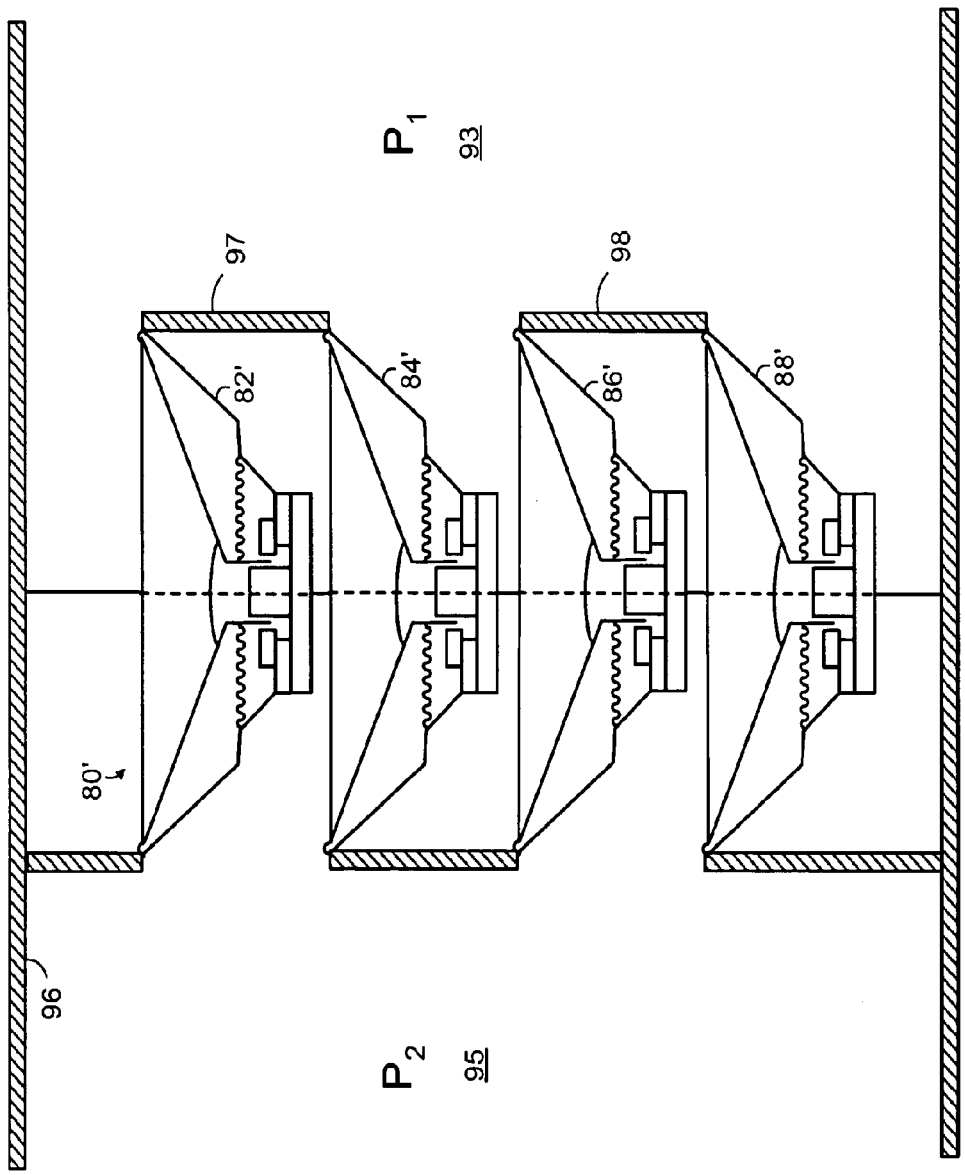

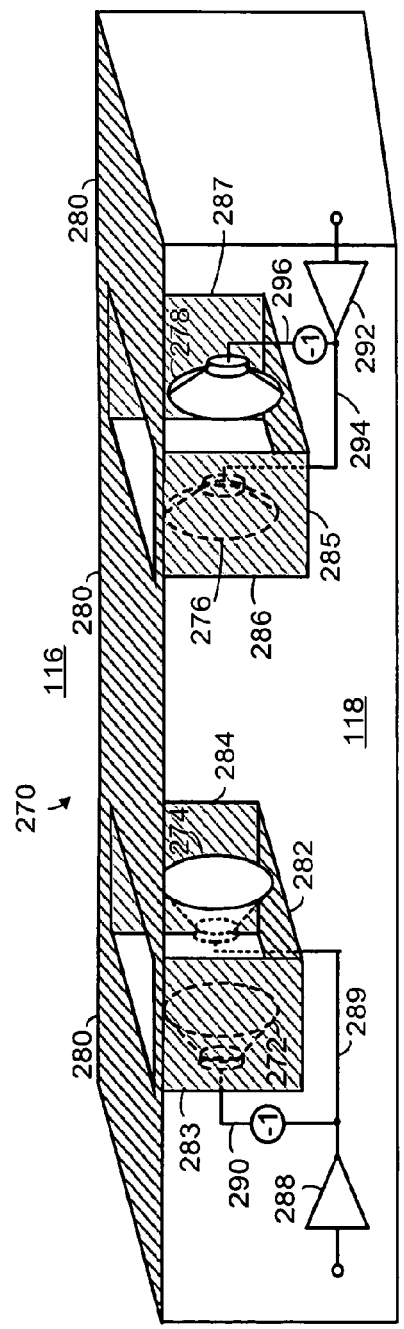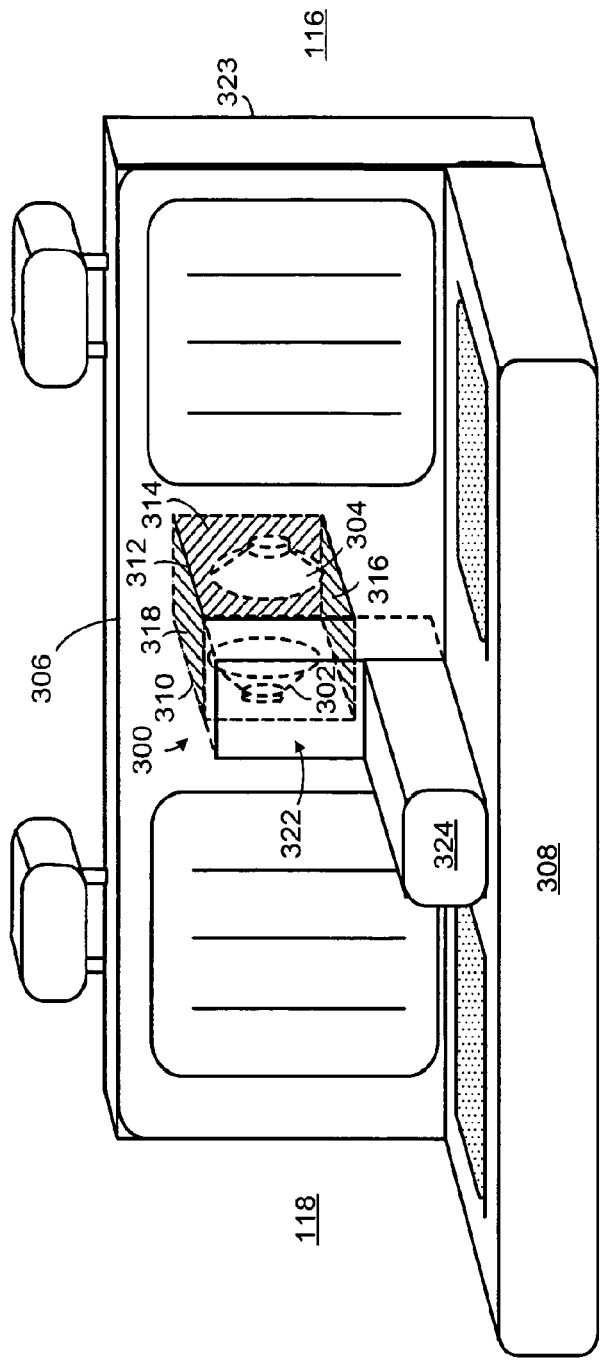
FIG. 10
FIG. 11

BAFFLE VIBRATION REDUCING

CROSS-REFERENCE TO RELATED APPLICATIONS

This patent application is a continuation of and claims priority to U.S. patent application Ser. No. 10/999,419, filed Nov. 30, 2004, now U.S. Pat. No. 7,551,749, which is a continuation-in-part (CIP) of U.S. patent application Ser. No. 10/226,507, filed on Aug. 23, 2002, entitled Baffle Vibration Reducing, the entire disclosures of which are incorporated herein by reference.

BACKGROUND

When an electroacoustic transducer, such as a loudspeaker driver, is mounted to a structure, such as a package shelf, the door of a vehicle, the wall of an enclosure, other wall or other baffle, where the attachment is usually on the periphery of the transducer frame, an energized transducer motor develops forces in response to an energizing electrical signal. The forces generated by the motor cause the diaphragm of the transducer to move relative to the transducer frame. These forces will also be transmitted through the frame to the structure through the attachment points of the frame. Package shelves and door panels of vehicles are often fabricated from thin material, such as thin sheet metal. Such structures typically have insufficient stiffness to resist vibration and are typically lightly damped. As a result, forces applied to the structure around modal resonance frequencies of the structure may result in excessive vibration of the structure, which can be acoustically perceived as unwanted buzzes and rattles, or degraded frequency response of the radiated sound.

SUMMARY

According to one aspect of the invention, a first electroacoustical transducer incorporating a movable diaphragm is seated in and structurally coupled to a panel. The transducer is mechanically connected to a device containing a compensating moveable mass driven mechanically out of phase with the movement of the diaphragm of the first electroacoustical transducer, to significantly reduce the resultant force applied to the panel. Typically the device with compensating mass is a second electroacoustical transducer identical to the first transducer. According to another aspect of the invention, the acoustic output from the first side of the first transducer is acoustically coupled to a listening environment, such as a vehicle passenger compartment or living room. The acoustic output from the side of the second transducer facing away from the first transducer is also coupled to the listening environment through an acoustical element or elements such as compliant volume and/or port so that the acoustical output into the listening environment from the facing away side of the second transducer is effectively in phase with the output into the listening environment from the first side of the first transducer, over a desired frequency range. The acoustic elements are arranged such that the output from the away facing side of the second transducer is not acoustically coupled to the output from the second side of the first transducer or the output from the first side of the second transducer. Thus, the invention achieves both significant reduction in unwanted mechanical vibration of the supporting structure with enhanced acoustic output from the second transducer.

In one aspect, the invention is embodied in an apparatus for reducing baffle vibration in a vehicle. The apparatus includes a baffle that is subject to vibration. A first transducer is seated in the baffle. The first transducer includes a first diaphragm having a first surface that is acoustically coupled to a listening area in the vehicle and a second surface that is acoustically coupled to a cavity in the vehicle. A first input signal is applied to the first transducer which causes the first diaphragm to move in a first direction, thereby generating an acoustic output. A second transducer is mechanically coupled to the first transducer. The second transducer includes a second diaphragm having a first surface that is acoustically coupled to one of the first and the second surfaces of the first diaphragm. A second surface is acoustically coupled to one of the listening area and the cavity in the vehicle. A second input signal is applied to the second transducer and causes the second diaphragm to move in a second direction that is substantially opposite to the first direction to reduce a vibration imparted to the baffle from the movement of the first diaphragm while substantially maintaining the acoustic output. The reduction in the vibration imparted to the baffle is generally observed over a large frequency range. However, there can be various frequencies where the reduction in the vibration imparted to the baffle is less pronounced.

The first input signal and the second input signal can have opposite relative polarity. In another example, the first input signal and the second input signal are identical.

The first surface of the first diaphragm can be a front surface of the first diaphragm and a second surface of the first diaphragm can be a rear surface of the first diaphragm. Alternatively, the first surface of the first diaphragm can be a rear surface of the first diaphragm and a second surface of the first diaphragm can be a front surface of the first diaphragm.

The first surface of the second diaphragm can be a front surface of the second diaphragm and a second surface of the second diaphragm can be a rear surface of the second diaphragm. Alternatively, the first surface of the second diaphragm can be a rear surface of the second diaphragm and a second surface of the second diaphragm can be a front surface of the second diaphragm.

In one embodiment, the second transducer is inverted relative to the first transducer. In one embodiment, at least one of the first and the second diaphragms is elliptically-shaped. The motor structure of the first transducer can be mechanically coupled to a motor structure of the second transducer. In one example, a frame of the first transducer is mechanically coupled to a frame of the second transducer.

The second surface of the first diaphragm can be acoustically coupled to a passive radiator. The second surface of the second diaphragm can be acoustically coupled to the listening area in the vehicle through an acoustic conduit. The acoustic conduit can have a smoothly varying cross-sectional area. In one example, the second surface of the second diaphragm is acoustically coupled to the listening area in the vehicle through an acoustic port.

The acoustic output from the second surface of the second diaphragm can be coupled to the listening area in the vehicle substantially in-phase with the acoustic output from the first surface of the first diaphragm. The cavity can be a trunk of the vehicle.

In one embodiment, at least one of the first and the second transducers includes an inverted motor structure. A low pass filter can be coupled to at least one of the first and the second transducers. The low pass filter restricts spectral components of at least one of the first and the second input signals above a predetermined cutoff frequency. The low pass filter can be an electrical low pass filter or an acoustical low pass filter.

The apparatus can also include a third transducer and a forth transducer that are mechanically coupled to the first and the second transducers. The first, the second, the third, and the fourth transducers can be aligned substantially in a column.

In another aspect, the invention is embodied in an electro-acoustic transducer that includes a magnet assembly having a first magnetic flux gap and a second magnetic flux gap. A first voice coil is positioned in the first magnetic flux gap. A first diaphragm is mechanically coupled to the first voice coil and to a frame. The first voice coil moves the first diaphragm in a first direction in response to receiving a first input signal. A second voice coil is positioned in the second magnetic flux gap. A second diaphragm is mechanically coupled to the second voice coil and to the frame. The second voice coil moves the second diaphragm in a second direction that is substantially opposite to the first direction in response to receiving a second input signal. The movement of the second diaphragm reduces a vibration imparted to the frame by the movement of the first diaphragm.

The first input signal and the second input signal can have opposite relative polarity. The first input signal and the second input signal can be identical.

In one example, the second voice coil substantially surrounds the first voice coil. In one example, the first voice coil has substantially the same diameter as the second voice coil. The first magnetic flux gap can be substantially symmetrical to the second magnetic flux gap. The second magnetic flux gap can be concentrically positioned relative to the first magnetic flux gap. The magnet assembly can include a ring magnet, a donut magnet, or a slug magnet.

The magnet assembly can also include a copper shorting ring that is positioned proximate to at least one of the first and the second magnetic flux gap. The magnet assembly can include a ring magnet that provides a static magnetic field to the first and the second magnetic flux gaps.

The first input signal that is applied to the first voice coil generates a first magnetic field and the second input signal applied to the second voice coil generates a second magnetic field. The second magnetic field can have opposite polarity to the first magnetic field to reduce a modulation of magnetic flux in at least one of the first and the second magnetic flux gaps.

A low pass filter can be electrically coupled to at least one of the first and the second voice coils. The first diaphragm can be inverted with respect to the second diaphragm. The first and/or the second diaphragm can be elliptically-shaped. The magnet assembly can include a motor structure that is inverted with respect to at least one of the first and the second diaphragms.

In one embodiment, the frame of the electro-acoustic transducer is mechanically coupled to an infinite baffle in a vehicle. The frame of the electro-acoustic transducer can also be mechanically coupled to a wall.

In another aspect, the invention is embodied in a loudspeaker system for a vehicle. The loudspeaker system includes an infinite baffle that is integrated with the vehicle. A first surface of the infinite baffle is coupled to a listening area in the vehicle and a second surface of the infinite baffle is coupled to a cavity. A first baffle is mechanically coupled to the infinite baffle and supports a first transducer that includes a first diaphragm. The first diaphragm has a first surface that is acoustically coupled to the listening area in the vehicle and a second surface that is acoustically coupled to the cavity. A second baffle is mechanically coupled the infinite baffle and supports a second transducer that includes a second diaphragm. The second diaphragm includes a first surface that is acoustically coupled to the listening area in the vehicle and a second surface that is acoustically coupled to the cavity. A rigid member mechanically couples the first baffle to the second baffle. The first and the second transducer are driven by a first and a second input signal, respectively, such that an acoustic output from the first surfaces of the first and the second diaphragms couples to the listening area substantially in phase and a vibration imparted to the infinite baffle from a movement of the first diaphragm is reduced by a movement of the second diaphragm.

The first and the second signals can be identical. The first and the second baffles can be substantially perpendicular to the infinite baffle. The second baffle can be positioned substantially parallel to the first baffle. The first surface of the first diaphragm can be a front surface of the first diaphragm and a second surface of the first diaphragm can be a rear surface of the first diaphragm. Alternatively, the first surface of the first diaphragm can be a rear surface of the first diaphragm and a second surface of the first diaphragm can be a front surface of the first diaphragm.

The first surface of the second diaphragm can be a front surface of the second diaphragm and a second surface of the second diaphragm can be a rear surface of the second diaphragm. Alternatively, the first surface of the second diaphragm can be a rear surface of the second diaphragm and a second surface of the second diaphragm can be a front surface of the second diaphragm.

The second transducer can be inverted relative to the first transducer. The first and/or the second diaphragm can be elliptically-shaped. A motor structure of the first transducer can be mechanically coupled to a motor structure of the second transducer through the rigid member. A frame of the first transducer can be mechanically coupled to a frame of the second transducer.

The loudspeaker system can include a passive radiator. A first surface of the passive radiator is acoustically coupled to the listening area and a second surface of the passive radiator is acoustically coupled to the cavity. An acoustic element can be used to couple acoustic energy from the cavity to the listening area. The acoustic element can be an acoustic port. The cavity can include a trunk of the vehicle. One or both of the first and the second transducer can include an inverted motor structure.

A low pass filter can be coupled to at least one of the first and the second transducers. The low pass filter restricts spectral components of at least one of the first and the second input signals above a predetermined cutoff frequency.

In one aspect, the invention is embodied in a method for reducing mechanical forces in a loudspeaker system in a vehicle. The method includes mounting a first baffle and a second baffle to an infinite baffle that is integrated with the vehicle. The method also includes mounting a first transducer having a first diaphragm to the first baffle such that a first surface of the first diaphragm is acoustically coupled to a listening area in the vehicle and a second surface of the first diaphragm is acoustically coupled to a cavity. The method further includes mounting a second transducer having a second diaphragm to the second baffle such that a first surface of the second diaphragm is acoustically coupled to the listening area in the vehicle and a second surface of the second diaphragm is acoustically coupled to the cavity. The method also includes mechanically coupling the first baffle to the second baffle with a rigid member. The method also includes driving the first and the second transducers with a first and a second input signal, respectively, such that an acoustic output from the first surfaces of the first and the second diaphragms couples to the listening area substantially in phase and a vibration imparted to the infinite baffle from a movement of the first diaphragm is reduced by a movement of the second diaphragm.

The method can also include positioning the first baffle substantially parallel to the second baffle. The method can also include forming at least one of an acoustic port, an acoustic waveguide, an acoustic dampener, and a passive radiator in the cavity to couple acoustic energy from the cavity to the listening area. The cavity can include a trunk of the vehicle.

In one example, driving the first and the second transducers with the first and the second input signals includes applying the first input signal to a first voice coil that is mechanically coupled to the first diaphragm and applying the second input signal to a second voice coil that is mechanically coupled to the second diaphragm. In one example, the movement of the first diaphragm is substantially opposite to the movement of the second diaphragm. In one example, the first diaphragm is inverted with respect to the second diaphragm.

In another aspect, the invention is embodied in a loudspeaker system that includes an enclosure having a first acoustic volume and a first acoustic element. A combination of the first acoustic volume and the first acoustic element has a first resonant frequency. The first acoustic element couples acoustic energy from the first acoustic volume to outside the enclosure. A sub-enclosure is positioned at least partially inside the enclosure. The sub-enclosure includes a second acoustic volume and a second acoustic element. A combination of the second acoustic volume and the second acoustic element has a second resonant frequency. The second acoustic element couples acoustic energy from the second acoustic volume to outside the sub-enclosure. A first transducer is mounted to the sub-enclosure. The first transducer includes a first diaphragm having a first surface that is acoustically coupled to the first acoustic volume and a second surface that is acoustically coupled to the second acoustic volume. A first input signal is applied to the first transducer which causes the first diaphragm to move in a first direction. A second transducer is mounted to the sub-enclosure. The second transducer includes a second diaphragm having a first surface that is acoustically coupled to the first acoustic volume and a second surface that is acoustically coupled to the second acoustic volume. A second input signal is applied to the second transducer which causes the second diaphragm to move in a second direction that is substantially opposite to the first direction to reduce a vibration imparted to the sub-enclosure from the movement of the first diaphragm.

The first resonant frequency and the second resonant frequency can be the same. Alternatively, the first resonant frequency can be lower than the second resonant frequency. The second acoustic element can couple acoustic energy from the second acoustic volume to outside the enclosure. For example, the second acoustic element can couple acoustic energy from the second acoustic volume to the first acoustic volume. The first and the second acoustic elements can include an acoustic port or a passive radiator. The sub-enclosure can be rigidly coupled to the enclosure.

In one example, the movement of the second diaphragm reduces a vibration imparted to the enclosure from the movement of the first diaphragm. The first and/or the second transducer can include an inverted motor structure. The first transducer can be inverted relative to the second transducer.

The loudspeaker system can also include an additional sub-enclosure that is positioned at least partially inside the enclosure. The loudspeaker system can also include an additional sub-enclosure that is positioned at least partially inside the sub-enclosure.

In another aspect, the invention is embodied in a transducer assembly that includes a frame that is subject to vibration. A first pair of transducers are mechanically coupled to the frame. The first pair of transducers are oriented substantially in-line and include a first pair of diaphragms. Input signals applied to the first pair of transducers causing the first pair of diaphragms to move in substantially opposite directions relative to each other. A second pair of transducers are mechanically coupled to the frame. The second pair of transducers are oriented substantially in-line relative the first pair of transducers and include a second pair of diaphragms. Input signals applied to the second pair of transducers causing the second pair of diaphragms to move in substantially opposite directions relative to each other, thereby reducing a vibration in the frame.

The movement of the second pair of diaphragms can be substantially in phase with the movement of the first pair of diaphragms. The transducer assembly can also include a baffle that acoustically separates a front surface of a transducer in the first pair of transducers from a back surface of the transducer. The transducer assembly can also include a baffle that acoustically separates a front surface of a transducer in the second pair of transducers from a back surface of the transducer.

The transducer can further include an enclosure for housing at least a portion of the first and the second pairs of transducers. The diaphragms in the first pair of transducers can be inverted relative to the diaphragms in the second pair of transducers. One of the diaphragms can be inverted relative to the other diaphragm in at least one of the first and the second pairs of transducers.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 2 is a diagrammatic representation of an alternative embodiment of the invention with the assembly carried by an infinite baffle, such as a vehicle rear deck or door.

FIG. 5A-FIG. 5E are diagrammatic representations of alternative embodiments of the invention with the assemblies mounted in enclosures.

FIG. 5F is a diagrammatic representation of an embodiment of the invention showing an unmounted assembly including four separate transducers.

FIG. 10 illustrates a perspective view of a loudspeaker system including a first pair and a second pair of electro-acoustic transducers that are mounted to an infinite baffle according to one embodiment of the invention.

FIG. 11 illustrates a perspective view of a loudspeaker system including a pair of electro-acoustic transducers that are mounted to an infinite baffle which can be a seatback of a rear seat of a vehicle.

DETAILED DESCRIPTION

Figure 1A:
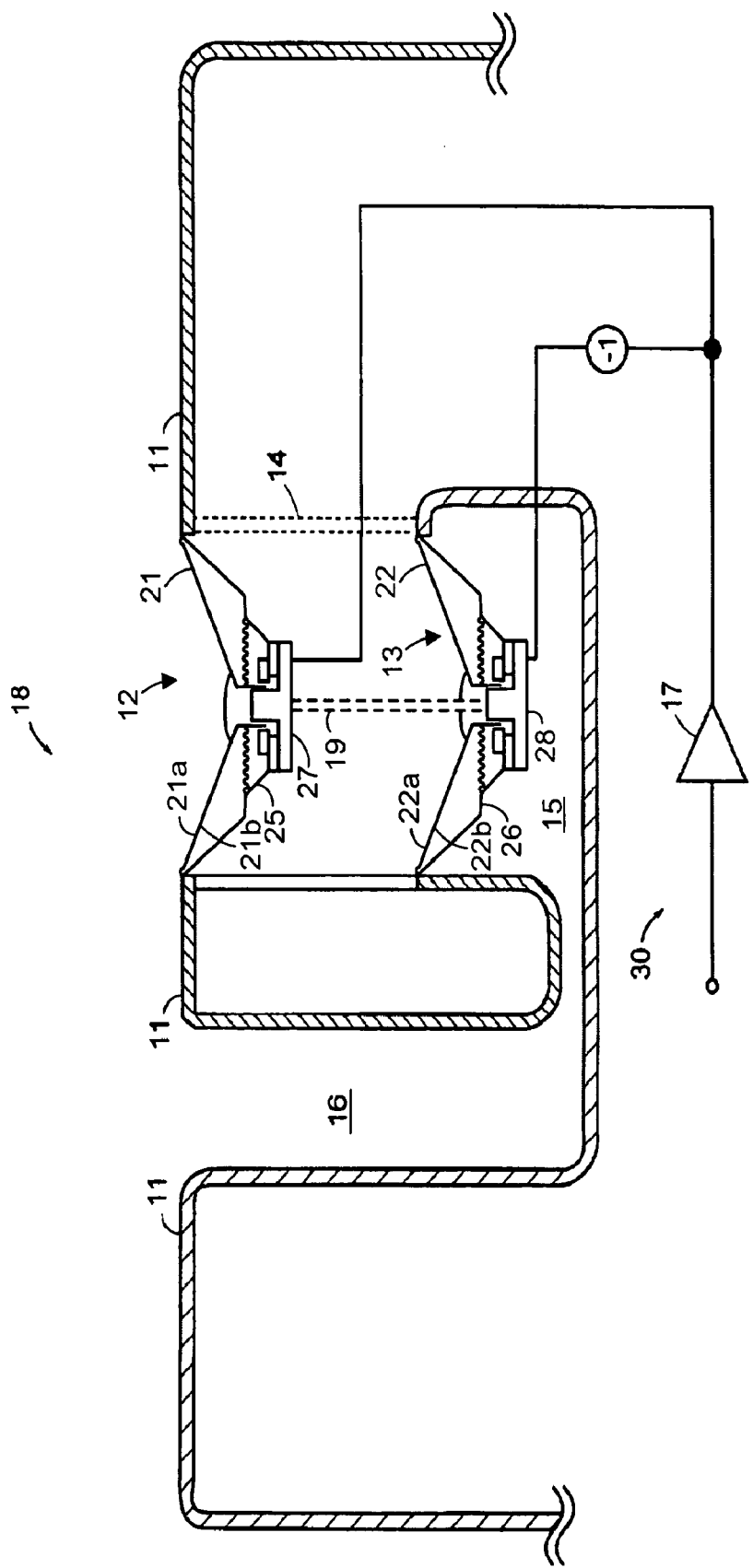
FIG. 1A-FIG. 1C are diagrammatic representations of embodiments of the invention with the assemblies carried by an infinite baffle, such as a vehicle rear deck or door.

With reference now to the drawings and more particularly FIG. 1A thereof, there is shown a diagrammatic representation of an embodiment of the invention with structure carried by infinite baffle 11, typically a vehicle rear shelf or door panel carrying a first transducer 12, such as a loudspeaker driver, mechanically connected to a second transducer 13, such as a loudspeaker driver, preferably identical to the first transducer 12, through a mechanical link 14. The two transducers 12, 13 are ideally mounted in substantially parallel planes such that diaphragms 21, 22 of the two transducers 12, 13 move in the same axial direction. Although the infinite baffle 11 is described as a rear shelf or door panel in a vehicle, the infinite baffle 11 can be a structural panel, a wall, a ceiling, or a floor in a room, for example.

A first surface 21a of the diaphragm 21 of the first transducer 12 is acoustically coupled to a listening area 18. If the baffle 11 is the rear package shelf of a vehicle, the listening area 18 is the passenger compartment of the vehicle. A second surface 21b of the diaphragm 21 of the first transducer 12 is coupled to a volume or a cavity 30, which would be the vehicle trunk if the baffle 11 is the rear package shelf. A second surface 22b of the diaphragm 22 of the second transducer 13 is coupled to the listening area 18 through an acoustic path consisting of one or more acoustic elements. Acoustic elements include lumped elements such as acoustic compliances (formed by cavities or volumes), acoustic resistances (elements that have losses proportional to acoustic volume velocity such as wire meshes, fiberglass, or other fibrous materials, foams, etc.), acoustic masses (formed by physical sections of tubes) or distributed elements such as waveguides or transmission lines, which can be described as conduits of constant or smoothly varying cross-section. In one embodiment, the second surface 22b of the diaphragm 22 of the second transducer 13 is coupled to the listening area 18 through a compliant volume 15 and a port tube 16. A first surface 22a of the diaphragm 22 of the second transducer 13 is coupled to the cavity 30. Instead of a rear package shelf of a vehicle, the baffle 11 can be a wall, a floor, or a ceiling of a room and the transducers 12, 13 can be positioned with the transducer 12 being located flush to the wall, floor or ceiling and the transducer 13 being located behind the wall, floor or ceiling. In another embodiment, the transducers 12, 13 can be recessed in the wall, floor or ceiling. Baffle 11 serves to separate acoustic output of first surface 21a and acoustic output from second surface 22b, from acoustic output of second surface 21b and acoustic output of first surface 22a.

power amplifier 17 energizes the first transducer 12 and the second transducer 13 with the same signal but drives them in opposite polarity. The system is arranged such that when the diaphragm 21 of the first transducer 12 is moving in one direction, the diaphragm 22 of the second transducer 13 is moving in the substantially opposite direction, which significantly reduces a resultant force applied to the baffle 11. This also reduces undesired resultant vibrations of the baffle 11. By resultant force, we mean the vector sum of the applied forces (to a mechanical link or to a structure, such as the baffle, to which the transducer assembly is attached) applied by each transducer. For the case where equal and opposite forces are applied to each end of a mechanical link, the resultant force as defined is zero, even though the actual forces that place the mechanical link into tension or compression are in fact doubled.

The reduction in the vibration imparted to the baffle 11 is generally observed over a large frequency range. However, there can be various frequencies where the reduction in the vibration imparted to the baffle 11 is less pronounced.

The embodiments of the invention typically show a pair of diaphragms mounted in close proximity moving in mechanically opposite directions. We are assuming, for purposes of simplicity of describing the invention, that there is no mutual coupling present between the two diaphragms. In actual embodiments, while some amount of mutual coupling may be present, it will generally not be sufficient to substantially affect overall operation of the system.

Additionally, throughout the following description, input signals are applied to the transducers in order to cause the movable elements in the transducers to move in desired directions. The desired direction of movement of the movable elements can be achieved through various methods. For example, the polarity of the input signal can be reversed prior to being applied to the transducer. This can be achieved by making a reverse connection at the terminals of the transducer. Alternatively, an inverting amplifier can operate on an input signal prior to it being applied to the transducer. In one embodiment, the geometry of one transducer is inverted with respect to the geometry of the other transducer. In one embodiment, the voice coil of each transducer is wound in opposite directions. In one embodiment, the permanent magnets in the motor structures of each transducer are magnetized in opposite directions. Any single technique or a combination of the above techniques can be used to control the direction of movement of the movable elements of each of the transducers.

The movement of the second diaphragm 22 of the second transducer 13 generates acoustic output from the second surface 22b of the second transducer 13 that is coupled by the acoustic path to the listening area 18 for emission that is substantially in phase with the output from the first surface 21a of first transducer 12. Thus, the input signal from the amplifier 17 that is applied to the second transducer 13 causes the second diaphragm 22 to move in an opposite direction from the direction of movement of the first diaphragm 21 to reduce a vibrating force imparted to the baffle 11 while maintaining the acoustic output.

The output from the second surface 22b of the second driver 13 could also be coupled through a conduit of substantially constant or smoothly varying cross section to the listening area 18 without loss of generality.

The second transducer 13 need not be identical to the first transducer 12. All that is required for significant reduction in vibration is for the moving mass and generated motor force of the second transducer 13 to approximately equal the moving mass and generated motor force of the first transducer 12. Such a component could be made at lower cost than the cost of a transducer that is identical to the first transducer 12. It is generally desirable for a frame 25 of the first transducer 12 to be similar to a frame 26 of the second transducer 13 so that the second transducer 13 can be attached to the first transducer 12 at the same attachment points that are used to attach the first transducer 12 to the baffle 11. An alternative means of assembly could be to rigidly attach the bottom of a motor structure 27 of the first transducer 12 to the top of a motor structure 28 of the second transducer 13, using a rigid connecting member 19 such as a threaded metal rod.

Figure 1B:
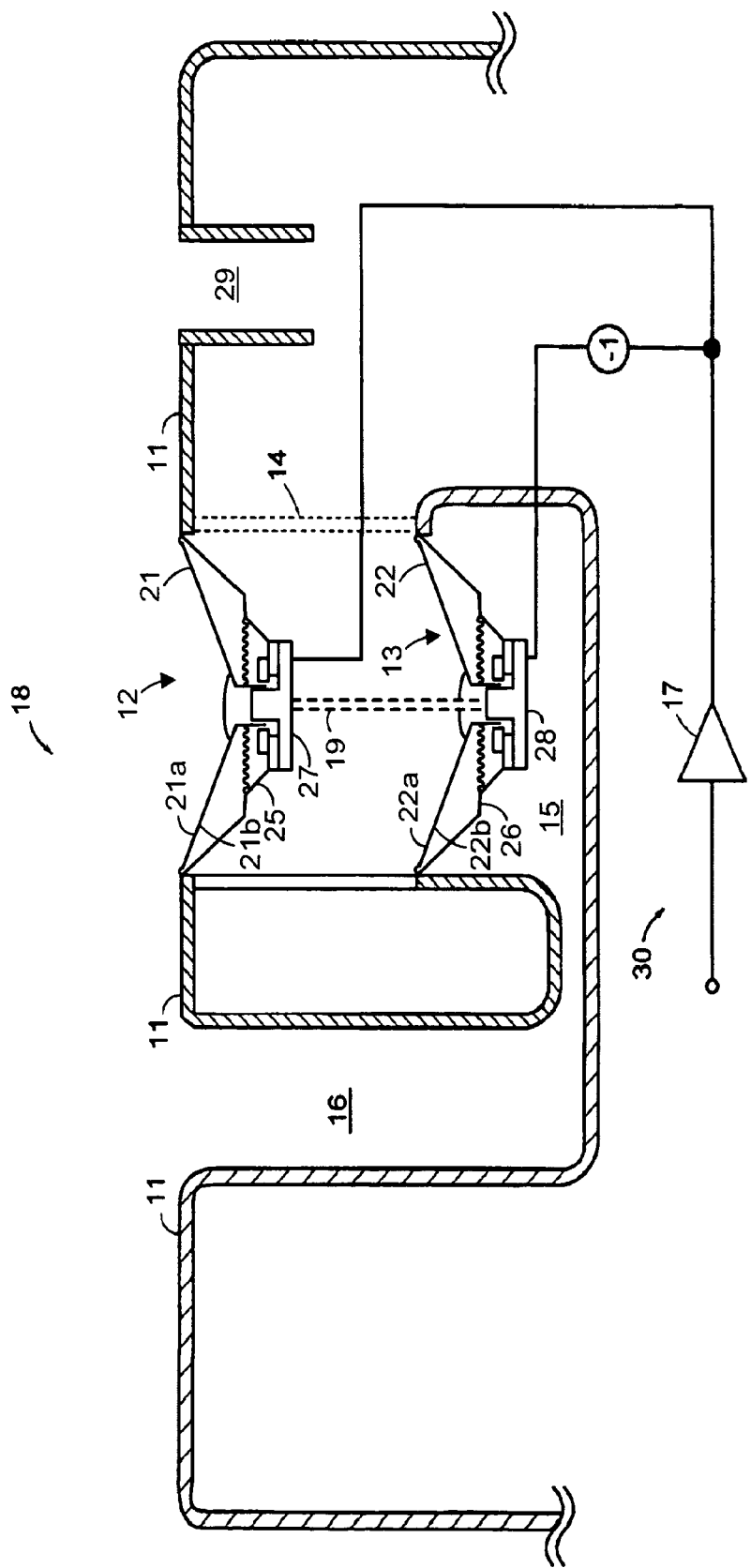

FIG. 1B is a diagrammatic representation of an embodiment of the invention with the assembly carried by the infinite baffle 11. The embodiment shown in FIG. 1B is substantially the same as the embodiment shown in FIG. 1A with the addition of an acoustic port 29 that is coupled to the cavity 30. In some embodiments, the cavity 30 is substantially closed (other than through port tubes that may be present). In some embodiments, one or more ports, passive radiators, and/or other structures are used to acoustically couple the cavity 30 to some other element or physical space. The port 29 is an acoustic mass and the cavity 30 is an acoustic compliance. The dimensions of the port 29 are chosen to adjust the acoustic mass to set the port 29/cavity 30 resonance at a desired frequency. The acoustic port 29 couples a portion of the acoustic energy from the cavity 30 to the listening area 18. The acoustic energy is generated by the second surface 21b of the first diaphragm 21 and the first surface 22a of the second diaphragm 22. The acoustic energy exiting from the acoustic port 29 reinforces the acoustic output that is coupled to the listening area 18 from the first surface 21a of the first diaphragm 21 and the second surface 22b of the second diaphragm 22, over a limited, but useful frequency range.

In some embodiments, a passive radiator (not shown) can be used instead of the acoustic port 29. Like the acoustic port 29, a passive radiator can be used to reinforce the acoustic energy entering the listening area 18. The mechanical mass, area, and suspension compliance of the passive radiator are chosen so that the passive radiator resonates with the compliance volume 30 at a desired frequency. Sound waves from the second surface 21b of the first diaphragm 21 and the first surface 22a of the second diaphragm 22 strike and move the passive radiator. It in turn vibrates and creates its own sound waves from the front surface of its diaphragm. Although a passive radiator is a mechano-acoustic element, it is referred to as an acoustic element throughout the present specification.

Figure 1C:
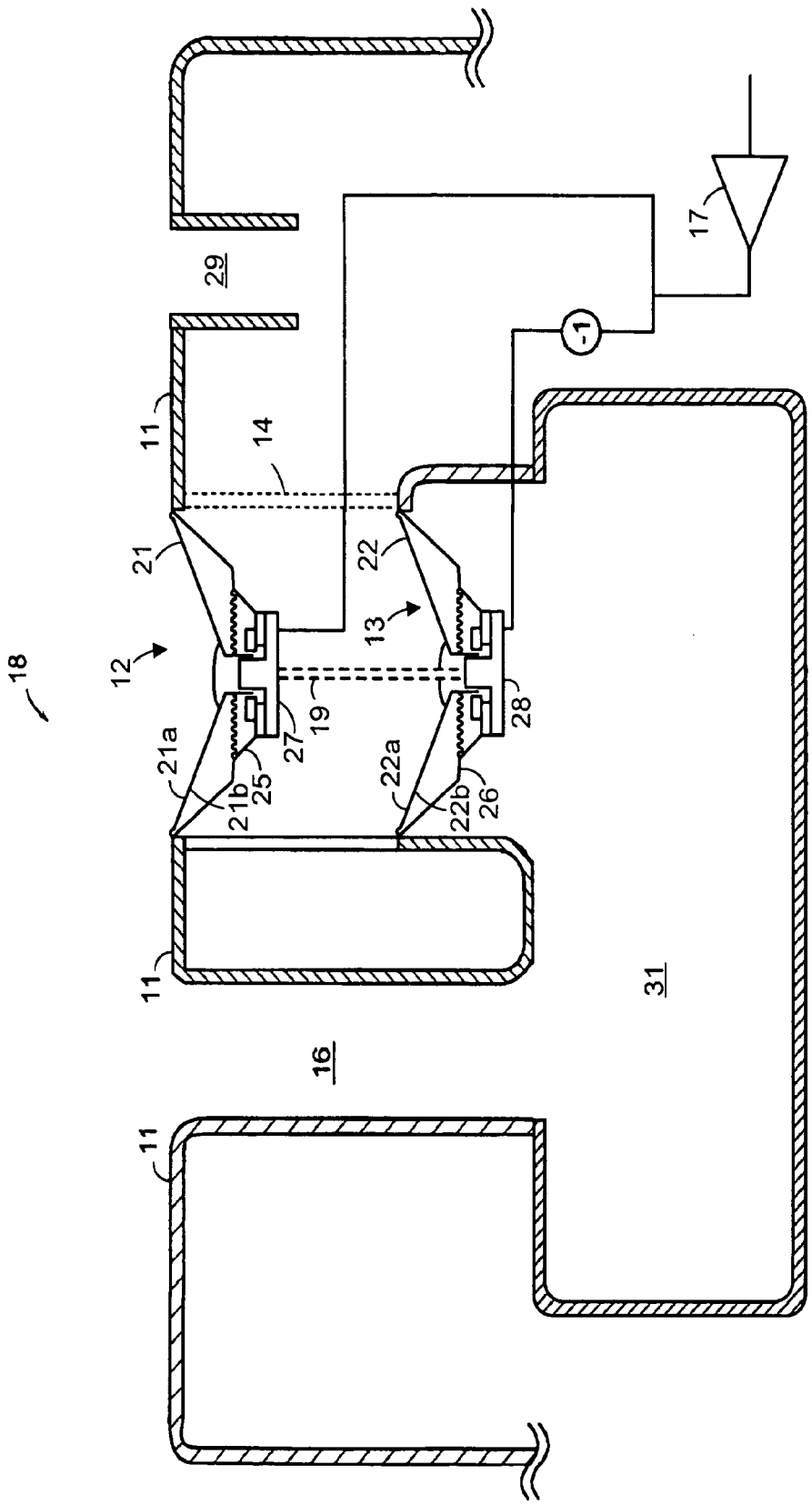

FIG. 1C is a diagrammatic representation of an embodiment of the invention with the assembly carried by the infinite baffle 11. The embodiment shown in FIG. 1C is substantially the same as the embodiment shown in FIG. 1B with the addition of an acoustic low-pass filter formed from the combination of a cavity 31 and the port 16. Second surface 22b of the second diaphragm 22 is coupled to the cavity 31, port tube 16 is coupled to cavity 31 and to listening area 18. Therefore, the output from second surface 22b is filtered by the acoustic low pass filter. The dimensions of the enclosure 31 and the port 16 are determined based the desired cutoff frequency of the acoustic low pass filter, for example. The low-pass filter can be used to filter undesired frequencies in the acoustic energy before those frequencies can reach the listening area 18.

In one embodiment, the transducers 12, 13 are driven with input signals that include low frequencies and higher frequencies. The low-pass filter allows the low frequency acoustic waves generated by the second side 22b of the second diaphragm 22 to propagate to the listening area 18, but prevents the higher frequency acoustic waves generated by the second side 22b of the second diaphragm 22 from propagating to the listening area 18. This prevents potentially out-of-phase higher frequencies generated by both transducers 12, 13 from reaching the listening area 18 simultaneously, while only allowing higher frequencies from the first surface 21a of the first diaphragm 21 of the transducer 12 to reach the listening area 18.

Low-pass filters can be used to reduce a comb filter effect that occurs at higher frequencies due to acoustic path differences of the acoustic output from the transducers 12, 13. By low-pass filtering one of the transducers 12, 13, the comb filter effect is reduced. Skilled artisans will appreciate that variations in the low-pass filter can be made without departing from the invention. For example, the acoustic low-pass filter can include a passive radiator, an acoustic absorber, a Helmholtz resonator, and/or any other acoustic element or any combination of compliance, mass or resistive elements. Alternatively, electrical filtering can also be used. For example, an electrical low pass filter can be coupled to one or both transducer inputs. The enclosure 31 can also include sound absorbing material, such as fiberglass, polyester, batting, etc.

FIG. 2 is a diagrammatic representation of an alternative embodiment of the invention with the assembly carried by an infinite baffle 11, such as a vehicle rear deck or door. The second transducer 13 is now physically inverted with respect to the first transducer 12. FIG. 2 shows the rear of the motor structure 27 of the first transducer 12 being rigidly attached to the rear of the motor structure 28 of the second transducer 13 through a spacer 20, although the spacer 20 is not required. Structural coupling of the two transducers 12, 13 could also be accomplished through an attachment around the periphery of the transducer frames 25, 26, as shown in the system of FIG. 1. The arrangement of FIG. 2 would work equally well if each of transducers 12, 13 were inverted as compared to what is shown. In this case, the structural connection would be accomplished through an attachment around the periphery of the transducer frames 25, 26. In another embodiment, the structural connection can be made by attaching an optional connecting rod (not shown) to a pole piece in each of the motor structures 27, 28.

The orientation of the transducers 12, 13 relative to each other can be arbitrary, as long as the resultant force applied to a baffle 11 from the movement of the movable elements of one of the transducers 12, 13 is reduced by the movement of the movable elements of the other transducer 13, 12.

Since the transducers 12, 13 are physically inverted with respect to each other, cancellation of vibration will occur when electrical signals of the same relative polarity are applied to each transducer 12, 13. Each transducer 12, 13 is attached to the output of the amplifier 17 such that when an electrical signal provided to the first transducer 12 causes the diaphragm 21 of the first transducer 12 to move in one direction, an electrical signal provided to the second transducer 13 causes the diaphragm 22 of the second transducer 13 to move in the substantially opposite direction relative to the motion of the diaphragm 21 of the first transducer 12.

Above a certain frequency, the output from the second transducer 13 will not be in phase with the output from the first transducer 12 at the listening area 18. The frequency response of the combined system may exhibit a comb filter behavior with the first null occurring when the path length difference between the first surface 21a of the diaphragm 21 of the first transducer 12 and the listening area 18 and the second surface 22b of the diaphragm 22 of the second transducer 13 and the listening area 18 is a half-wavelength.

One approach for reducing the effects of this comb filter behavior is by using a low-pass filter to restrict the spectral components delivered to both transducers 12, 13 to only spectral components that are below the first null and using other transducers (not shown) for reproducing higher frequency spectral components. The low-pass filters used could be identical for both transducers 12, 13, or they can have different orders and/or corner frequencies. The low-pass filters can be acoustical filters or passive or active electrical filters. The output from one of the transducers 12, 13 could be restricted to being below a predetermined cutoff frequency while the other transducer 12, 13 is permitted to operate over a wider frequency range. Preferably, the first transducer 12 operates over a wider frequency range than the second transducer 13. This result can be achieved by placing a low-pass filter in the signal path of the second transducer 13 only, or by having a low-pass filter in the signal path of the first transducer 12 with a higher corner frequency and/or lower order than a low-pass filter in the signal path of the second transducer 13. The result can also be achieved either in combination with or solely by the appropriate design of the acoustic elements 15, 16 connecting the second transducer 13 to the listening area 18 such that the acoustic elements 15, 16, in combination, form a low pass filter. It should be noted that acoustical or electrical filters can be used in any of the embodiments described herein and not simply the embodiment described with reference to FIG. 2. For example, in an asymmetric arrangement in which one of the transducers acoustically couples to the listening area while the other transducer couples to the listening area through an acoustic path, asymmetric filtering (such as using different filter cutoff frequencies, different orders, etc., in each transducer signal path) of the transducers can be used.

It may also be advantageous to include a low-pass filter in the signal path of the second transducer 13 and a complementary all-pass filter in the signal path of the first transducer 12. A complementary all-pass filter has the same phase response as a function of frequency as a corresponding low-pass filter. This feature can be accomplished, for example, by using a second-order critically damped low-pass filter in the signal path of the second transducer 13, and a first-order all-pass filter in the signal path of the first transducer 12, where the corner frequencies of the low-pass and all-pass filters are substantially identical.

According to another embodiment, a fourth-order low-pass filter in the signal path of the second transducer 13 and a second-order all-pass filter in the signal path of the first transducer 12 may be used. Other examples of complementary all-pass filter/low-pass filter combinations will be evident to those skilled in the art.

The use of complementary all-pass filters and low-pass filters as described above can be combined with other signal processing as disclosed in U.S. Pat. No. 5,023,914, incorporated by reference herein, to simultaneously achieve improved system frequency response and reduce vibration.

Figure 3:
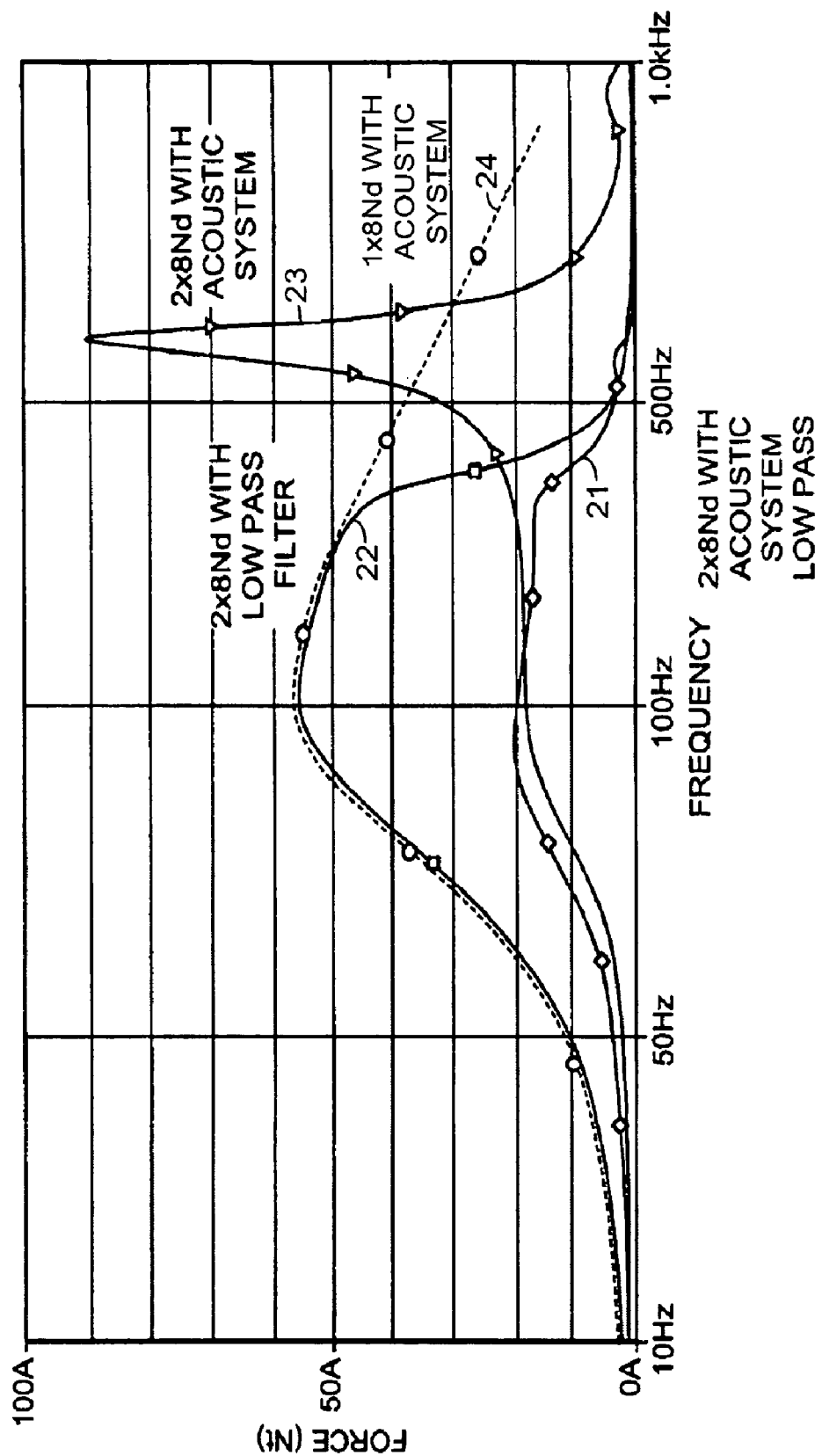
FIG. 3 is a graphical representation showing the force exerted on the structure as a function of frequency for various systems.

Referring to FIG. 3, there is shown a graphical representation of force upon a baffle 11 (FIG. 1) as a function of frequency for various structures. Curve 21 illustrates the resultant response of using two Bose® eight-inch Neodymium (Nd) transducers in an acoustic system having a low-pass filter. Curve 22 illustrates the applied force when using only a single eight-inch Nd transducer with a low-pass filter. Curve 23 shows the applied force when using just two eight-inch Nd transducers connected according to the invention without the low-pass filter. Curve 24 shows the applied force with just a single eight-inch Nd transducer. These graphical representations demonstrations the significant reduction in force applied to the baffle 11 using two eight-inch Nd transducers connected according to the invention without the low-pass filter and the advantage of incorporating the low-pass filter into the system.

The embodiments shown in FIGS. 1A-1C and FIG. 2 are described using an infinite baffle 11. Although the arrangements are described showing the listening area 18, this is not required. The invention can be adapted to emit sound equally well to either the volume 30 or the listening area 18 without loss of generality. Additionally, the infinite baffle 11 can be the ceiling, floor, wall, door, or any surface of a room. In this example, the room is either the volume 30 or the listening area 18.

Figure 4:
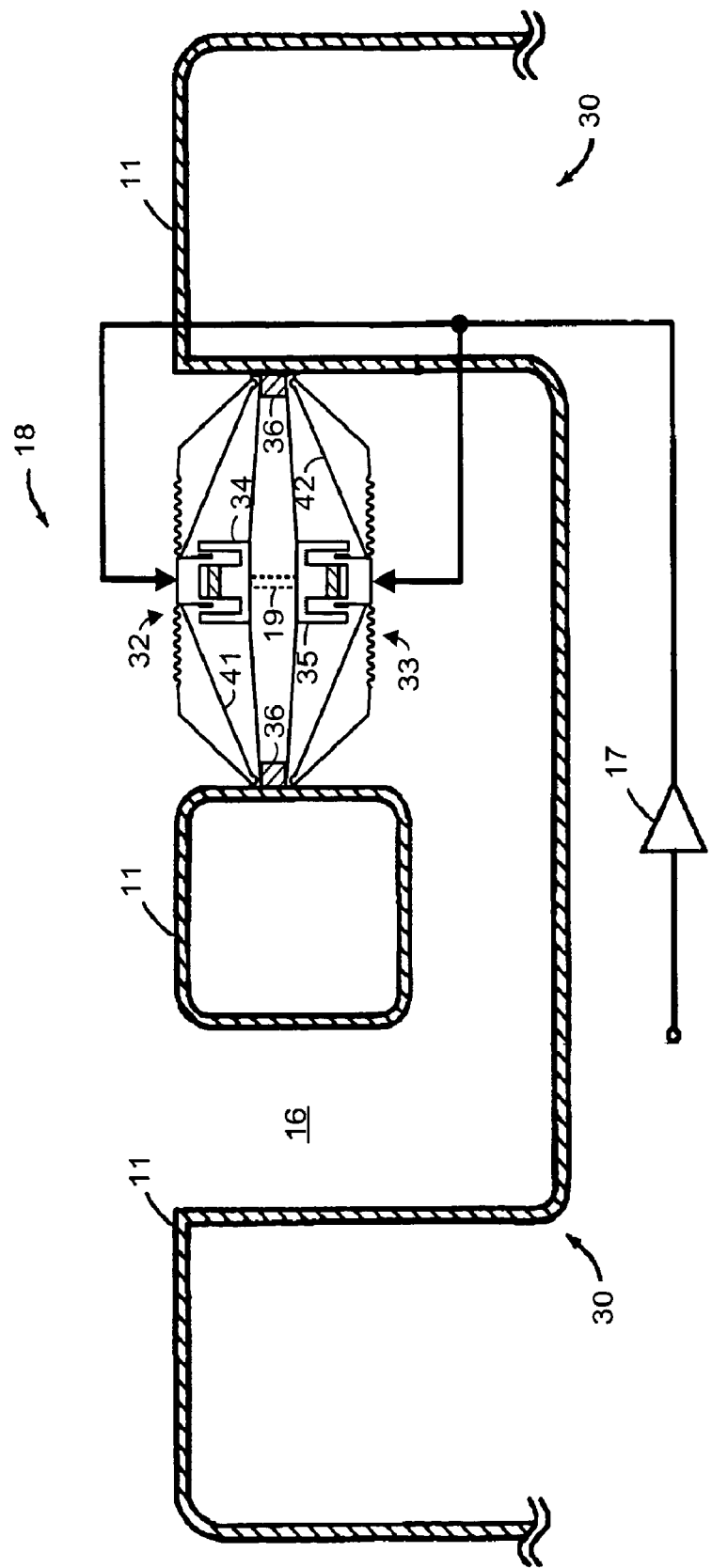
FIG. 4 is a diagrammatic representation of an alternative embodiment of the invention with the assembly carried by an infinite baffle, such as a vehicle rear deck or door, incorporating transducers with inverted motor structures.

FIG. 4 is a diagrammatic representation of an alternative embodiment of the invention with the assembly carried by an infinite baffle 11, such as a vehicle rear shelf or door, incorporating transducers with inverted motor structures. Transducers 32 and 33 including diaphragms 41, 42 have motor structures 34, 35 that are inverted with respect to the motor structures 27, 28 of the transducers 12, 13 of FIG. 2. FIG. 4 illustrates that the transducers 32, 33 are also physically inverted with respect to each other. The use of transducers 32, 33 having motor structures 34, 35 that are inverted is not limited to the orientation shown. Any of the previous arrangements described for non-inverted motor transducers is also applicable for transducers with inverted motor structures. Use of inverted motor structure transducers in the current invention can significantly reduce the overall thickness of the multiple transducer assembly, which can reduce intrusion into a vehicle trunk or allow a system to fit within a wall space where an arrangement using traditional transducers would not fit. Note also that mechanical links 36 can be made much shorter than the mechanical links 14 shown in FIGS. 1A-1C in the embodiment using transducers 12, 13 without inverted motor structures. Alternatively, an optional rigid connecting member 19 could be used to rigidly attach the motor structure 34 of the first transducer 32 to the motor structure 35 of the second transducer 33.

Figure 5A:
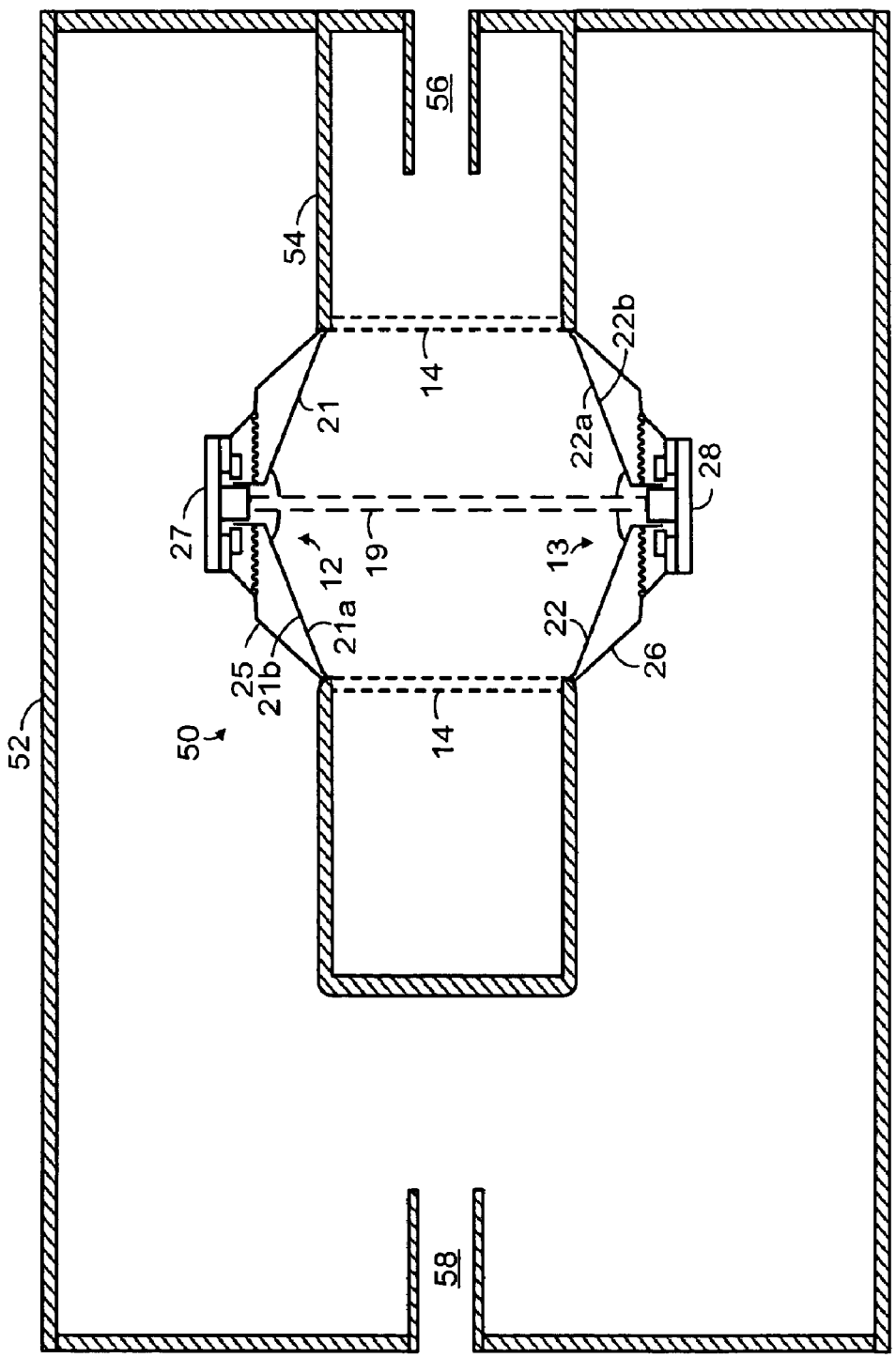

FIG. 5A is a diagrammatic representation of an alternative embodiment of the invention with an assembly 50 mounted in an enclosure 52. The assembly 50 includes the first 12 and the second transducers 13 that are mounted to a sub-enclosure 54. This configuration illustrates a two-chamber band-pass enclosure. However configurations including any number of chambers can be used. For example, other multi-chamber configurations are described in more detail in U.S. Pat. No. 5,092,424, entitled "Electroacoustical Transducing with At Least Three Cascaded Subchambers" which is assigned to the assignee of the present application. The entire disclosure of U.S. Pat. No. 5,092,424 is incorporated herein by reference. The first 12 and the second transducers 13 are inverted with respect to each other and are mechanically coupled using optional mechanical links 14. In one embodiment, an optional rigid connecting member 19 is coupled between the top of the motor structure 27 and the top of the motor structure 28 to increase the mechanical rigidity between the transducers 12, 13.

Alternatively, the transducers 12, 13 can be mechanically coupled to each other by using one or both of the mechanical links 14 and the rigid connecting member 19. Also, the transducers 12, 13 can be arbitrarily oriented relative to each other as long as the moving parts of each of the transducers 12, 13 move in mechanical opposition in response to electrical signals applied to the transducers 12, 13 such that the resultant force applied to sub enclosure 54 to which transducers 12, 13 are mechanically coupled, and to the mechanical links 14 and/or the optional connecting member 19, are reduced.

The first surface 21a of the diaphragm 21 in the first transducer 12 and the first surface 22a of the diaphragm 22 in the second transducer 13 are acoustically coupled to a first acoustic volume of the sub-enclosure 54. The first acoustic volume of the sub-enclosure 54 is acoustically coupled to a first acoustic element 56, such as a first acoustic port. The first acoustic element 56 is acoustically coupled to the listening environment. The first acoustic element 56 couples acoustic energy from inside the sub-enclosure 54 to outside the sub-enclosure 54. The acoustic compliance of the volume of the sub-enclosure 54 resonates with the acoustic mass of the first acoustic element 56. The dimensions and volume of the sub-enclosure 54 and the first acoustic element 56 are determined based on the characteristics of the transducers 12, 13 and the desired frequency response of the system, for example. Adjustment of the volume of the sub-enclosure 54 and the dimensions of the first acoustic element 56 allows the resonant frequency of the sub-enclosure/port system to be tuned to a desired frequency. The first acoustic element 56 can be an acoustic port, an acoustic waveguide, a passive radiator, or any element that couples acoustic energy from inside the sub-enclosure 54 to outside the sub-enclosure 54.

The sub-enclosure 54 is mounted at least partially within the enclosure 52. The enclosure 52 provides a second acoustic volume. The second surface 21b of the diaphragm 21 in the first transducer 12 and the second surface 22b of the diaphragm 22 in the second transducer 13 are acoustically coupled to the second acoustic volume. The enclosure 52 is acoustically coupled to a second acoustic element 58, such as a second acoustic port. The second acoustic element 58 is acoustically coupled to the listening environment. The second acoustic element 58 couples acoustic energy from inside the enclosure 52 to outside the enclosure 52. The volume of the enclosure 52 and the dimensions of the second acoustic element 58 are determined based on the characteristics of the transducers 12, 13 and the desired frequency response of the system, for example. Adjustment of the volume of the enclosure 52 and the dimensions of the second acoustic element 58 allows the resonant frequency of the enclosure/port system to be tuned to a desired frequency. The second acoustic element 58 can be an acoustic port, an acoustic waveguide, a passive radiator, or any element that couples acoustic energy from inside the enclosure 52 to outside the enclosure 52.

In one embodiment, the resonant frequency of the combination of the second volume and the second acoustic element 58 is the same as the resonant frequency of the combination of the first volume and the first acoustic element 56. In another embodiment, the resonant frequency of the combination of the second volume and the second acoustic element 58 is lower than the resonant frequency of the combination of the first volume and the first acoustic element 56. Additionally, although FIG. 5A illustrates a two-chamber band-pass enclosure, as previously described, other embodiments having additional chambers are also possible.

The ported enclosure 52 including the ported sub-enclosure 54 can increase the low frequency output of the transducers 12, 13. The resonances of the acoustic elements 56, 58 with the acoustic compliances (volumes) of enclosures 52, 54 serve to load the transducers 12, 13. The loading reduces the excursion of the diaphragms 21, 22 near the resonant frequencies of each of the enclosure/port assemblies. The resonant frequencies of the enclosure/port assemblies are varied to alter the frequency response of the system. Typically, the resonant frequencies of the acoustic compliance of enclosure 52 with acoustic mass of the acoustic element 58 and the acoustic compliance of the enclosure 54 with acoustic mass of the acoustic element 56 are separated by a desired amount. In some embodiments, the acoustic elements 56, 58 include passive radiators (not shown) instead of acoustic ports.

In operation, input signals are applied to the first transducer 12 and the second transducer 13. The input signals cause the first diaphragm 21 in the first transducer 12 and the second diaphragm 22 in the second transducer 13 to move so that the motion of the first diaphragm 21 is substantially opposite to the motion of the second diaphragm 22. The opposing motion of the diaphragms 21, 22 reduces a resultant mechanical force exerted on the structures to which the transducers are mechanically coupled, as well as to mechanical links 14, compared to a motion of a single diaphragm from a single transducer for the same input signal.

Figure 5B:
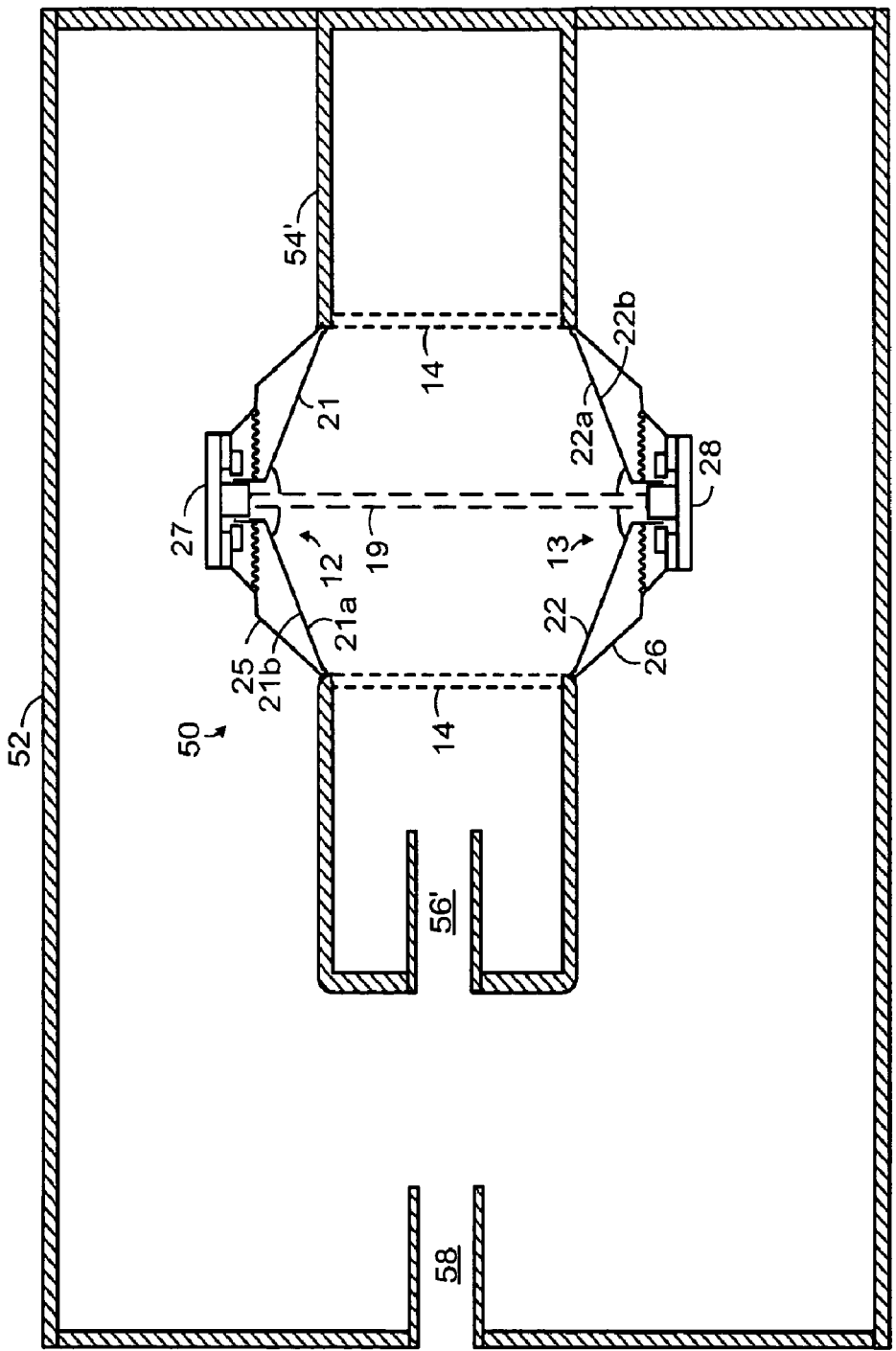

FIG. 5B is a diagrammatic representation of an alternative embodiment of the invention with the assembly 50 mounted in the enclosure 52. The assembly 50 includes the first 12 and the second transducers 13 that are mounted to a sub-enclosure 54'. The first 12 and the second transducers 13 are optionally mechanically coupled to each other using the mechanical links 14. The system of FIG. 5B is similar to the system of FIG. 5A except that the acoustic element 56' such as the acoustic port, couples acoustic energy from inside the sub-enclosure 54' to inside the enclosure 52. Adjustment of the dimensions of enclosure 52, the second acoustic element 58, the sub-enclosure 54' and the acoustic element 56' allows the resonant frequencies of the system to be tuned to desired frequencies.

Figure 5C:
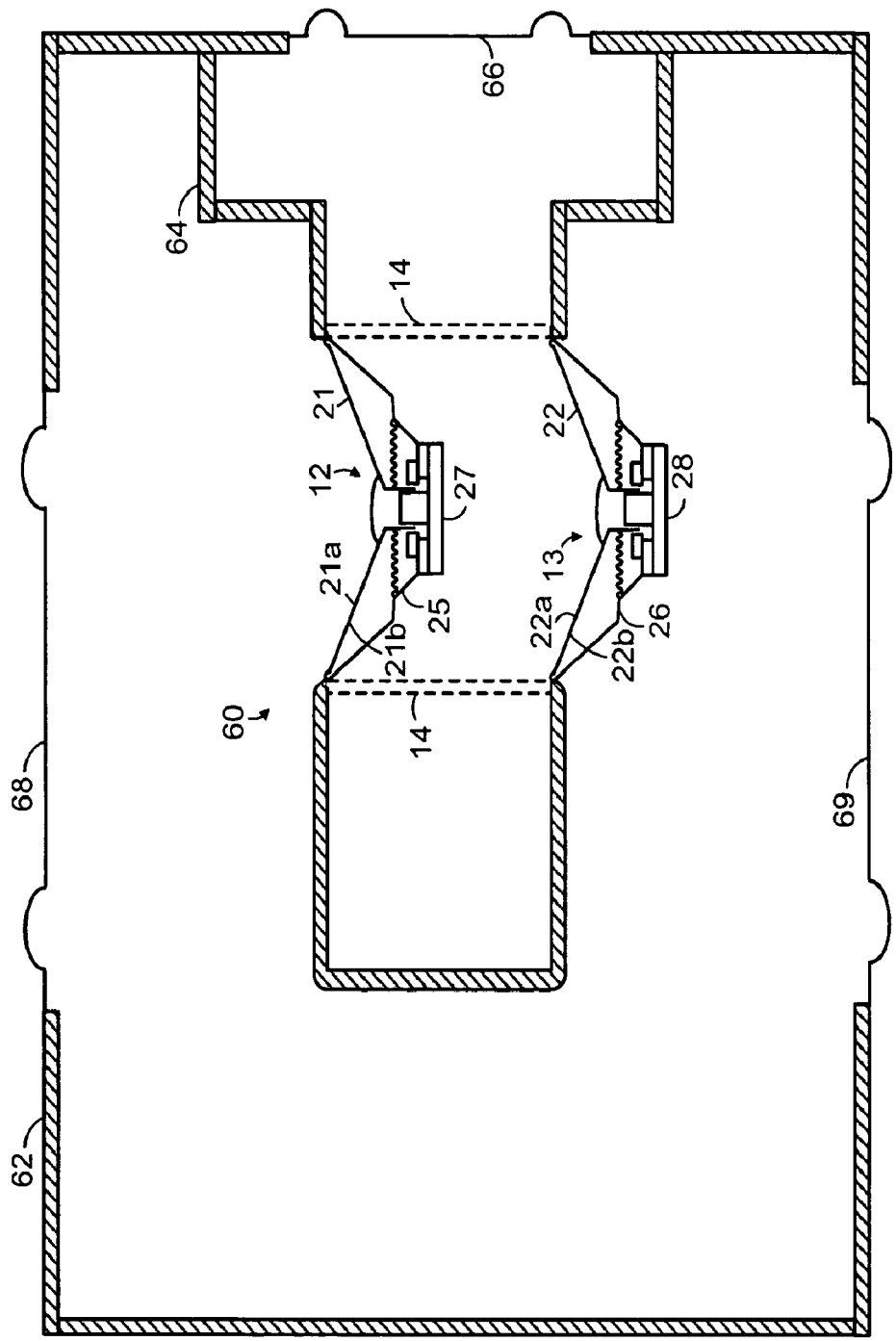

FIG. 5C is a diagrammatic representation of an alternative embodiment of the invention with an assembly 60 mounted in an enclosure 62. The assembly 60 includes the first 12 and the second transducers 13 that are mounted to a sub-enclosure 64. The first 12 and the second transducers 13 are mechanically coupled to each other using the mechanical links 14. The system of FIG. 5C is similar to the system of FIG. 5A except that the acoustic elements include passive radiators instead of acoustic ports. Any combination of passive radiators and/or acoustic ports can be used.

The second surface 21b of the diaphragm 21 in the first transducer 12 and the first surface 22a of the diaphragm 22 in the second transducer 13 are acoustically coupled to the volume of the sub-enclosure 64. The volume of the sub-enclosure 64 is acoustically coupled to a first passive radiator 66. The dimensions and volume of the sub-enclosure 64 and the characteristics (such as area, mass, suspension compliance) of first passive radiator 66 are determined based on the characteristics of the transducers 12, 13 and the desired frequency response of the system, for example. The dimensions and volume of sub-enclosure 64 and characteristics of passive radiator 66 are chosen in order to locate the resonant frequency (of the acoustic compliance of the sub-enclosure with the acoustic mass of the passive radiator) at a desired frequency. The first passive radiator 66 can be replaced by an acoustic port, such as the acoustic port 56 of FIG. 5A.

The sub-enclosure 64 is mounted within the enclosure 62. The first surface 21a of the diaphragm 21 in the first transducer 12 and the second surface 22b of the diaphragm 22 in the second transducer 13 are acoustically coupled to a volume of the enclosure 62. The volume of the enclosure 62 is acoustically coupled to a second 68 and a third passive radiator 69. The second 68 and third passive radiators 69 are located on opposing walls of the enclosure 62. This arrangement allows the diaphragms of the passive radiators 68, 69 to move in substantially opposite directions when they are stimulated by the acoustic energy in the enclosure 62 from the movement of the diaphragms 21, 22. The opposing motion of the diaphragms of the passive radiators 68, 69 reduce a resultant mechanical force on the enclosure 62 that would otherwise be applied if the diaphragms of the passive radiators 68, 69 moved in the same or in random directions.

The volume of enclosure 62 and the dimensions of the passive radiators 68, 69 are determined based on the characteristics of the transducers 12, 13 and the desired frequency response of the system, for example. The volume of enclosure 62 and characteristics of passive radiators 68, 69 are chosen in order to locate the resonant frequency (of the acoustic compliance of the enclosure with the acoustic mass of the passive radiators) at a desired frequency. The number, shape, and size of passive radiators can be changed as long as the resultant force on the enclosure 62 from the movement of the diaphragms of the passive radiators is reduced.

In one embodiment, the combination of the volume of the enclosure 62 and the passive radiators 68, 69 is tuned to a lower frequency than the combination of the volume of the sub-enclosure 64 and the passive radiator 66. The lower frequency tuning can require passive radiators that have a higher mass. Thus, configuring the system with the high mass passive radiators 68, 69 located on opposite sides of the enclosure 62 reduces the resultant force applied to the enclosure 62 by the movement of the high mass passive radiators 68, 69. It should be noted that the passive radiator 66 is not opposed. However, since it is tuned to a higher frequency, it typically has a lower moving mass than the high mass passive radiators 68, 69. Thus, the force applied to the enclosure 62 from the movement of the passive radiator 66 is relatively small.

Figure 5D:
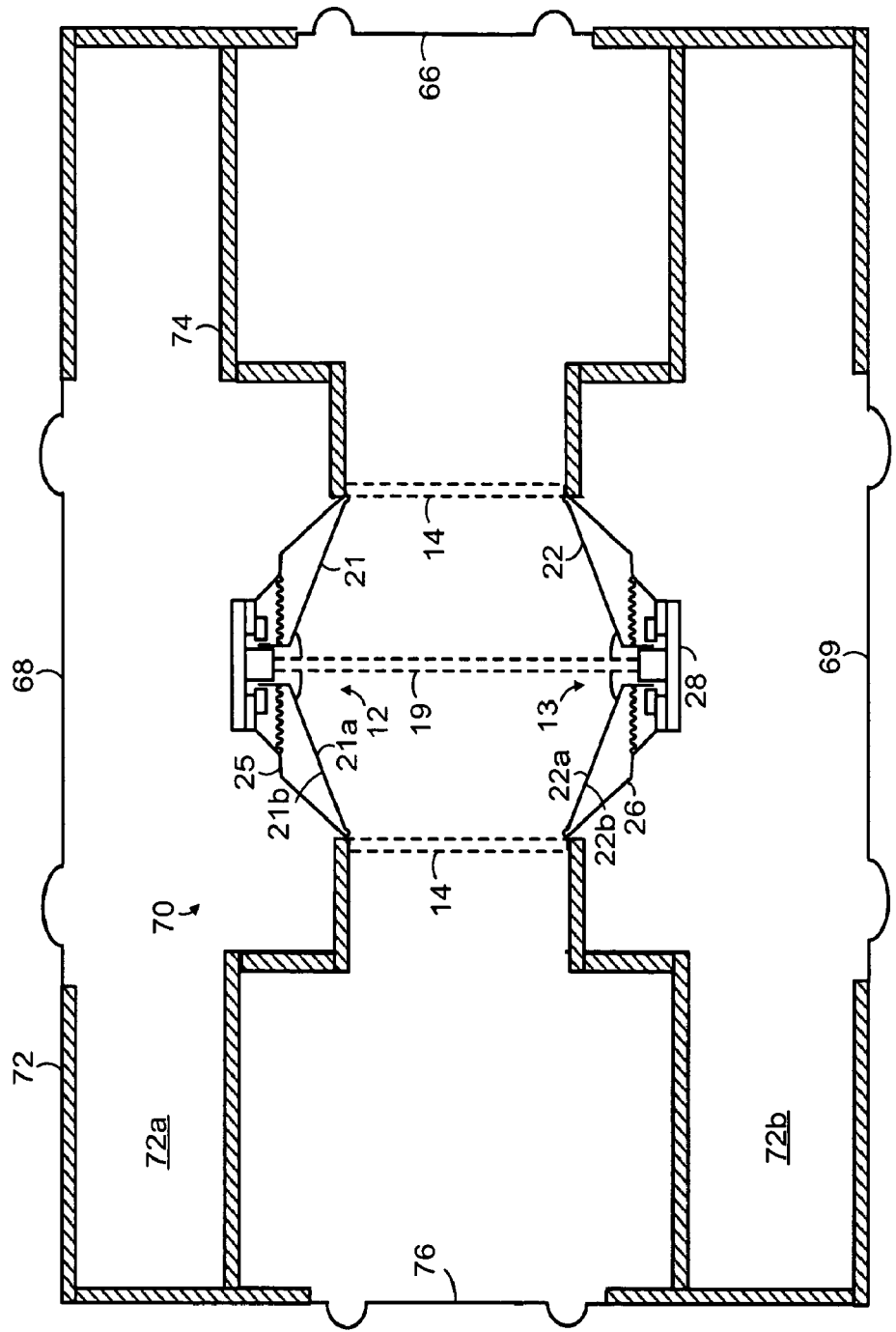

FIG. 5D is a diagrammatic representation of an alternative embodiment of the invention with an assembly 70 mounted in an enclosure 72. The assembly 72 includes the first 12 and the second transducers 13 that are mounted to a sub-enclosure 74. The first 12 and the second transducers 13 are mechanically coupled to each other using the mechanical links 14. The first 12 and the second transducers 13 can alternatively be mechanically coupled through the connecting member 19. In another embodiment, the first 12 and the second transducers 13 can be indirectly acoustically coupled through the walls of the enclosures 72, 74 without including the mechanical links 14 or the connecting member 19. Also, it should be noted that the volumes 72a and 72b can be part of a contiguous acoustic volume, or could be physically separate volumes.

The first surface 21a of the diaphragm 21 in the first transducer 12 and the first surface 22a of the diaphragm 22 in the second transducer 13 are acoustically coupled to the sub-enclosure 74. The sub-enclosure 74 includes the first passive radiator 66 and a second passive radiator 76. The first 66 and second passive radiators 76 are located on opposing walls of the enclosure 72. This arrangement allows the diaphragms of the passive radiators 66, 76 to move in substantially opposite directions when they are stimulated by the acoustic energy in the sub-enclosure 74 from the movement of the diaphragms 21, 22. The opposing motion of the diaphragms 66, 76 reduce a resultant mechanical force on the enclosure 72 compared to what would otherwise be applied if the diaphragms 66, 76 moved in the same or random directions.

The dimensions and volume of the sub-enclosure 74 and the first 66 and the second passive radiators 76 are determined based on the characteristics of the transducers 12, 13 and the desired frequency response of the system, for example. The first 66 and the second passive radiators 76 can be replaced by one or more acoustic ports.

The sub-enclosure 74 is mounted within the enclosure 72. The second surface 21b of the diaphragm 21 in the first transducer 12 and the second surface 22b of the diaphragm 22 in the second transducer 13 are acoustically coupled to the enclosure 72. The enclosure 72 includes a third 68 and a fourth passive radiator 69. The third 68 and fourth passive radiators 69 are located on opposing walls of the enclosure 72. This arrangement allows the diaphragms of the passive radiators 68, 69 to move in substantially opposite directions when they are stimulated by the acoustic energy in the enclosure 72 from the movement of the diaphragms 21, 22. The opposing motion of the diaphragms 68, 69 reduces the resultant mechanical force on the enclosure 72 compared to what would otherwise be applied if the diaphragms 68, 69 moved in the same or random directions.

The dimensions of the enclosure 72 and the dimensions of the passive radiators 68, 69 are determined based on the characteristics of the transducers 12, 13 and the desired frequency response of the system, for example. Skilled artisans will appreciate that the number, shape, and size of passive radiators can be changed as long as the resultant force on the enclosure 72 from the movement of the diaphragms of the passive radiators is reduced.

FIG. 5E is a diagrammatic representation of an alternative embodiment of the invention with an assembly 80 mounted in an enclosure 81. The assembly 80 includes a first transducer 82 having an inverted motor structure and a first diaphragm 83. The assembly 80 also includes a second 84, a third 86, and a fourth transducer 88. The second transducer 84 includes an inverted motor structure and a second diaphragm 85. The third transducer 86 includes an inverted motor structure and a third diaphragm 87. The fourth transducer 88 includes an inverted motor structure and a fourth diaphragm 89. The transducers 82, 84, 86, 88 are attached using rigid members 90. Portions of the rigid members 90 are acoustically transparent such that acoustic energy can pass though them with substantially no attenuation.

Input signals are applied to the transducers 82, 84, 86, 88 having the desired relative phase such that motions of the diaphragms 83, 85, 87, 89 reduce a resultant mechanical force on the rigid members 90 and on the enclosure 81 that would otherwise be applied if an input signal was applied to only one of the transducers 82, 84, 86, 88. The input signals cause the first diaphragm 83 in the first transducer 82 and the third diaphragm 87 in the third transducer 86 to move in a first direction. The input signals cause the second diaphragm 85 in the second transducer 84 and the fourth diaphragm 89 in the fourth transducer 88 to move in a second direction that is substantially opposite to the first direction.

Acoustic energy is coupled from a front surface of the first diaphragm 83 to the listening area 18. Acoustic energy is indirectly coupled to the listening area 18 from the rear surface of the second diaphragm 85 and the front surface of the third diaphragm 87 through an acoustic path 91. Acoustic energy is also indirectly coupled to the listening area 18 from the rear surface of the fourth diaphragm 89 through the acoustic path 91. The directly-coupled acoustic energy from the first transducer 82 and the indirectly-coupled acoustic energy from the acoustic path 91 arrive at the listening area 18 substantially in-phase.

Acoustic energy from the rear surface of the first diaphragm 83 and the front surface of the second diaphragm 85 as well as the rear surface of the third diaphragm 87 and the front surface of the fourth diaphragm 89 are acoustically coupled to the cavity 92 The multi-element assembly 80 can be used in any embodiment where a two element assembly is used.

The dimensions of the enclosure 81 including the dimensions of the cavity 92 are determined based on the characteristics of the transducers 82, 84, 86, 88 and the desired frequency response of the system, for example.

FIG. 5F is a diagrammatic representation of an embodiment of the invention showing an unmounted assembly 80' including four separate transducers 82', 84', 86', 88'. The transducers 82', 84', 86', 88' are configured to be analogous to a single transducer with a front side 93 and a backside 95. The pressure P1 at the front side 93 (a first location) is out of phase with the pressure P2 at the backside 95 (a second location). Thus, the assembly 80' can be used to replace a single transducer. The assembly 80' can also be mounted in any enclosure or baffle. The transducers 82', 84', 86', 88' are configured and oriented such that input signals applied to the first pair of transducers 82', 84' cause the movable elements in the transducers 82', 84' to move in substantially opposite directions relative to each other and input signals applied to the second pair of transducers 86', 88' cause the movable elements in the transducers 86', 88' to also move in substantially opposite directions relative to each other. Various other configurations can be used without departing from the invention. For example, additional transducers could also be used in various orientations as long as the pressure $P_1$ at the first location is out of phase with the pressure $P_2$ at the second location.

In one embodiment, the transducers are oriented in a substantially columnar configuration. Additionally, an arbitrary number of transducers can be used including an odd number of transducers. A complex baffle can be used to maintain the phase relationship between the pressure $P_1$ at the first location and the pressure $P_2$ at the second location.

In one embodiment, the first pair of diaphragms of the transducers 82', 84' and the second pair of diaphragms of the transducers 86', 88' are mechanically coupled to a frame 96. The first pair of diaphragms and the second pair of diaphragms are oriented substantially in-line. As previously discussed, input signals applied to the motor structures of the transducers 82', 84' cause the first pair of diaphragms to move in substantially opposite directions relative to each other. Input signals applied to the motor structures of the transducers 86', 88' cause the second pair of diaphragms to move in substantially opposite directions relative to each other.

In one embodiment, the movement of the second pair of diaphragms of the transducers 86', 88' is substantially in phase with the movement of the first pair of diaphragms of the transducers 82', 84'. An acoustic shield 97 can be located proximate to the first pair of diaphragms. The acoustic shield 97 is configured to prevent acoustic energy from a first surface of a diaphragm in the first pair of transducers 82', 84' from destructively combining with acoustic energy from a second surface of the diaphragm. Another acoustic shield 98 can be located proximate to the second pair of diaphragms. The other acoustic shield 98 prevents acoustic energy from a first surface of a diaphragm in the second pair of transducers 86', 88' from destructively combining with acoustic energy from a second surface of the diaphragm. In one embodiment, a substantially contiguous baffle separates the front side pressure P1 from the back side pressure P2 in the transducer assembly 80'.

The transducers 82', 84', 86', 88' can be mounted in an enclosure. Additionally, the diaphragms of the transducers 82', 84', 86', 88' can be arranged in various orientations, such as inverted or non-inverted relative to each other. Although the transducers 82', 84', 86', 88' are illustrated having standard motor structures, the transducers 82', 84', 86', 88' can include inverted motor structures.

Figure 6:
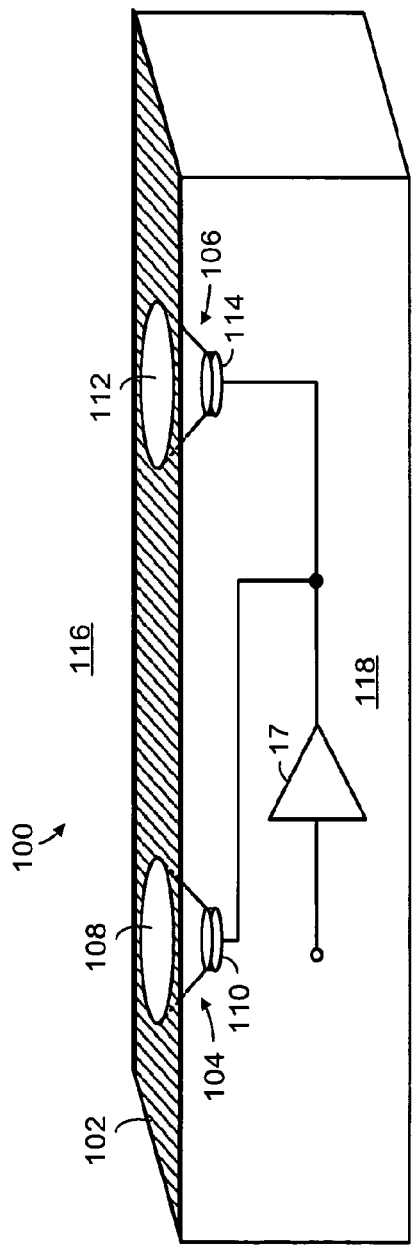
FIG. 6 is a perspective view of a typical loudspeaker assembly carried by an infinite baffle, such as a vehicle rear package shelf.

FIG. 6 is a perspective view of a typical loudspeaker assembly 100 carried by an infinite baffle 102, such as a vehicle rear package shelf. The loudspeaker assembly 100 includes a first 104 and a second electro-acoustic transducer 106 that are seated into apertures in the infinite baffle 102. The electro-acoustic transducers 104, 106 are rigidly mounted to the infinite baffle 102 using screws or other hardware. The first electro-acoustic transducer 104 includes a diapragm 108 and a motor structure 110. The second electro-acoustic transducer 106 also includes a diaphragm 112 and a motor structure 114.

A front surface of each of the diaphragms 108, 112 is acoustically coupled to a listening area 116 which can be the passenger compartment of a vehicle, for example. A rear surface of each of the diaphragms 108, 112 is acoustically coupled to a cavity 118 which can be the trunk of the vehicle.

A power amplifier 17 energizes the motor structures 110, 114 in the first 104 and the second electro-acoustic transducers 106 with an input signal. In some systems, each of the first 104 and the second electro-acoustic transducers 106 are driven using different input signals, such as left or right stereo signals. The input signals applied to the motor structures 110, 114 cause the diaphragms 108, 112 to move, thereby creating acoustic energy that is coupled to the listening area 116.

The electro-acoustic transducers 104, 106 are rigidly mounted to the infinite baffle 102, and therefore, the movement of the diaphragms 108, 112 generates mechanical forces on the infinite baffle 102. These mechanical forces can degrade the sound emanating from the electro-acoustic transducers 108, 112 because the infinite baffle 102 is typically fabricated from thin material, such as thin sheet metal. Such thin materials typically have insufficient stiffness to resist vibration and are typically lightly dampened. As a result, the mechanical forces applied to the infinite baffle 102 around the modal resonance frequencies of the infinite baffle 102 can result in excessive vibration of the structure, which can be acoustically perceived as undesired buzzes and rattles, and/or degraded frequency response of the radiated sound.

Figure 7:
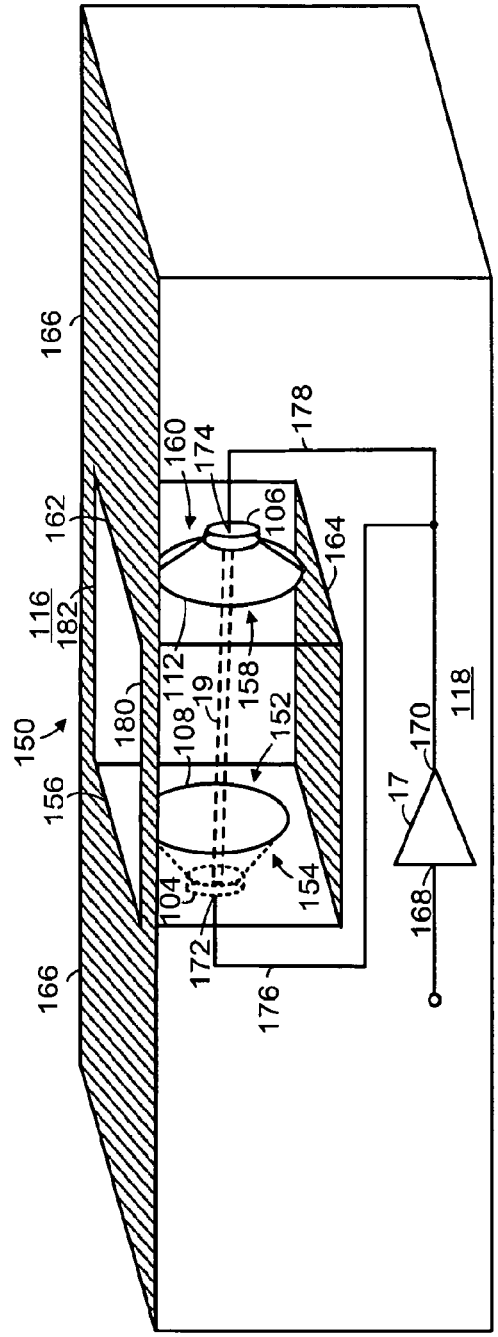
FIG. 7 illustrates a perspective view of a loudspeaker system including a pair of electro-acoustic transducers according to one embodiment of the invention.

FIG. 7 illustrates a perspective view of a loudspeaker system 150 including the electro-acoustic transducers 104, 106 according to one embodiment of the invention. The first 104 and the second electro-acoustic transducers 106 can be arranged in a substantially parallel configuration so that the motion of the diaphragms 108, 112 is along the same axis. By substantially parallel, we mean that the transducers 104, 106 can be arranged to be exactly parallel to each other or can be arranged to be slightly non-parallel to each other while still providing an effective result. However, substantially non-parallel configurations can also be realized. For example, in an embodiment including an odd number of transducers, each of the transducers can be arranged to be non-parallel to the other transducers. In one embodiment, the first transducer 104 includes the first movable diaphragm 108. The first movable diaphragm 108 includes a first surface 152 that is acoustically coupled to the listening area 116. For example, the first surface 152 can be a front or rear surface of the first diaphragm 108. A second surface 154 of the first diaphragm 108 is acoustically coupled to the cavity 118. For example, the second surface 154 can be the front or rear surface of the first diaphragm 108. The first transducer 104 is mounted to a first baffle 156.

In one embodiment, the second transducer 106 includes the second movable diaphragm 112. The second movable diaphragm 112 includes a first surface 158 that is acoustically coupled to the listening area 116. For example, the first surface 158 can be a front or rear surface of the second diaphragm 112. A second surface 160 of the second diaphragm 112 is acoustically coupled to the cavity 118. For example, the second surface 160 can be the front or rear surface of the second diaphragm 112. The second transducer 106 is mounted to a second baffle 162. The second baffle 162 can be positioned substantially parallel to the first baffle 156. The first baffle 156 is structurally coupled to the second baffle 162. A rigid member 164 can form part of an enclosure surrounding the cavity 118. Other rigid members 180, 182 can also form part of the enclosure surrounding the cavity 118. The rigid members 180, 182 are arranged to acoustically isolate the front surfaces 152, 158 of each diaphragm 108, 112 from the rear surfaces 154, 160. The rigid members 180, 182 are shown without shading for clarity.

The loudspeaker system 150 is coupled to an infinite baffle 166. The first 156 and the second baffles 162 can be positioned to be substantially perpendicular to the infinite baffle 166. The infinite baffle 166 can be a rear package shelf or a door panel in a vehicle, or a door, wall, floor, or ceiling of a room, for example. The loudspeaker system 150 can also be mounted behind a seatback, a dashboard, or in a headliner of a vehicle. The first 108 and the second diaphragms 112 of the first 104 and the second transducers 106 can be any shape or size depending on the requirements of the system. For example, the shape of the diaphragms 108, 112 can be round or elliptical, or any other suitable shape. Additionally, the diaphragms 108, 112 can be any diameter in the case of round diaphragms or any elliptical size such as 4.times.6, 5.times.7, or 6.times.9 in the case of elliptical diaphragms. Elliptical diaphragms have a different shape than round diaphragms, and thus, transducers having elliptical diaphragms can provide additional packaging flexibility as compared to similarly sized transducers having round diaphragms.

In one embodiment, the frame of the first transducer 104 is molded into the first baffle 156 and the first diaphragm 108 is then attached to the molded frame. The frame of the second transducer 106 can also be molded into the second baffle 166 and the second diaphragm 112 can then be attached to the molded frame. Any transducer, regardless of the process of manufacturing the transducer, can be used.

An input signal from a signal source (not shown) is coupled to an input port 168 of the power amplifier 17. An output port 170 of the power amplifier 17 is electrically coupled to an input 172 of the first transducer 104 and an input 174 of the second transducer 106 through conductive paths 176, 178. The power amplifier 17 energizes the first transducer 104 and the second transducer 106 with an input signal and drives the first 104 and the second transducer 106 substantially in phase to produce an acoustic output signal. The system 150 is arranged such that when the diaphragm 108 of the first transducer 104 is moving in one direction, the diaphragm 112 of the second transducer 106 moves in the substantially opposite direction, which significantly reduces resultant forces applied to the rigid members 164, 180, 182 while significantly maintaining the acoustic output signal. This also reduces undesired resultant vibrations in the baffles 156, 162 and the infinite baffle 166. The resultant vibration in the baffle 166 due to the motion of the movable elements of both transducers 104, 106 being driven with an input signal is less than a vibration imparted to the baffle 166 due to the motion of a single transducer being driven alone with the same input signal.

In one embodiment, the first 104 and the second transducer 106 are driven substantially in mechanical phase opposition by an input signal such that a resultant mechanical force applied to the rigid member 164 from the movement of the first 108 and the second movable diaphragms 112 is reduced, while the acoustic outputs from the first 104 and the second transducers 106 are combined acoustically in phase. In one embodiment, each transducer 104, 106 is identical and the force imparted to the baffle 166 due to the motion of the movable elements of the first transducer 104 is substantially equal and opposite to the force imparted to the baffle 166 due to the motion of the moveable elements of the second transducer 106. The opposite motion of the movable elements of the transducers 104, 106 reduce a resultant force and a vibration imparted to the baffle 166.

In the embodiment shown in FIG. 7, the direction of movement of the movable elements of each of the transducers 104, 106 is substantially collinear. The transducers 104, 106 are shown being mounted in a symmetrical manner, but non-symmetrical embodiments can be realized by determining appropriate force vectors and mounting the transducers at suitable orientations with respect to each other. For example, in an embodiment having three transducers (not shown), each transducer can be oriented at a vertice of an isosceles triangle such that principle axis of radiation of each transducer intersect in the center of the triangle. The resultant forces imparted to the baffle by the movement of the moveable elements in the transducers is reduced when input signals having the appropriate polarity are applied to each transducer.

The transducers 104, 106 can include low-pass, high-pass, or band-pass filters or crossover networks, for example. The filters can be acoustic or electrical filters. The electrical filters can be active or passive filters. The electrical filters can be analog, digital, or a combination of analog and digital filters. For example, a low-pass filter can restrict spectral components of the input signal above a predetermined cutoff frequency, whereas a high-pass filter can restrict spectral components of the input signal below a predetermined cutoff frequency.

In one embodiment (not shown), the acoustic output from the second surfaces 154, 160 of the first 108 and the second diaphragms 112 can be coupled to the listening area 116 through an acoustic port (not shown) that is coupled to the cavity 118.

In one embodiment (not shown), the first transducer 104 and the second transducer 106 are arranged such that the first 108 and the second diaphragm 112 are positioned in the same orientation, such as is shown in FIG. 1A. In this embodiment, the power amplifier 17 energizes the first transducer 104 and the second transducer 106 with signals having opposite polarity. The system is arranged such that when the diaphragm 108 of the first transducer 104 is moving in one direction, the diaphragm 112 of the second transducer 106 is moving in the substantially opposite direction, which significantly reduces the resultant force applied to the rigid members 164, 180, 182. This also reduces undesired resultant vibrations in the baffle 166.

The second transducer 106 is not required to be identical to the first transducer 104. All that is required for significant reduction in vibration is for the moving mass and generated motor force of the second transducer 106 to approximately equal the moving mass and generated motor force of the first transducer 104. Such a component could be made at lower cost than the cost of a transducer that is identical to the first transducer 104.

In one embodiment, the first baffle 156, the rigid members 164, 180, 182, and the second baffle 162 are fabricated from a single sheet of material. The sheet of material can be formed from wood, metal, fiberglass, particle board, or any suitable material. In another embodiment, the first 156 and the second baffle 162 are rigidly mounted to the rigid member 164. The assembly can then be mounted to the baffle 166. As previously described, the baffle 166 can be a rear package shelf, a seatback, a floorboard, an interior door panel, a headliner or a dashboard of a vehicle. Alternatively, the baffle 166 can be a structural panel such as a wall, a ceiling, a floor, or a door in a residence, business, theater, stadium, or concert hall, for example.

In one embodiment, the first baffle 156 and the second baffle 162 can be similarly sized so that the first 104 and the second transducers 106 can be arranged in a parallel configuration such that the first 108 and the second diaphragms 112 are aligned with each other. An optional means of assembly could be to rigidly attach the top of a motor structure of the first transducer 104 to the top of a motor structure of the second transducer 106 using a rigid connecting member 19. In an embodiment in which the transducers 104, 106 are inverted relative to the illustrative embodiment of FIG. 7, the rigid connecting member 19 connects the rear of the motor structures of the transducers 104, 106.

Figure 8:
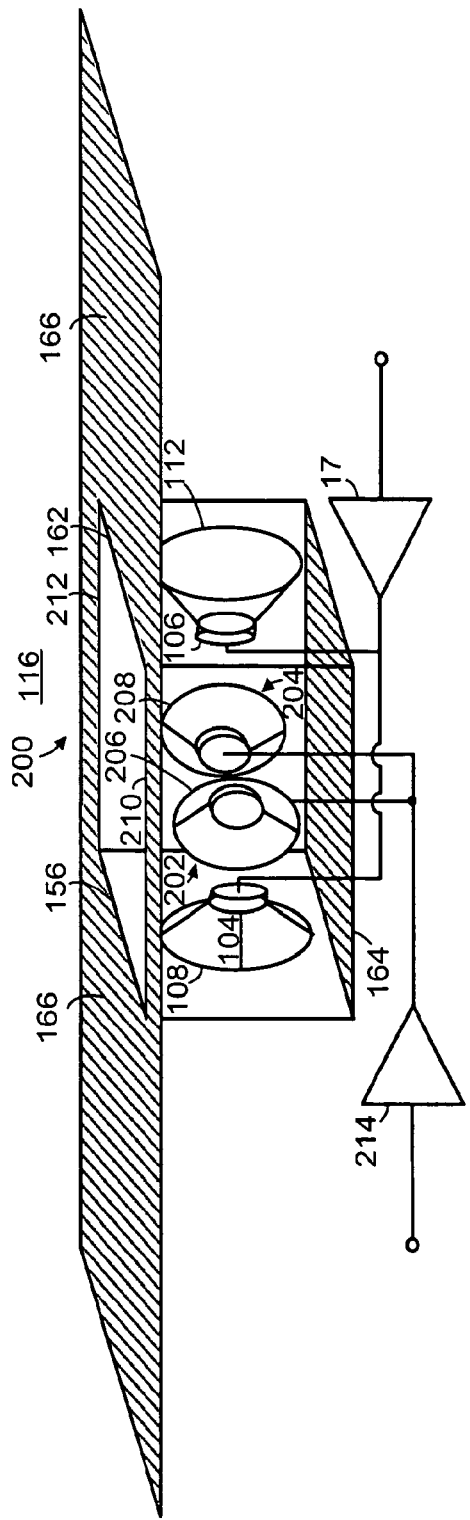
FIG. 8 illustrates a perspective view of a loudspeaker system including a pair of electro-acoustic transducers and additional third and fourth electro-acoustic transducers according to one embodiment of the invention.

FIG. 8 illustrates a perspective view of a loudspeaker system 200 including the electro-acoustic transducers 104, 106 and additional third 202 and fourth electro-acoustic transducers 204 according to one embodiment of the invention. The first 104 and the second electro-acoustic transducers 106 are arranged in a parallel configuration so that the motion of the diaphragms 108, 112 is in the same axial direction. In this embodiment, the first 104 and the second electro-acoustic transducers 106 are positioned in an inverted arrangement compared with the loudspeaker system 150 illustrated in FIG. 7, but can be arranged in the same configuration.

The third 202 and the fourth electro-acoustic transducers 204 are also arranged in a parallel configuration so that the motion of diaphragms 206, 208 is in the same axial direction. In general, the direction of motion of the diaphragms 108, 112 of the electro-acoustic transducers 104, 106 is perpendicular to the direction of motion of the diaphragms 206, 208 of the electro-acoustic transducers 202, 204. The first transducer 104 is mounted to the first baffle 156. The second transducer 106 is mounted to the second baffle 162. The second baffle 162 is positioned substantially parallel to the first baffle 156. The rigid member 164 mechanically couples the first baffle 156 to the second baffle 162.

The third transducer 202 is mounted to a third baffle 210. The fourth transducer 204 is mounted to the fourth baffle 212. The third baffle 210 is positioned substantially parallel to the fourth baffle 212. The rigid member 164 mechanically couples the third baffle 210 to the fourth baffle 212. The rigid member 164 also forms part of an enclosure surrounding the cavity (not shown). The loudspeaker system 200 is coupled to the infinite baffle 166. As previously discussed, the infinite baffle 166 can be a rear package shelf, a headliner, a floorboard, a seatback, or a door panel in a vehicle, or a structural panel, such as a wall, floor, or ceiling of a room, for example.

The power amplifier 17 energizes the first transducer 104 and the second transducer 106 with electrical signals having the same polarity and drives the first 104 and the second transducer 106 mechanically in phase opposition. The system 200 is arranged such that when the diaphragm 108 of the first transducer 104 is moving in one direction, the diaphragm 112 of the second transducer 106 moves in the substantially opposite direction, which significantly reduces the forces applied to the rigid member 164. This also reduces undesired resultant vibrations in the baffles 156, 162 and the infinite baffle 166.

Another power amplifier 214 (or the same power amplifier 17) energizes the third transducer 202 and the fourth transducer 204 with electrical signals having the same polarity and drives the third 202 and the fourth transducer 204 in mechanical phase opposition. The system 200 is arranged such that when the diaphragm 206 of the third transducer 202 is moving in one direction, the diaphragm 208 of the fourth transducer 204 moves in the substantially opposite direction, which significantly reduces the forces applied to the rigid member 164. This also reduces undesired resultant vibrations in the baffles 210, 212 and the infinite baffle 166.

In one embodiment, one or more power amplifiers (not shown) energize the first 104, the second 106, the third 202, and the fourth transducers 204 with electrical signals having appropriate polarity and drive the first pair of transducers 104, 106, in mechanical phase opposition and the second pair of transducers 202, 204 in mechanical phase opposition. In this embodiment, the diaphragms 108, 112 of the transducers 104, 106 move in substantially opposite directions relative to each other and the diaphragms 206, 208 of the transducers 202, 204 move in substantially opposite directions relative to each other.

In one embodiment (not shown), the first transducer 104, the second transducer 106, the third transducer 202, and the fourth transducer 204 are arranged such that the diaphragms 108, 112, 206, 208 are positioned in various orientations, such as inverted relative to each another. In this embodiment, the power amplifiers 17, 214 energize the transducers 104, 106, 202, 204 with signals having specific phases that drive the pairs of diaphragms 108, 112 and 206, 208 in substantially opposite directions regardless of their orientation. The system is arranged such that when the diaphragm 108 of the first transducer 104 is moving in one direction, the diaphragm 112 of the second transducer 106 is moving in the substantially opposite direction. Similarly, when the diaphragm 206 of the third transducer 202 is moving in one direction, the diaphragm 208 of the fourth transducer 204 is moving in the substantially opposite direction. This substantially opposite movement significantly reduces the resultant forces applied to the rigid member 164. This also reduces undesired resultant vibrations in the baffle 166.

In one embodiment, a common input signal is applied to the transducers 104, 106, 202, 204 such that the diaphragms 108, 112, 206, 208 of the transducers 104, 106, 202, 204 all move inward toward the center of the assembly, simultaneously, and move outward for the opposite polarity applied. In some embodiments, the transducers 104, 106, 202, 204 can include standard or inverted motor structures.

Figure 9A:
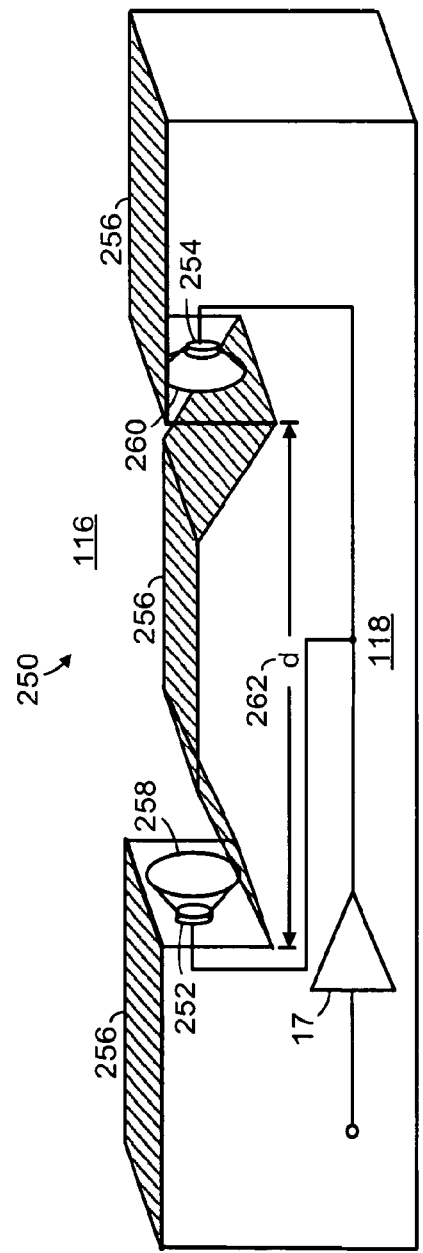
FIG. 9A illustrates a perspective view of a loudspeaker system including a first and a second electro-acoustic transducer that are mounted to an infinite baffle according to one embodiment of the invention.

FIG. 9A illustrates a perspective view of a loudspeaker system 250 including a first 252 and a second electro-acoustic transducer 254 that are mounted to an infinite baffle 256 according to one embodiment of the invention. The first 252 and the second transducers 254 are positioned so that the front surfaces of diaphragms 258, 260 are substantially in the same orientation and facing each other. The distance (d) 262 between the first 252 and the second transducers 254 can be varied while still minimizing undesired vibrations in the baffle 256 that result from the movement the diaphragms 258, 260 of the first 252 and the second transducers 254. The movement of the diaphragms 258, 260 is generated by the motor structures of the first 252 and the second transducers 254.

A front surface of each of the diaphragms 258, 260 of the transducers 252, 254 is acoustically coupled to the listening area 116 which can be the passenger compartment of a vehicle or a room, for example. A rear surface of each of the diaphragms 258, 260 is acoustically coupled to the infinite cavity 118 which can be the trunk of the vehicle or a volume of space between the walls or under a floor in a residence, for example. The transducers 252, 254 can be elliptically shaped. Elliptically shaped transducers can be oriented to minimize the depth intrusion into the cavity 118.

The amplifier 17 provides an input signal to the first 252 and the second transducer 254. In the embodiment shown, each of the first 252 and the second transducer 254 receives the input signal having the same relative polarity. This causes the diaphragms 258, 260 of the transducers 252, 254 to move in substantially opposite directions. The movement of the diaphragms 258, 260 generates mechanical forces on the baffle 256. The mechanical forces that are imparted to the baffle 256 can degrade the sound emanating from the transducers 252, 254 especially around the modal resonance frequencies of the baffle 256. Excitation of these modal resonance frequencies can result in excessive vibration of the baffle 256, which can be acoustically perceived as undesired buzzes and rattles, and/or degraded frequency response of the radiated sound. The substantially opposite movement of the diaphragms 258, 260 can effectively reduce these vibrations in the baffle 256.

Figure 9B:
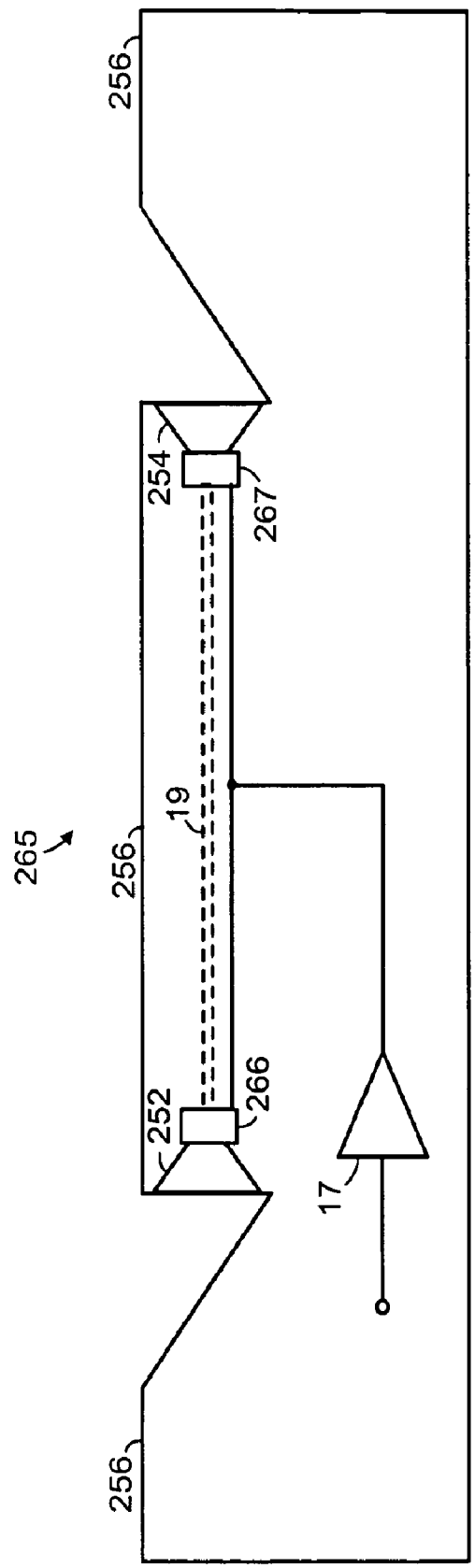
FIG. 9B illustrates a side view of a loudspeaker system including a first and a second electro-acoustic transducer that are mounted to an infinite baffle according to another embodiment of the invention.

FIG. 9B illustrates a side view of a loudspeaker system 265 including a first 252 and a second electro-acoustic transducer 254 that are mounted to an infinite baffle 256 according to another embodiment of the invention. An optional rigid connecting member 19 can mechanically couple the motor structures 266, 267 of the transducers 252, 254. The amplifier 17 provides input signals to the first 252 and the second transducer 254. Each of the first 252 and the second transducer 254 receives the input signal having the same relative polarity. This causes the diaphragms of the transducers 252, 254 to move in substantially opposite directions, thereby reducing a resultant mechanical force imparted to the baffle 256. In one embodiment, the amplifier 17 provides monophonic low frequency signals to the transducers 252, 254 such that the transducers move in substantially opposite directions in response to the low frequency signals. The amplifier 17 can also provide stereophonic higher frequency signals to the transducers 252, 254 since higher frequency signals generally create less forces on the baffle 256 than lower frequency signals.

FIG. 10 illustrates a perspective view of a loudspeaker system 270 including a first pair 272, 274 and a second pair of electro-acoustic transducers 276, 278 that are mounted to an infinite baffle 280 according to one embodiment of the invention. A first plurality of rigid members 282, 283, 284 is mechanically coupled between the first pair of transducers 272, 274. A second plurality of rigid members 285, 286, 287 is mechanically coupled between the second pair of transducers 276, 278.

A first amplifier 288 transmits an input signal to each of the first pair of electro-acoustic transducers 272, 274 through conductive paths 289, 290. For example, the first amplifier 288 can be a first channel in a stereo or multichannel amplifier, such as a left channel amplifier in a stereo system. In one embodiment, the polarity of the input signal traveling through the conductive path 290 is modified before it reaches the transducer 272. In another embodiment, an input signal is applied to the first pair of transducers 272, 274 and the motor structures of the first pair of transducers 272, 274 are inversely configured with respect to each other. For example, a magnet in the motor structure of the transducer 272 can have its poles inverted with respect to the magnet in the motor structure of the transducer 274. This causes the diaphragms in the first pair of transducers 272, 274 to move in substantially opposite directions in response to being driven by the input signal. The opposing motion of the diaphragms in the first pair of transducers 272, 274 reduces a resultant mechanical force applied to the rigid members 282, 283, 284 that is generated from the movement of the diaphragms in the transducers 272, 274. A front surface of a diaphragm in the transducer 272 and a rear surface of a diaphragm in the transducer 274 are acoustically coupled to the listening area 116, which can be the passenger compartment of a vehicle. A rear surface of the diaphragm in the transducer 272 and a front surface of the diaphragm in the transducer 274 are acoustically coupled to the cavity 118, which can be the trunk of the vehicle.

A second amplifier 292 transmits an input signal to each of the second pair of electro-acoustic transducers 276, 278 through conductive paths 294, 296. For example, the second amplifier 292 can be a second channel in a stereo or multi-channel amplifier, such as a right channel amplifier in a stereo system. In one embodiment, the polarity of the input signal traveling through the conductive path 296 is modified before it reaches the transducer 278. In another embodiment, an input signal is applied to the second pair of transducers 276, 278 and the motor structures of the second pair of transducers 276, 278 are inversely configured with respect to each other. This causes the diaphragms in the second pair of transducers 276, 278 to move in substantially opposite directions in response to being driven by an input signal. The opposing motion of the diaphragms in the second pair of transducers 276, 278 reduces a resultant mechanical force applied to the rigid members 285, 286, 287 that is generated from the movement of the diaphragms in the transducers 276, 278.

A front surface of a diaphragm in the transducer 278 and a rear surface of a diaphragm in the transducer 276 are acoustically coupled to the listening area 116. A rear surface of the diaphragm in the transducer 278 and a front surface of the diaphragm in the transducer 276 are acoustically coupled to the cavity 118.

The first 272, 274 and second pairs of transducers 276, 278 effectively reduce the resultant forces on each of the rigid members 282, 283, 284, 285, 286, and 287. Thus, vibrations that can couple into the infinite baffle 280 from the first 272, 274 and second pairs of transducers 276, 278 are also reduced.

FIG. 11 illustrates a perspective view of a loudspeaker system 300 including a pair of electro-acoustic transducers 302, 304 that are mounted to an infinite baffle 306 which can be a seatback 323 of a rear seat 308 of a vehicle. In this embodiment, the transducers 302, 304 are mounted to baffles 310, 312 such that the diaphragms of the transducers 302, 304 are positioned substantially parallel to each other. The baffles 310, 312 are coupled to each other through rigid members 314, 316, 318. The rigid members 314, 316, 318 form part of the loudspeaker system 300 that intrudes into the cavity 116. For example, the cavity 116 can be a trunk of a vehicle.

Front surfaces of the diaphragms in the transducers 302, 304 are acoustically coupled to a listening area 118 through a pass-through 322 in the seatback 323 of the rear seat 308. In one embodiment, an armrest 324 can fold into the pass-through 322 if desired. Rear surfaces of the diaphragms in the transducers 302, 304 are acoustically coupled to the cavity 116. In some embodiments, acoustic ports, acoustic waveguides, passive radiators and/or acoustic dampening material can be added to the cavity 116 to improve the performance of the loudspeaker system 300.

The diaphragms in the transducers 302, 304 can be any desired shape including round or elliptical. Elliptically-shaped transducers have a different form factor than round transducers which can increase packaging options in the vehicle. For example, the a packaging option including elliptically-shaped transducers can be less intrusive in the cavity 116 then a packaging option using similarly sized round transducers. For example, the loudspeaker system 300 could include 4.times.6, 5.times.7, or 6.times.9 inch transducers.

Although the loudspeaker system 300 is shown positioned behind the rear seat 308 of a vehicle, the loudspeaker system 300 could be positioned in other locations within the vehicle. For example, the loudspeaker system 300 could be positioned under the seat 308, in the armrest 324, in a door panel, under a dashboard, in a floor, in a headliner, or any other suitable location. The loudspeaker system 300 could also be implemented in walls, ceiling and/or floors in a residence, a business, a theater, a stadium, or a concert hall, for example.

In operation, an input signal from a signal source (not shown) is coupled to a power amplifier (not shown). An output of the power amplifier is electrically coupled to the first transducer 302 and the second transducer 304. The power amplifier energizes the first transducer 302 and the second transducer 304 with an input signal and drives the first 302 and the second transducer 304 substantially acoustically in phase and in mechanical phase opposition to produce an acoustic output signal that is coupled to the listening area 118. The loudspeaker system 300 is arranged such that when the diaphragm of the first transducer 302 is moving in one direction, the diaphragm of the second transducer 304 moves in the substantially opposite direction, which significantly reduces a resultant mechanical force applied to the rigid members 314, 316, 318 while significantly maintaining the acoustic output signal. This also reduces undesired resultant vibrations in the rigid members 314, 316, 318, the infinite baffle 306 and the seatback 323 of the rear seat 308. In one embodiment, the seatback 323 of the rear seat 308 is the infinite baffle 306. The resultant vibration in the infinite baffle 306 due to the motion of the movable elements of both transducers 302, 304 being driven with an input signal is less than a vibration imparted to the infinite baffle 306 due to the motion of a single transducer being driven alone with the same input signal.

Figure 12:
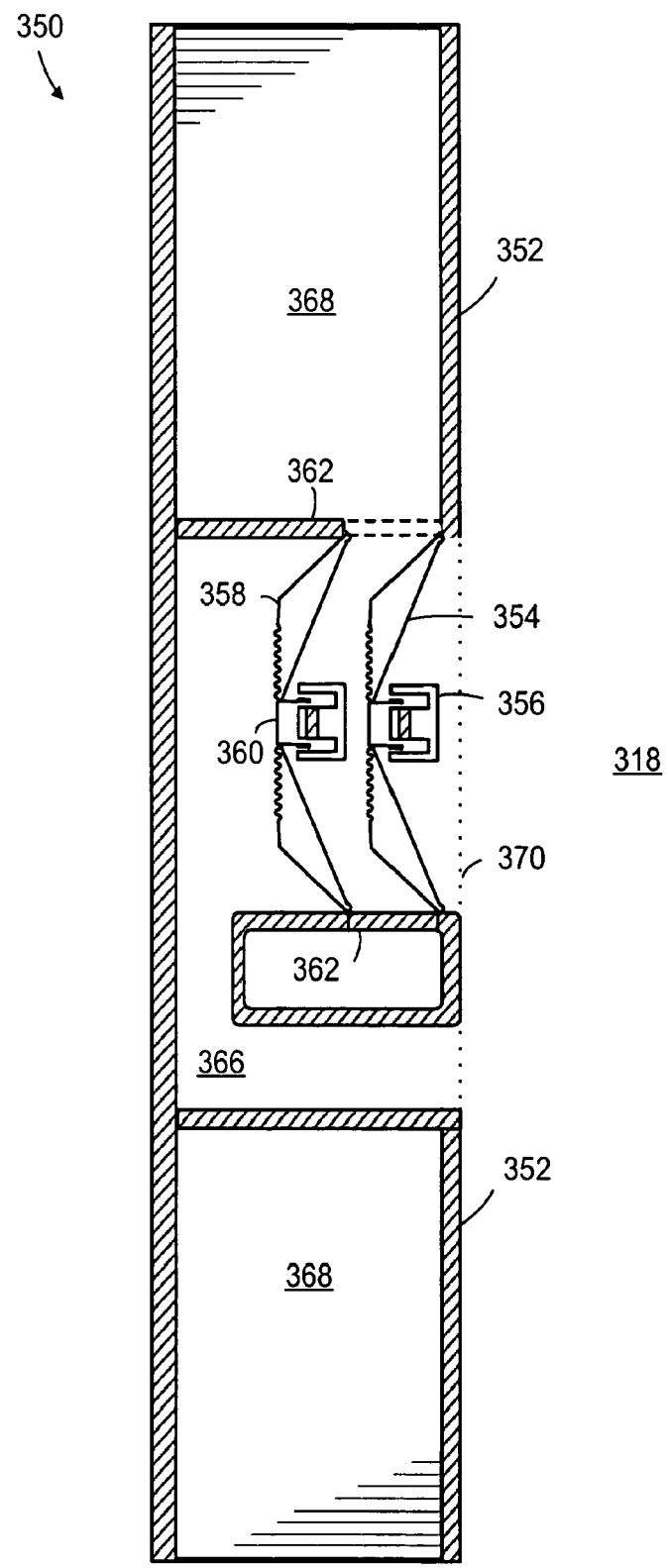
FIG. 12 is a diagrammatic representation of an embodiment of the invention with a loudspeaker assembly mounted to a structural panel.

FIG. 12 is a cross-sectional view of a loudspeaker system 350 according to the invention that is mounted to a structural panel 352. The arrangement of the system 350 is similar to the arrangement of the apparatus described with reference to FIG. 1A. A first transducer 354 is mechanically coupled to the structural panel 352 (i.e., an infinite baffle). The first transducer 354 includes an inverted motor structure 356. A second transducer 358 having an inverted motor structure 360 is mechanically coupled to the first transducer 354 through rigid members 362. For example, the loudspeaker system 350 can be mounted into a wall, floor, or a ceiling in a residential or commercial building.

A front surface of a diaphragm in the first transducer 354 is acoustically coupled to the listening area 318. A rear surface of a diaphragm in the second transducer 358 is acoustically coupled to the listening area 318 through an acoustic path 366. A rear surface of the diaphragm in the first transducer 354 and a front surface of the diaphragm in the second transducer 358 are acoustically coupled to a cavity 368. The cavity 368 can be acoustically coupled to the listening area 318 through an acoustic element, such as an acoustic port, an acoustic waveguide, or a passive radiator (not shown). For example, as previously described, the acoustic path 366 can include one or more acoustic elements.

The rigid members 362 mechanically couple the first 354 and the second transducers 358 to the structural panel 352 (i.e., infinite baffle). An input signal applied to the first 354 and the second transducers 358 causes the transducers 354, 358 to produce acoustic output into the listening area 318. The transducers 354, 358 are driven so that mechanical vibrations imparted to the rigid members 362 and the infinite baffle 352 from the movement of the transducers 354, 358 are reduced. The system 350 can also include acoustic ports, acoustic waveguides, and/or passive radiators that acoustically couple acoustic energy from the cavity 368 to the listening area 318. An acoustically transparent screen or grill 370 can be used to cover the system 350.

Figure 13:
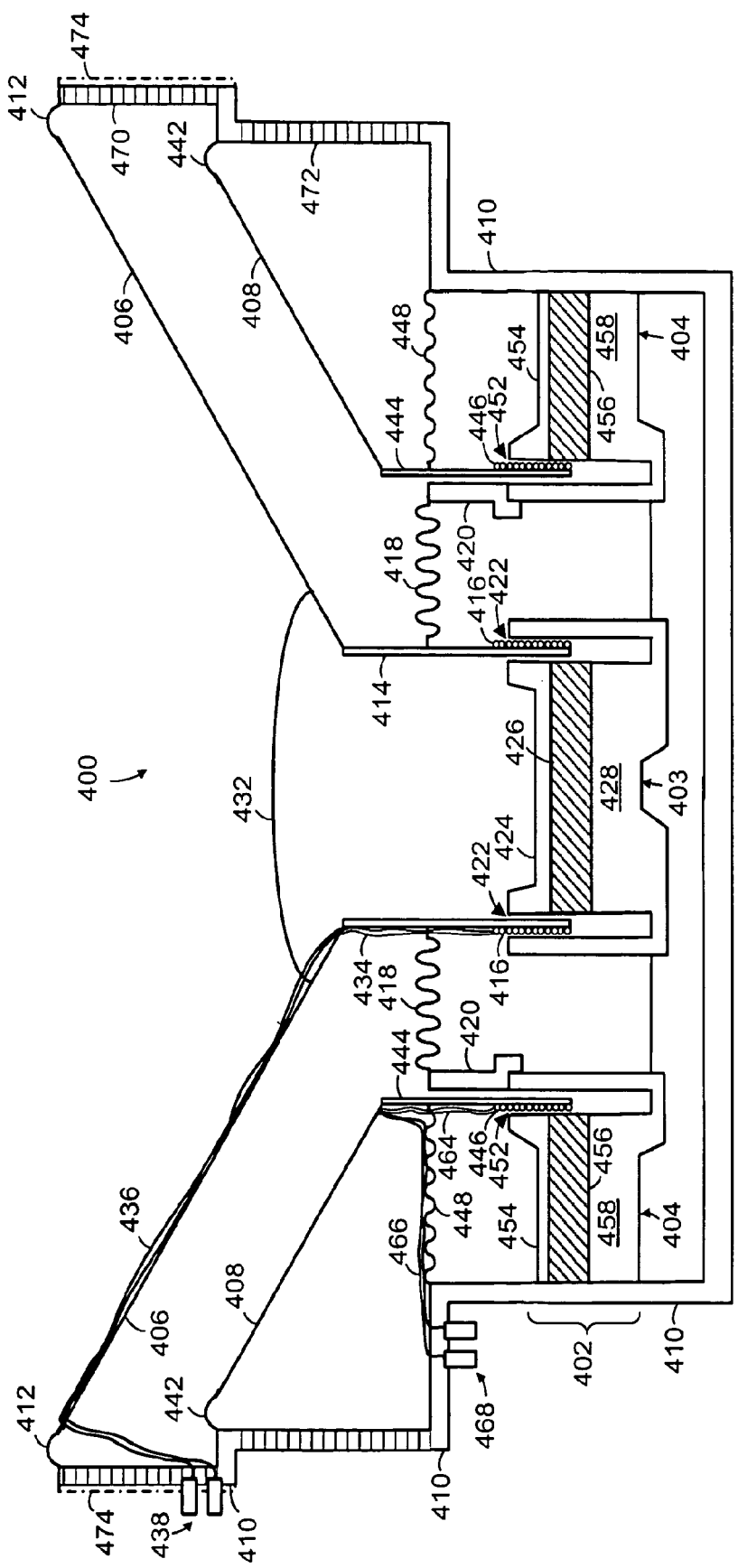
FIG. 13 is a cross-sectional view of an electro-acoustic transducer according to one embodiment of the invention.
Figure 17A:
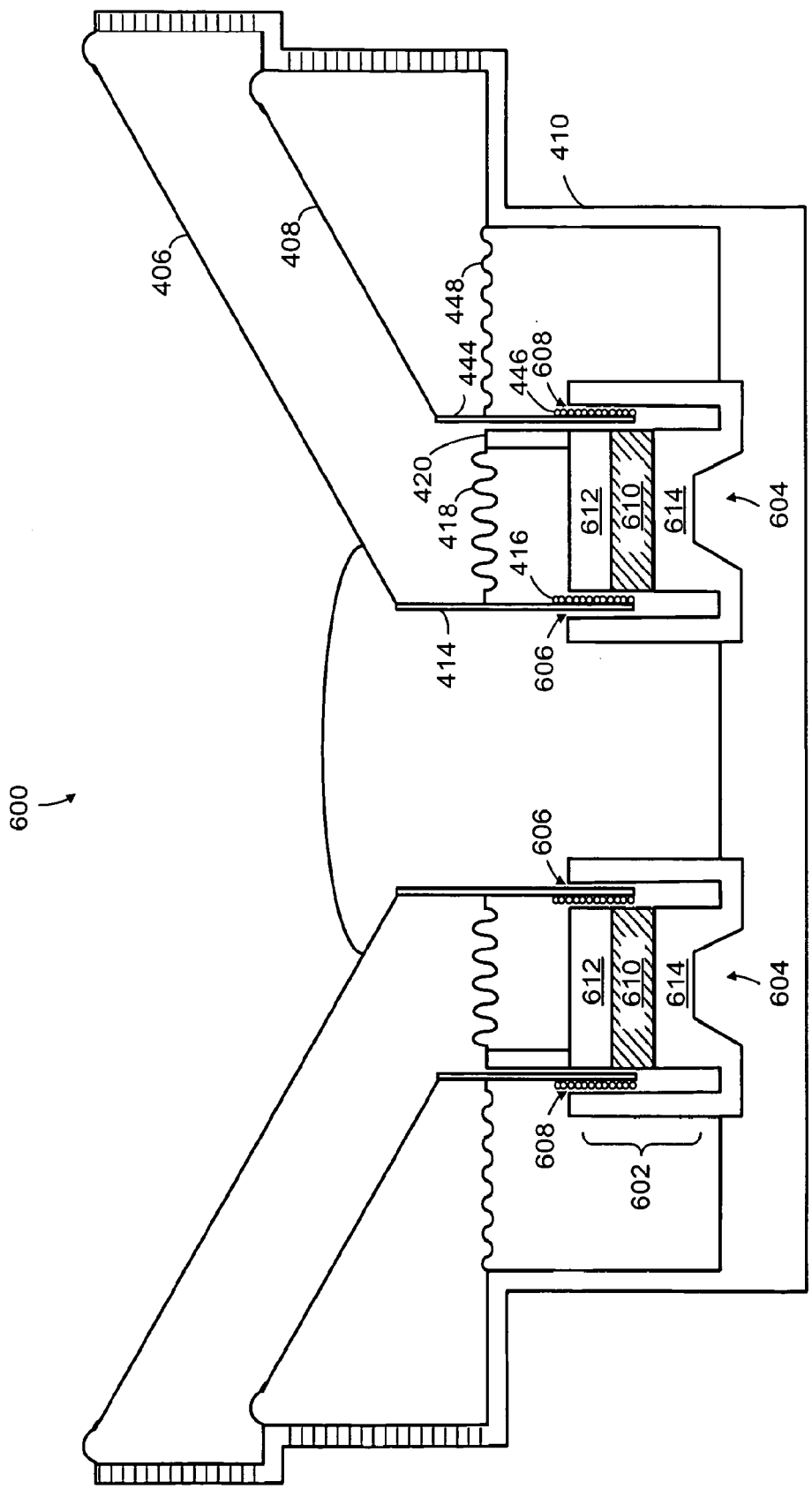
FIG. 17A is a cross-sectional view of an electro-acoustic transducer according to another embodiment of the invention.

FIG. 13 illustrates a cross-sectional view of an electro-acoustic transducer 400 according to one embodiment of the invention. The electro-acoustic transducer 400 is a moving coil type transducer. However, a moving magnet type transducer could also be constructed. The electro-acoustic transducer 400 includes a magnet assembly 402 having two sets of motor structures 403, 404 each with a single magnetic flux gap. The transducer 400 also includes a first 406 and second diaphragm 408 mounted to a common frame or basket 410. Other magnet assemblies having other motor structures geometries are also possible. For example, FIG. 17A illustrates a magnet assembly having a single motor structure with multiple magnetic flux gaps.

The electro-acoustic transducer 400 of FIG. 13 is shown generally circularly symmetric. However, circular symmetry is generally not required. For example, the first 406 and the second diaphragms 408 can be elliptical, oval, or any other desired shape. Additionally, the first 406 and the second diaphragms 408 can have the same or different surface areas. The motor structures 403, 404 can also be circularly symmetric or any other desired shape.

The first diaphragm 406 is mechanically coupled to the common frame 410 through a first surround 412. The first diaphragm 406 is also mechanically coupled to a first bobbin 414. The first bobbin 414 can be fabricated from any suitable material including plastic, paper, cardboard, fiberglass, or Kapton, for example. A first voice coil 416 is mechanically coupled to the first bobbin 414. For example, the first voice coil 416 can be wound around the first bobbin 414. A first spider 418 couples the first bobbin 414 to a support structure 420. The first bobbin 414 positions the first voice coil 416 in a first magnetic flux gap 422 of the first motor structure 403 in the magnet assembly 402.

The first motor structure 403 includes a top plate 424, a permanent magnet 426, and a back plate/pole assembly 428. The permanent magnet 426 can be a slug magnet that is generally disk-shaped. The permanent magnet can be fabricated from a rare earth-based magnetic material such as Samarian Cobalt, Neodymium-Iron-Boron, and/or any other known magnetic material.

In one embodiment, the permanent magnet 426 is magnetized in a direction that is normal to its flat surface. The north pole of the permanent magnet 426 can be located on its upper surface and the south pole can be located on its lower surface. However, the permanent magnet 426 can also be positioned with its poles reversed as long as the proper polarity is maintained to ensure that the first voice coil 416 moves in the desired direction.

Magnetic flux emanates from the top of the permanent magnet 426 and is conducted through the top plate 424 which can be fabricated from any magnetically permeable material, such as steel. The magnetic flux then crosses through the first magnetic flux gap 422 and onto the back plate/pole assembly 428 and then to the permanent magnet 426. Thus, a first magnetic circuit is formed with magnetic flux passing through the first magnetic flux gap 422. The back plate/pole assembly 428 can also be fabricated from a magnetically permeable material, such as steel.

A dust cap 432 can be positioned on the first diaphragm 406 to protect the first motor structure 403 from debris that can impact the operation of the transducer 400. The dust cap is generally attached to the first diaphragm 406 with glue or tape.

The first voice coil 416 includes wire leads 434 that are routed up the bobbin and lead through the dust cap and onto the first diaphragm 406. The wire leads 434 are generally coupled to braided wires 436, sometimes referred to as tinsel wires that are routed to the outer edge of the first diaphragm 406 and out to terminals 438 that are attached to the frame 410. Skilled artisans will appreciate that there are various methods for attaching electrical terminals to the first voice coil 416. For example, the braided wires 436 can be routed along the first spider 418, down the support structure 420, and out through the bottom of the frame 410.

The second diaphragm 408 is mechanically coupled to the common frame 410 through a second surround 442. The second diaphragm 408 is also mechanically coupled to a second bobbin 444. The second bobbin 444 can be fabricated from any suitable material including plastic, paper, cardboard, fiberglass, or Kapton, for example. A second voice coil 446 is mechanically coupled to the second bobbin 444. For example, the second voice coil 446 can be wound around the second bobbin 444. A second spider 448 couples the second bobbin 444 to the frame 410. The second bobbin 444 positions the second voice coil 446 in a second magnetic flux gap 452 of the second motor structure 404 in the magnet assembly 402. The second magnetic flux gap 452 substantially surrounds the first magnetic flux gap 422.

The second motor structure 404 substantially surrounds the first motor structure 403. The second motor structure 404 includes a top plate 454, a permanent magnet 456, and a back plate/pole assembly 458. The permanent magnet 456 can be a ring magnet. The permanent magnet 456 can be fabricated from a rare earth-based magnetic material or any other known magnetic material.

In one embodiment, the permanent magnet 456 is magnetized in a direction that is normal to its flat surface. The north pole of the permanent magnet 456 can be located on its upper surface and the south pole can be located on its lower surface. However, the permanent magnet 456 can also be positioned with its poles reversed as long as the proper polarity is maintained to ensure that the second voice coil 446 moves in the desired direction.

Magnetic flux emanates from the top of the permanent magnet 456 and is conducted through the top plate 454 which can be fabricated from any magnetically permeable material, such as steel. The magnetic flux then crosses through the second magnetic flux gap 452 and onto the back plate/pole assembly 458 and then to the permanent magnet 456. Thus, a second magnetic circuit is formed with magnetic flux passing through the second magnetic flux gap 452.

The second voice coil 446 includes wire leads 464 that are routed up the bobbin and lead under the second diaphragm 408. The wire leads 464 are generally coupled to braided wires 466 that are routed over the second spider 448 and out to terminals 468 that are attached to the frame 410. Skilled artisans will appreciate that the braided wires can be routed to the terminals 468 in various ways. For example, the wires can be routed along the diaphragm 408 and out to terminals that are mounted to the frame 410.

The frame 410 can be formed using various techniques. For example, the frame 410 can be formed from a single piece of material or can be fabricated in multiple sections. The frame 410 includes vents 470 to allow acoustic energy from between the diaphragms 406, 408 to propagate substantially unattenuated. The frame 410 also includes vents 472 to allow acoustic energy from the rear surface of the second diaphragm 408 to propagate substantially unattenuated. The vents 470, 472 can be distributed around the circumference of the frame 410. Acoustically transparent scrim cloth 474 can be used to cover the vents 470 to protect the second magnetic gap 452 from dust and debris.

In operation, an external source (not shown) such as an amplifier includes output terminals that are electrically connected to the terminals 438, 468. The terminals 438, 468 can be connected to the same output terminal on the amplifier as long as the diaphragms 406, 408 are properly configured to move in mechanically opposite directions when an input signal is applied to the terminals 438, 468. This configuration can include inverting the magnetism of one of the magnets 426, 456 with respect to the other magnet 426, 456 while maintaining the proper relative polarity of the voice coils 416, 446. For example, the windings in the voice coils 416, 446 can be inverted, the polarity of the terminals 438, 468 can be reversed, as previously described.

An input signal applied to the terminals 438, 468 causes the first voice coil 416 to move in one direction and causes the second voice coil 446 to move in the substantially opposite direction. For example, a positive voltage applied to the terminal 438 causes the first voice coil 416 to move upward and a positive voltage applied to the terminal 468 causes the second voice coil 446 to move downward. This causes the first diaphragm 406 to move mechanically opposite to the second diaphragm 408. The movement of the second diaphragm 408 reduces a resultant mechanical force applied to the frame 410 by the combined movement of the first 406 and the second diaphragms 408 as compared to a movement of the first diaphragm 406 alone. Thus, a reduction in the mechanical force applied to the frame 410 by the movement of the first diaphragm 406 is observed, even if the diaphragms 406, 408 and/or the motor structures 403, 404 are not identical.

In addition, an input signal applied to the first voice coil 416 can be different than an input signal applied to the second voice 446. For example, the input signals can be the same at low frequencies but can be different at higher frequencies. Also, the input signals can be modified to compensate for asymmetries in the motor structures 403, 404 and diaphragms 406, 408 to further reduce the resultant mechanical force applied to the frame 410 by the movement of the first 406 and the second diaphragms 408.

The motor structures 403, 404, and diaphragms 406, 408 can be driven in mechanical phase opposition over at least a portion of the low frequency range of an input signal. The low frequency range of an input signal can create a significant amount of movement from the diaphragms 406, 408. Some of that movement can create mechanical forces and/or vibrations in the frame 410. The resultant mechanical forces/vibrations coupled into the frame 410 are significantly reduced in the transducer 400, while the acoustic output from the transducer 400 is increased due to the combined acoustic output of both diaphragms 406, 408 compared to a similarly-sized transducer having a single diaphragm. It should be noted that various structures designed to couple acoustic output from the second diaphragm 408 to the listening area are shown in following figures.

The motor structures 403, 404 and the diaphragms 406, 408 can be made similar in order to obtain a large reduction in mechanical forces applied to the frame 410. However, even non-identical motor structures 403, 404 and the diaphragms 406, 408 can create a significant reduction in mechanical forces applied to the frame 410. Skilled artisans will appreciate that it is generally desirable to make the resonant frequencies of the moving structures match each other closely. This can be accomplished by designing various assemblies to include approximately the same moving mass and total suspension stiffness. Moving masses can be adjusted by changing diaphragm materials or diaphragm geometry including thickness. Other methods can also be applied, such as by adding weights and/or modifying other moving structure components, such as voice coil windings, spiders, dustcaps, and surrounds. It can be also desirable to closely match the behavior of the motor structures 403, 404. Since the magnetic gaps 422, 452 have substantially different diameters, the components in the motor structures 403, 404 can be designed such that the motor structures 403, 404 have similar characteristics.

The fabrication of the transducer 400 can require certain design considerations due to the asymmetric nature of the transducer 400. In one embodiment, the dynamics of the first motor structure 403/diaphragm 406/suspension combination and the second motor structure 404/diaphragm 408/suspension combination are designed to be substantially the same. For example, the diaphragms, spiders, dustcaps, and surrounds can be configured so that the moving masses are the same, the stiffness in each respective suspension system are the same, and the motor forces are the same. One way to characterize motor force is by using a quantity known as beta .beta. Beta .beta. is a motor quality factor and is defined as:

$$\beta = \frac{(bl)^2}{r_e}$$

where b is the flux density in the gap, l is the length of wire in the voice coil, and r.sub.e is the DC resistance of the voice coil. Thus, by varying one or more of these parameters, the motor quality factor for each motor structure 403, 404 can be designed to be substantially the same. For example, the system can be designed so that a voltage applied to each voice coil 416, 466 results in a similar force output into a system having a similar moving mass and a similar stiffness.

Thus, in one embodiment, the dynamics of the moving systems are designed to be substantially the same, and the force outputs of the motor structures are designed to be substantially the same. The moving system consists of the diaphragm, dust cap (if present), a portion of the surround, a portion of the spider, and the voice coil (including wire and bobbin). There can also be some mass associated with the air load on the diaphragm (if the areas of the diaphragms are similar, the mass of the air loads will be similar). The total moving mass for the transducer sub-assemblies should be approximately equal. The total suspension stiffness from the spider and the surround of each transducer sub-assembly should also be approximately equal. The total suspension stiffness can also be affected by an optional back enclosure (not shown).

Each of the motor structures 403, 404 are formed from a magnet 426, 456, a back plate/pole piece 428, 458, a top plate 424, 454, along with a voice coil 416, 446. It can be desirable for the beta .beta. of each transducer sub-assembly to be the same, as well as the DC resistance of the voice coils. If each of the parameters that define the characteristics of the transducer sub-assemblies are the same (e.g., beta, DCR, mass, compliance, etc.), the transducer sub-assemblies can have very similar dynamic behavior.

However, due to possible asymmetry in some of the components, it can be necessary to choose actual components that are significantly different from each other so that the overall behavior of the transducer sub-assemblies is similar. For example, voice coils can have different diameters, with different numbers of windings, diaphragms can have different masses to make up for voice coil differences, magnetic gap dimensions can be made different, and/or different quantities of magnet material may be used, in order to improve the dynamic symmetry between the two transducer sub-assemblies. In one embodiment, the primary characteristics to match are the area of the diaphragms, the moving masses, the motor force constants (beta), and the stiffness of the suspensions of the transducer sub-assemblies.

In one embodiment, the acoustic output from the second diaphragm 408 is not coupled to the listening area, and its movement is only used to reduce a resultant force on the frame 410 that is caused by the movement of the first diaphragm 406.

Figure 14:
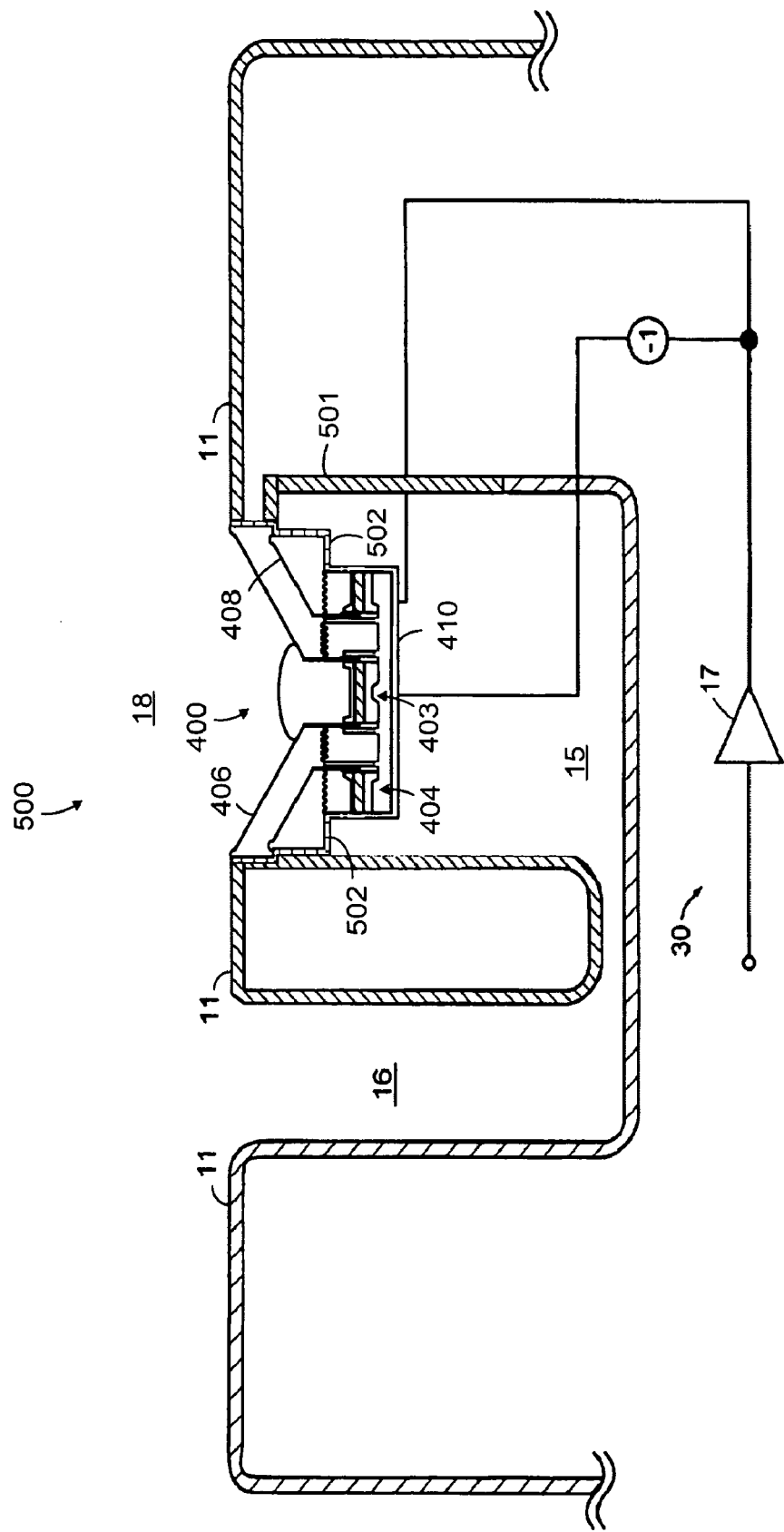
FIG. 14 illustrates a cross-sectional view of a loudspeaker system including the electro-acoustic transducer of FIG. 13 mounted to an infinite baffle according to one embodiment of the invention.

FIG. 14 illustrates a cross-sectional view of a loudspeaker system 500 including the electro-acoustic transducer 400 of FIG. 13 mounted to an infinite baffle 11 according to one embodiment of the invention. The infinite baffle 11 is similar to the infinite baffle 11 described with reference to FIG. 1A. The frame 410 of the electro-acoustic transducer 400 is mounted to the infinite baffle 11 using mounting hardware such as screws, clips, glue, or sealant, for example. An acoustic shield 501 can prevent acoustic energy from the cavity 30 from undesirably combining with acoustic energy in the acoustic path 15, 16.

The front surface of the first diaphragm 406 is acoustically coupled to the listening area 18. If the baffle 11 is the rear package shelf of a vehicle, the listening area 18 is the passenger compartment of the vehicle. The rear surface of the first diaphragm 406 is acoustically coupled to the cavity 30, which would be the vehicle trunk if the baffle 11 is the rear package shelf.

The frame 410 in this embodiment includes additional vent holes 502 that allow acoustic energy from rear surface of the second diaphragm 408 to propagate to listening area 18 through the acoustic path 15, 16. The rear surface of the first diaphragm 406 and the front surface of the second diaphragm 408 are acoustically coupled to the cavity 30. Instead of a rear package shelf of a vehicle, the baffle 11 can be a wall, floor, or ceiling of a room and the electro-acoustic transducer 400 can be positioned behind or flush with the wall, below the floor, or above the ceiling.

A power amplifier 17 energizes the motor structures 403, 404 of the electro-acoustic transducer 400 with the same signal but drives them in mechanical opposition. The system is arranged such that when the first diaphragm 406 is moving in one direction, the second diaphragm 408 is moving in the substantially opposite direction, which significantly reduces the resultant mechanical forces applied to the baffle 11 compared to forces applied to the baffle 11 from a movement of one of the diaphragms 406, 408. This also reduces undesired resultant vibrations of the baffle 11. Meanwhile, the acoustic output from the rear surface of the second diaphragm 408 is coupled through the acoustic path 16 to the listening area 18 for emission that is substantially in phase with the output from the front surface of the first diaphragm 406. Thus, the input signal from the amplifier 17 that is applied to the second motor structure 404 causes the second diaphragm 408 to move in an opposite direction from the direction of movement of the first diaphragm 406 to reduce a resultant force imparted to the baffle 11 while maintaining the acoustic output.

The acoustic output from the rear surface of the second diaphragm 408 could also be coupled through a conduit of substantially constant or smoothly varying cross section to the listening area 18 without loss of generality. In some embodiments (not shown), the cavity 30 can include one or more acoustic ports, acoustic waveguides, or passive radiators that can couple acoustic energy from the cavity 30 to the listening area 18. As previously described, any acoustic element can be used.

In one embodiment, separate amplifiers can be used to drive each voice coil 416, 446 (FIG. 13) separately. This allows different signals to be applied to each voice coil 416, 446 in the transducer 400. Equalization can be used to compensate for differences in the behavior of individual transducer sub-assemblies to achieve a larger reduction in the resultant force on the baffle 11 from the movement of the diaphragms 406, 408.

Figure 15:
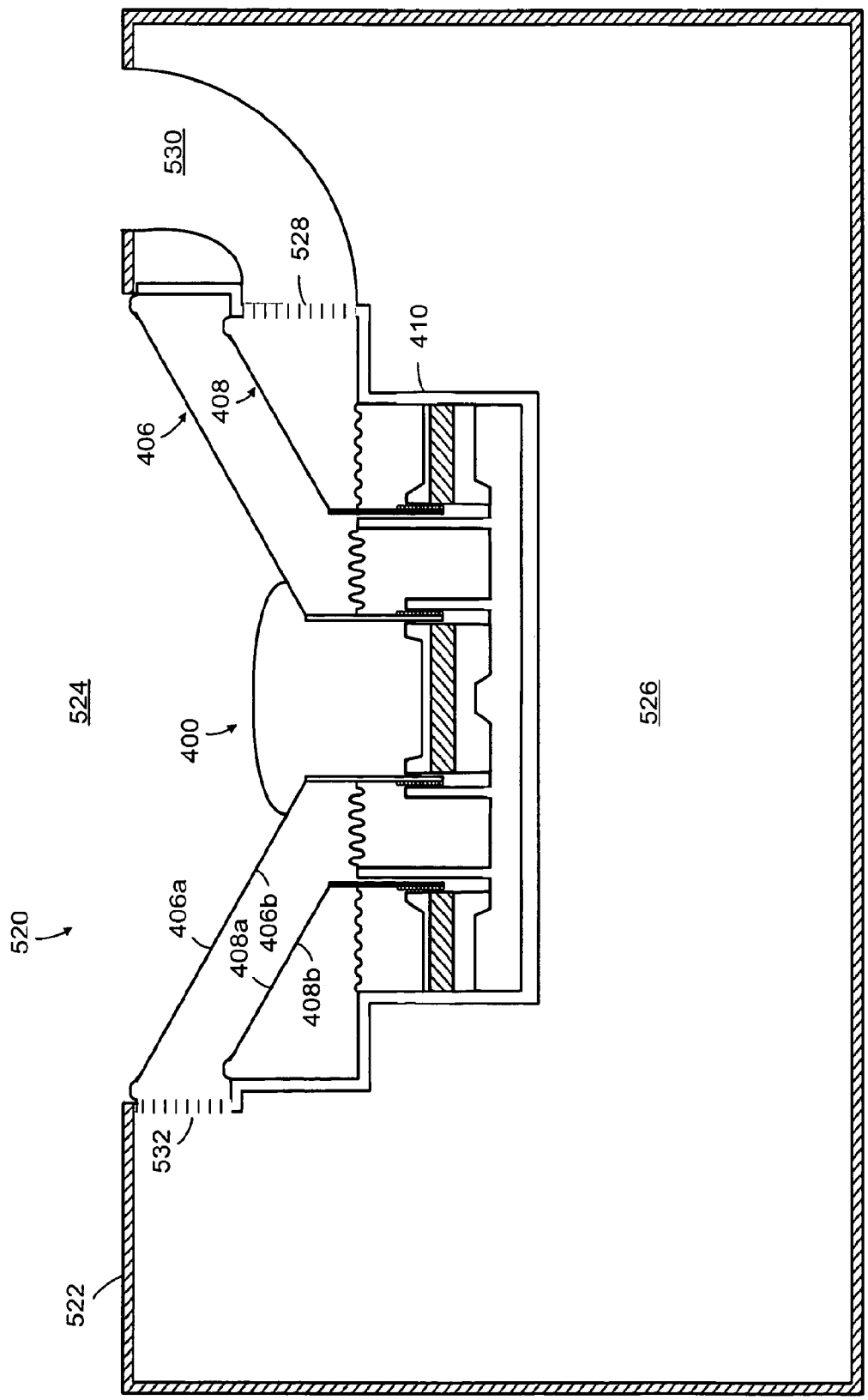
FIG. 15 illustrates a cross-sectional view of a loudspeaker system including the electro-acoustic transducer of FIG. 13 mounted to an enclosure according to one embodiment of the invention.

FIG. 15 illustrates a cross-sectional view of a loudspeaker system 520 including the electro-acoustic transducer 400 of FIG. 13 mounted to an enclosure 522 according to one embodiment of the invention. The electro-acoustic transducer 400 is mounted to the enclosure 522 using mounting hardware.

The front surface 406a of the first diaphragm 406 is acoustically coupled to a listening area 524. The rear surface 406b of the first diaphragm 406 is acoustically coupled to a cavity 526 in the enclosure 522.

The frame 410 of the electro-acoustic transducer 400 includes vent holes 528 that allow acoustic energy from rear surface 408b of the second diaphragm 408 to propagate to listening area 524 through an acoustic path 530.

A front surface 408a of the second diaphragm 408 is also acoustically coupled to the cavity 526 through vent holes 532. In some embodiments, the enclosure 522 can include one or more acoustic ports, acoustic waveguides, passive radiators, or other acoustic elements that can couple acoustic energy from the cavity 526 to the listening area 524.

In another embodiment, the second diaphragm 408 is merely utilized to reduce a mechanical force imparted to the enclosure 522 from the movement of the first diaphragm 406. In this embodiment, the acoustic energy generated by the movement of the second diaphragm 408 is not used. In this embodiment, the path 530 that couples the rear surface of the diaphragm 408 to the listening area 524 can be omitted.

Figure 16:
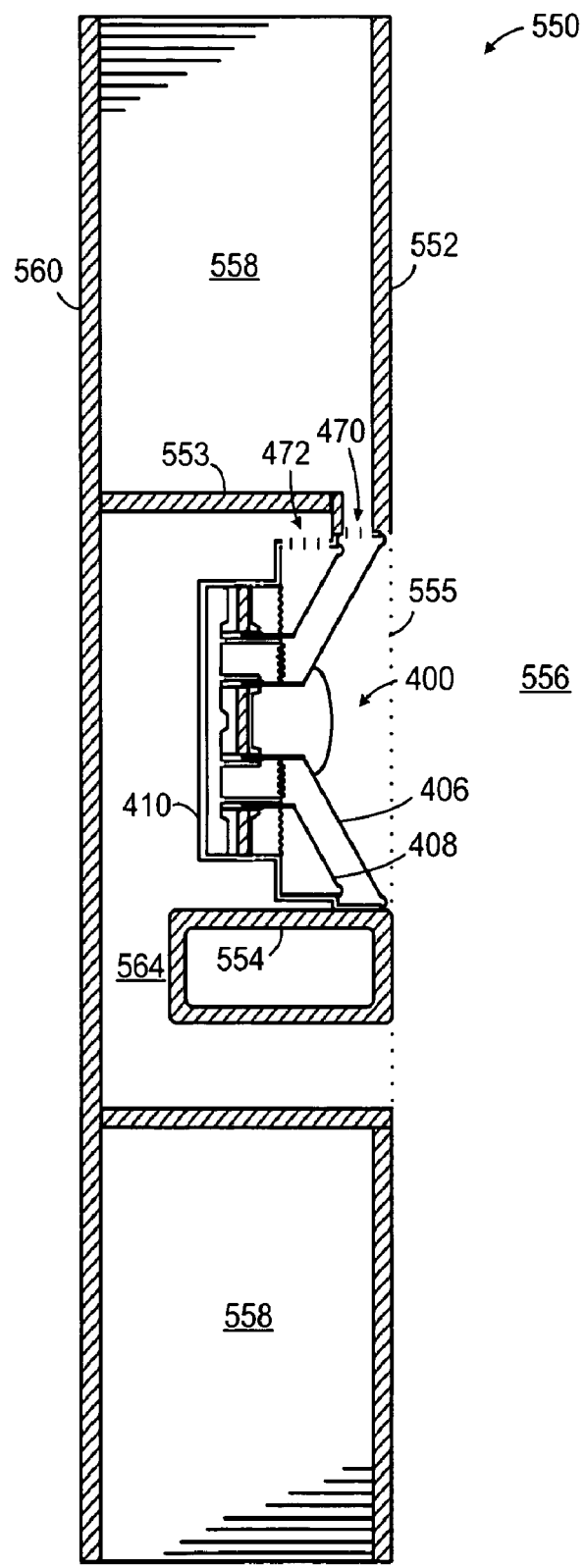
FIG. 16 illustrates a cross-sectional view of a loudspeaker system including the electro-acoustic transducer of FIG. 13 mounted to a structural panel according to one embodiment of the invention.

FIG. 16 illustrates a cross-sectional view of a loudspeaker system 550 including the electro-acoustic transducer 400 of FIG. 13 mounted to a structural panel 552 according to one embodiment of the invention. The structural panel 552 is similar to the infinite baffle 11 described with reference to FIG. 14. For example, the structural panel 552 can be a wall, floor, ceiling, door or other structure in a room. The frame 410 of the electro-acoustic transducer 400 is mounted to the structural panel 552 using mounting hardware such as screws, clips, glue, or sealant, for example. Mechanical structures 553, 554 can prevent acoustic energy emanating from between the diaphragms 406, 408 from undesirably combining with acoustic energy emanating from the rear surface of the second diaphragm 408. A screen or grill 555 can be used to cover the electro-acoustic transducer 400.

The front surface of the first diaphragm 406 is acoustically coupled to a listening area 556. The rear surface of the first diaphragm 406 is acoustically coupled to a cavity 558 through the vent holes 470 in the frame 410. The cavity 558 is the space between the structural panel 552 and another structural panel 560. The frame 410 in this embodiment also includes the vent holes 472 that allow acoustic energy from the rear surface of the second diaphragm 408 to propagate to the listening area 556 through an acoustic path 564. A front surface of the second diaphragm 408 is coupled to the cavity 558.

An amplifier (not shown) energizes the motor structures 403, 404 (FIG. 13) of the electro-acoustic transducer 400 with the same signal but drives them in mechanical opposition. The system is arranged such that when the first diaphragm 406 is moving in one direction, the second diaphragm 408 is moving in the substantially opposite direction, which significantly reduces the resultant force applied to the structural panel 552. This also reduces undesired resultant vibrations of the structural panel 552. Meanwhile, the acoustic output from the rear surface of the second diaphragm 408 is coupled by the acoustic path 564 to the listening area 556 for emission that is substantially in phase with the output from the front surface of the first diaphragm 406. Thus, the input signal from the amplifier causes the second diaphragm 408 to move in an opposite direction from the direction of movement of the first diaphragm 406 to reduce the resultant force imparted to the structural panel 552 while maintaining the acoustic output.

The acoustic output from the rear surface of the second diaphragm 408 could also be coupled through a conduit of substantially constant or smoothly varying cross section to the listening area 556 without loss of generality. In some embodiments (not shown), the cavity 558 can include one or more acoustic ports, acoustic waveguides, or passive radiators that can couple acoustic energy from the cavity 558 to the listening area 556, as previously described.

FIG. 17A is a cross-sectional view of an electro-acoustic transducer 600 according to another embodiment of the invention. The embodiment shown in FIG. 17A is similar to the embodiment shown in FIG. 13, but includes a magnet assembly 602 having single motor structure 604 with a first 606 and a second magnetic gap 608. The magnet assembly 602 includes a single ring magnet 610.

The electro-acoustic transducer 600 of FIG. 17A is shown generally circularly symmetric. However, circular symmetry is generally not required. For example, the first 406 and the second diaphragms 408 can be elliptical, oval, or any other desired shape. Additionally, the first 406 and the second diaphragms 408 can have the same or different surface areas. The motor structure 604 can also be circularly symmetric or any other desired shape.

The first diaphragm 406 is mechanically coupled to the first voice coil 416 through the first bobbin 414. The first spider 418 couples the first bobbin 414 to a support structure 420. The first bobbin 414 positions the first voice coil 416 in the first magnetic flux gap 606 of the motor structure 604 in the magnet assembly 602. The motor structure 604 includes a top plate 612, the permanent magnet 610, and a back plate assembly 614. The permanent magnet 610 can be fabricated from a rare earth-based magnetic material such as Samarian Cobalt, Neodymium-Iron-Boron, and/or any other known magnetic material.

In one embodiment, the permanent magnet 610 is magnetized in a direction that is normal to its flat surface. The north pole of the permanent magnet 610 can be located on its upper surface and the south pole can be located on its lower surface. However, the permanent magnet 610 can also be positioned with its poles reversed.

Magnetic flux emanates from the top of the permanent magnet 610 and is conducted through the top plate 612 which can be fabricated from any magnetically permeable material, such as steel. The magnetic flux then crosses through the first magnetic flux gap 606 and onto the back plate assembly 614 and back to the permanent magnet 610. Thus, a first magnetic circuit is formed with magnetic flux passing through the first magnetic flux gap 606.

The electrical leads that electrically couple an external amplifier to the first voice coil 416 are not shown. Skilled artisans will appreciate that there are various methods for attaching electrical terminals to the first voice coil 416.

The second diaphragm 408 is mechanically coupled to the second voice coil 446 through the second bobbin 444. The second spider 448 couples the second bobbin 444 to the frame 410. The second bobbin 444 positions the second voice coil 446 in the second magnetic flux gap 608 of the motor structure 604 in the magnet assembly 602. The second magnetic flux gap 608 substantially surrounds the first magnetic flux gap 606. The motor structure 604 also includes the back plate assembly 614 corresponding to the second magnetic flux gap 608.

Magnetic flux emanates from the top of the permanent magnet 610 and is conducted through the top plate 612. The magnetic flux then crosses through the second magnetic flux gap 608 and onto the back plate assembly 614 and back to the permanent magnet 610. Thus, a second magnetic circuit is formed with magnetic flux passing through the second magnetic flux gap 608.

The first and the second magnetic circuit can be designed such that the magnetic flux emanating from the magnet 610 is split in a desired manner. Thus, the dimensions of the air gaps 606, 608 can be designed in combination with the voice coils 416, 446 such that the desired beta .beta. is observed for each motor structure. In one embodiment, the beta .beta. is substantially equivalent for each motor structure.

In operation, an external source (not shown) such as an amplifier includes output terminals that are electrically connected to the voice coils 416, 446. The voice coils 416, 446 are configured having the appropriate polarity such that they move in substantially opposite directions when an input signal is applied to them. An input signal applied to the voice coils 416, 446 causes the first voice coil 416 to move in one direction and causes the second voice coil 446 to move in the substantially opposite direction. This causes the first diaphragm 406 to move in mechanical phase opposition to the second diaphragm 408. The movement of the second diaphragm 408 reduces a mechanical force applied to the frame 410 by the movement of the first diaphragm 406. Thus, a reduction in the mechanical force applied to the frame 410 by the movement of the first diaphragm 406 is observed, even if the diaphragms 406, 408 are not identical.

Figure 17B:
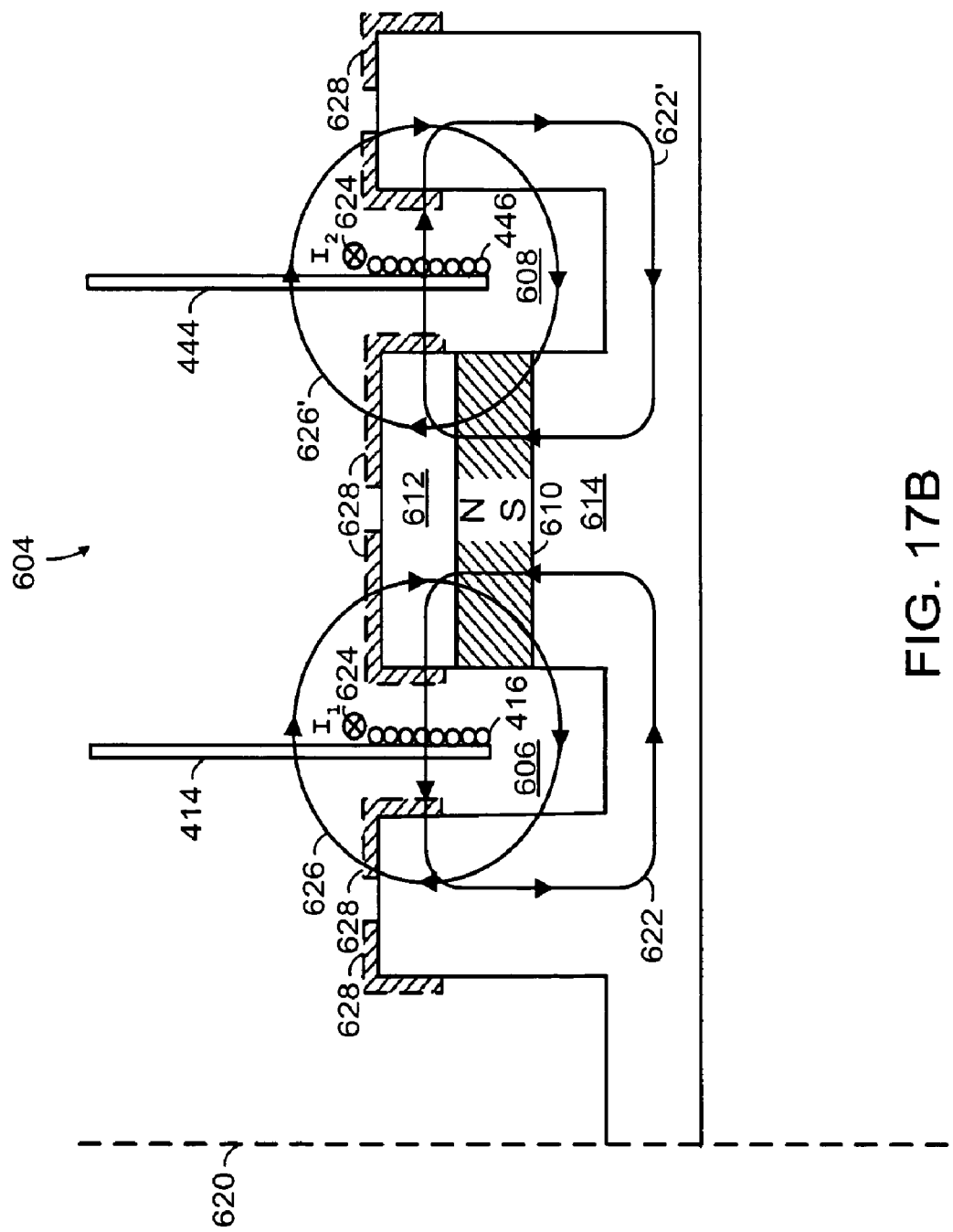
FIG. 17B is a cross-sectional view of the motor structure in the electro-acoustic transducer of FIG. 17A.

FIG. 17B is a cross-sectional view of the motor structure 604 in the electro-acoustic transducer 600 of FIG. 17A. A line of symmetry 620 divides the motor structure 604 so that only the right side of the motor structure 604 is shown. The complete motor structure 604 can be illustrated by rotating FIG. 17B around the line of symmetry 620. A static magnetic field having magnetic field lines 622, 622' emanates from the top (north pole) of the ring magnet 610 and is conducted through the top plate 612. The magnetic field lines 622, 622' then cross through the first 606 and the second magnetic gaps 608, respectively, and onto the back plate assembly 614. The magnetic field lines 622, 622' then return to the south pole of the ring magnet 610. Thus, two magnetic circuits are formed having opposite relative polarity.

An input signal having a current $I_1$ is applied to the first voice coil 416 in a first direction 624 that drives the first voice coil 416 with a first polarity. The current $I_1$ generates a first magnetic field having field lines 626. The first magnetic field is generally an alternating-current (AC) magnetic field. The first magnetic field having field lines 626 can cause flux modulation distortion in the electro-acoustic transducer 600. Flux modulation distortion is a phenomenon that results from the interaction of the first magnetic field having field lines 626 generated by the first voice coil 416 with the static magnetic field generated by the ring magnet 610. Specifically, the strength of the static magnetic field is undesirably varied due to interference from the first magnetic field 626 generated by the first voice coil 416.

An input signal having a current $I_2$ is applied to the second voice coil 446 in the same direction 624 as the input signal applied to the first voice coil 416. The second voice coil 446 is wound in the same direction as the first voice coil 416. The current $I_2$ generates a second magnetic field having field lines 626'. Thus, the first voice coil 416 and the second voice coil 466 move in mechanical phase opposition relative to each other. This is due to the direction of the magnetic field lines 622 in the first magnet flux gap 606 being opposite to the direction the magnetic field lines 622' in the second magnetic flux gap 608.

The flux modulation distortion can be reduced since the second magnetic field generated by the second voice coil 446 has opposite polarity to the first magnetic field generated by the first voice coil 416. Thus, since the magnetic fields generated by the voice coils 416, 446 are in substantially opposite directions, the interaction between the static magnetic field from the magnet 610 and the magnetic fields generated by the voice coils 416, 446 can be reduced.

The flux modulation distortion can also be suppressed by positioning one or more optional copper (or other conducting material) shorting rings 628 adjacent to magnetic gaps 606, 608 in the motor structure 604. Shorting rings 628 can also minimize the change in inductance of a voice coil as a function of position in the gap.

Figure 18:
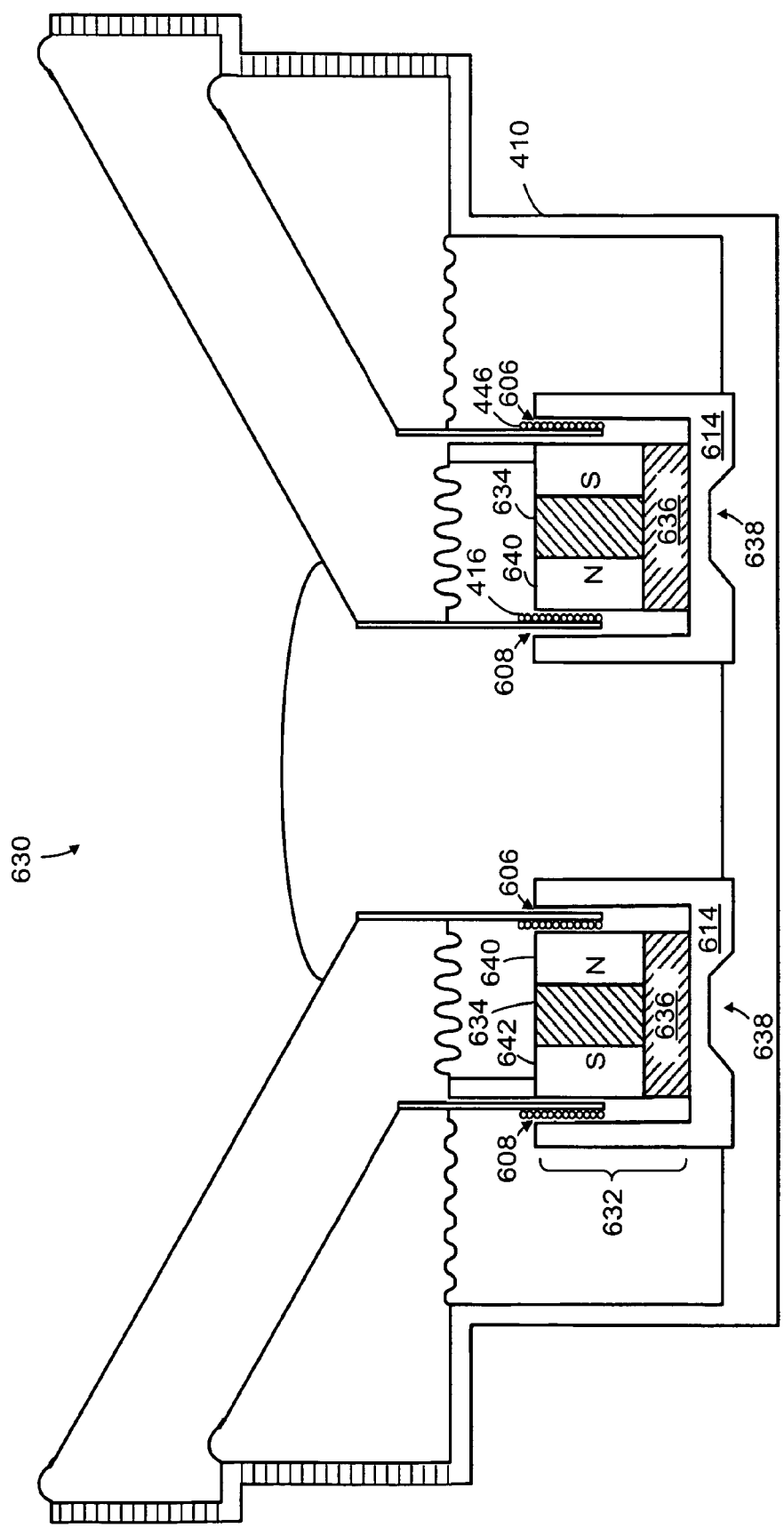
FIG. 18 is a cross-sectional view of an electro-acoustic transducer according to another embodiment of the invention.

FIG. 18 is a cross-sectional view of an electro-acoustic transducer 630 according to another embodiment of the invention. The embodiment shown in FIG. 18 is similar to the embodiment shown in FIG. 17A, but includes a magnet assembly 632 having an alternative ring magnet 634 which is a radially magnetized ring magnet also known as a donut magnet. The magnet assembly 632 includes the ring magnet 634 as well as a magnetic isolator 636. The magnetic isolator is configured to prevent a magnetic short circuit from occurring. The magnetic isolator 636 can be fabricated from a plastic or other non-magnetically permeable material.

The ring magnet 634 is configured such that its magnetic poles are located on its vertical surfaces in a direction that is parallel to its flat surface. For example, the north magnetic pole can be located on the inside vertical surface of the ring magnet 634 and the south magnetic pole can be located on the outside vertical surface of the ring magnet 634. However, the ring magnet 634 can also be magnetized with its poles reversed.

The magnet assembly 632 includes a motor structure 638 having the ring magnet 634, the magnetic isolator 636, the back plate assembly 614, a first side plate 640, and a second side plate 642. Magnetic flux emanates from the inside surface of the ring magnet 634, propagates through the first side plate 640, and crosses through the first magnetic flux gap 606 and onto the back plate assembly 614. The magnetic flux then propagates through the second magnetic flux gap 608, and then propagates through the second side plate 642 back to the outside surface of the ring magnet 634. Thus, a magnetic circuit is formed having magnetic flux that passes through the first 606 and the second magnetic flux gap 608.

In operation, an external source (not shown) such as an amplifier includes output terminals that are electrically connected to the voice coils 416, 446. The voice coils 416, 446 are configured having appropriate polarity such that they move in mechanical opposition when an input signal is applied to them. An input signal applied to the voice coils 416, 446 causes the first voice coil 416 to move in one direction and causes the second voice coil 446 to move in the substantially opposite direction. This causes the first diaphragm 406 to move in mechanical opposition to the second diaphragm 408. The movement of the second diaphragm 408 reduces a mechanical force applied to the frame 410 by the movement of the first diaphragm 406. Thus, a reduction in the resultant mechanical force applied to the frame 410 by the movement of the first diaphragm 406 is observed, even if the diaphragms 406, 408 are not identical. It should be noted that the input signals applied to the voice coils 416, 446 need not be identical as long as the proper polarity is maintained. In one embodiment, the input signals are modified individually prior to being applied to each of the voice coils 416, 446 to tune the movement of each voice coil 416, 446. This tuning can further reduce the resultant mechanical force applied to the frame 410 from the movement of the diaphragms 406, 408, as previously described with reference to FIG. 13.

Figure 19:
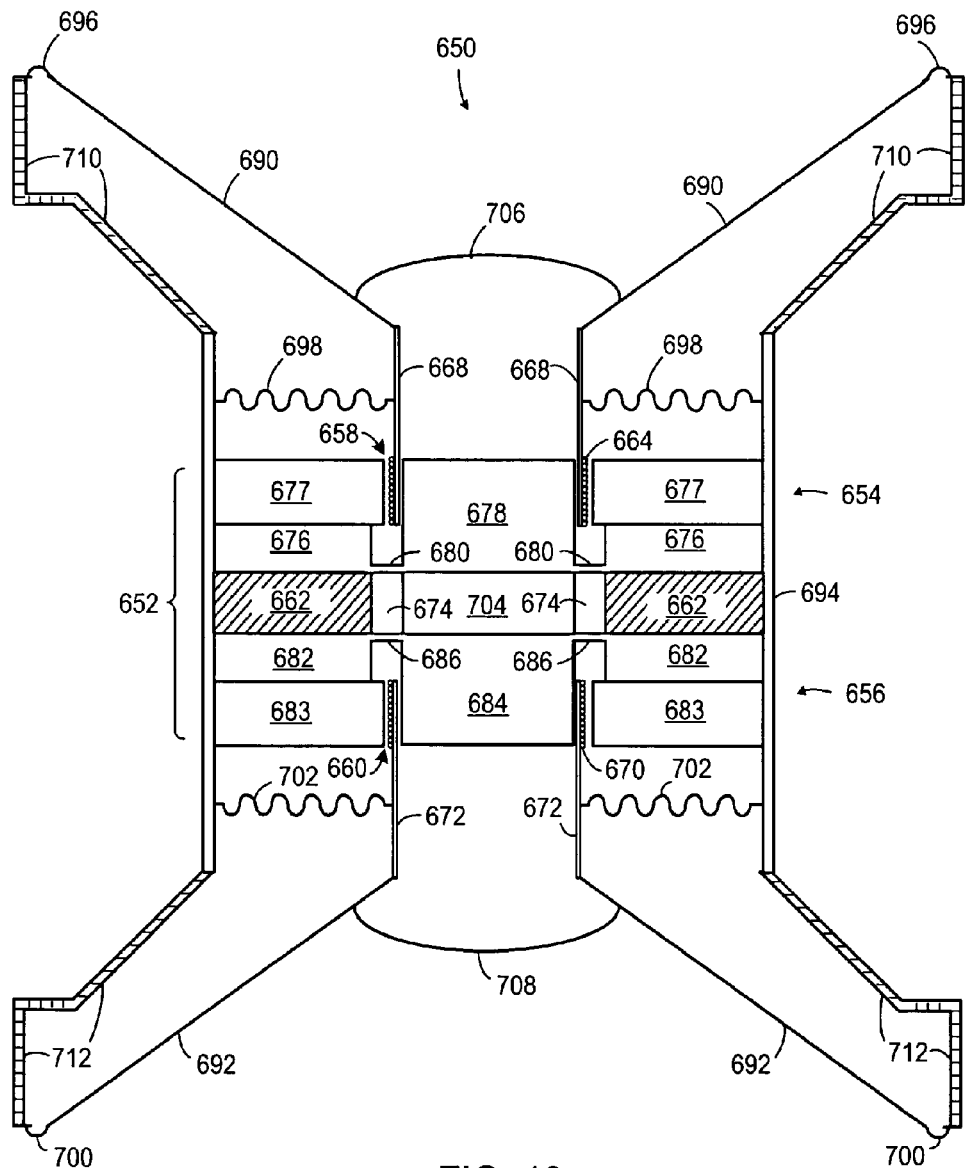
FIG. 19 is a cross-sectional view of an electro-acoustic transducer according to another embodiment of the invention.

FIG. 19 is a cross-sectional view of an electro-acoustic transducer 650 according to another embodiment of the invention. The electro-acoustic transducer 650 is a moving coil type transducer. However, a moving magnet type transducer could also be constructed. The electro-acoustic transducer 650 includes a magnet assembly 652 having two motor structures 654, 656 each with a single magnetic flux gap 658, 660. The two motor structures 654, 656 share a single ring magnet 662.

A first voice coil 664 is wound around a first bobbin 668. The first voice coil 664 is positioned in the first magnetic flux gap 658. A second voice coil 670 is wound around a second bobbin 672. The second voice coil 670 is positioned in the second magnetic flux gap 660. The first 664 and the second voice coils 670 can have substantially the same diameter. The two motor structures 654, 656 can have an over-hung or under-hung design. The first magnetic flux gap 658 is adjacent to the second magnetic flux gap 660. In one embodiment, an air gap 674 separates the first magnetic flux gap 658 from the second magnetic flux gap 660. A non-magnetically conducting isolator can be positioned in the air gap 674. The first 658 and second magnetic flux gap 660 can have substantially the same diameter.

The first motor structure 654 includes a first magnetically permeable plate 676 that is positioned adjacent to the magnet 662. A first top plate 677 is mechanically coupled to the first magnetically permeable plate 676. The first magnetically permeable plate 676 is also mechanically coupled to a first pole plate 678 through a first rigid support member 680. The first rigid support member 680 is fabricated to be as thin as possible while still maintaining structural integrity. The first rigid support structure 680 can create a magnetic short circuit in the first motor structure 654. It is desirable to minimize the magnitude of the magnetic short, and thus, the first rigid support structure 680 contains as little material as necessary to maintain the structural integrity of the first motor structure 654. This is not limited to minimizing the thickness of the rigid support structure. Changing from a continuous disc to a series of radial spokes (not shown) can also aid in minimizing the magnitude of the magnetic short. In another embodiment (not shown), the first rigid support structure 680 is replaced by an isolator that increases structural integrity while preventing a magnetic short circuit in the first motor structure 654. The isolator can be fabricated from a non-magnetically permeable material.

Figure 20:
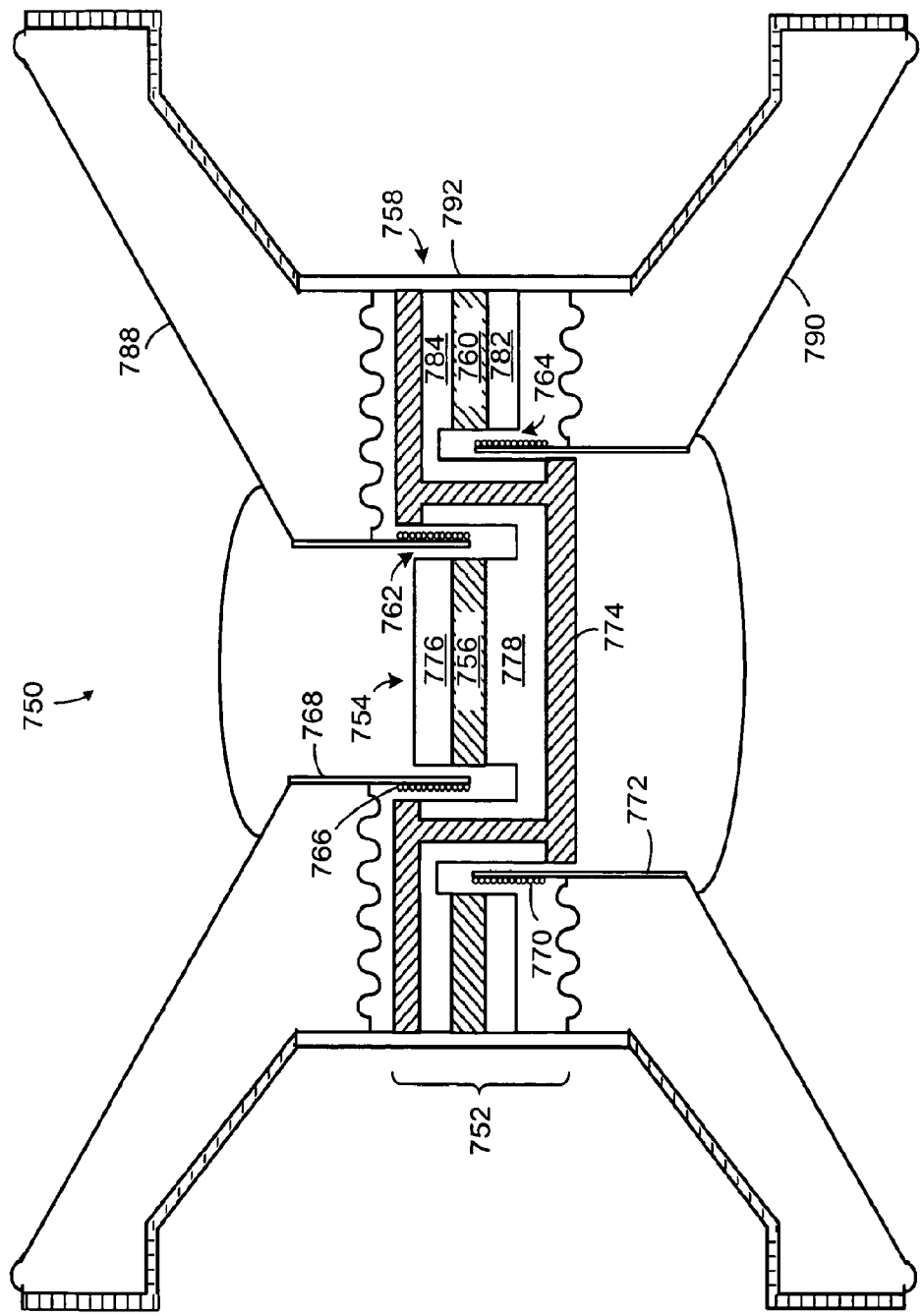
FIG. 20 is a cross-sectional view of an electro-acoustic transducer according to another embodiment of the invention.

The second motor structure 656 includes a second magnetically permeable plate 682 that is positioned adjacent to the magnet 662. A second top plate 683 is mechanically coupled to the second magnetically permeable plate 682. The second magnetically permeable plate 682 is also mechanically coupled to a second pole plate 684 through a second rigid support member 686. Similar to the first rigid support structure 680, the second rigid support member 686 is fabricated to be as thin as possible while still maintaining structural integrity of the second motor structure 656. Other magnet assemblies having other motor structures geometries are also possible. For example, FIG. 20 illustrates a magnet assembly having a first and a second motor structure each having a permanent magnet.

The electro-acoustic transducer 650 also includes a first 690 and second diaphragm 692 mounted to a common frame or basket 694. In order to prevent the common frame 694 from shorting the magnetic circuit at the outer diameter, the frame can be fabricated in sections and/or the frame can be fabricated from non-magnetically permeable material. The electro-acoustic transducer 650 is shown generally circularly symmetric. However, circular symmetry is generally not required. For example, the first 690 and the second diaphragms 692 can be elliptical, oval, or any other desired shape. Additionally, the first 690 and the second diaphragms 692 can have the same or different surface areas. The motor structures 654, 656 can also be circularly symmetric or any other desired shape.

The first diaphragm 690 is mechanically coupled to the common frame 694 through a first surround 696. The first diaphragm 690 is also mechanically coupled to the first bobbin 668. A first spider 698 couples the first bobbin 668 to the common frame 694. The first bobbin 668 positions the first voice coil 664 in the first magnetic flux gap 658 of the first motor structure 654 in the magnet assembly 652.

The second diaphragm 692 is mechanically coupled to the common frame 694 through a second surround 700. The second diaphragm 692 is also mechanically coupled to the second bobbin 672. A second spider 702 couples the second bobbin 672 to the common frame 694. The second bobbin 672 positions the second voice coil 670 in the second magnetic flux gap 660 of the second motor structure 656 in the magnet assembly 652.

In one embodiment, the permanent magnet 662 is magnetized in a direction that is normal to its flat surface. The north pole of the permanent magnet 662 can be located on its upper surface and the south pole can be located on its lower surface. However, the permanent magnet 662 can also be positioned with its poles reversed as long as the proper polarity is maintained to ensure that the first 664 and the second voice coils 670 move in the desired directions.

Magnetic flux emanates from the top surface of the permanent magnet 662 and is conducted through the first magnetically permeable plate 676 and through the first top plate 677. The magnetic flux then crosses through the first magnetic flux gap 658 and onto the first pole plate 678. A center plate 704 conducts the magnetic flux through the second pole plate 684. The magnetic flux then crosses through the second magnetic flux gap 660 and onto the second top plate 683. The magnetic flux then propagates through the second magnetically permeable plate 682 and back to the permanent magnet 662. Thus, a magnetic circuit is formed with magnetic flux passing through the first 658 and the second magnetic flux gaps 660. The center plate 704 can also be fabricated from a magnetically permeable material, such as steel.

If the rigid support structures 680, 686 are magnetically permeable, magnetic flux will travel from the magnet 662 to the first magnetically permeable plate 676 through the rigid support structure 680, to the first pole plate 678, to the center plate 704 to the second pole plate 684 through the rigid support structure 686 to the second magnetically permeable plate 682 and back to the magnet 662. As previously described, this effect is minimized by keeping the rigid support structures 680, 686 as thin as possible.

A first 706 and a second dust cap 708 can be positioned on the first 690 and the second diaphragms 692 to protect the first 654 and the second motor structures 656 from debris that can impact the operation of the transducer 650. The dust caps 706, 708 are generally attached to the diaphragms 690, 692 with glue.

The frame 694 can be formed using various techniques. For example, the frame 694 can be formed from a single piece of material or can be fabricated in multiple sections. As previously described, the frame 694 should be fabricated so as not to short circuit the motor structures 654, 656. The frame 694 can include a first 710 and second set of vents 712 to allow acoustic energy and air from between the diaphragms 690, 692 to radiate out from the from the frame 694. The set of vents 710, 712 can be distributed around the circumference of the frame 694. The vents 710, 712 are not drawn to scale and the vents can be located in other areas around the frame 694. The vents 710, 712 should be designed so that the fluid velocity is kept low enough to prevent the vents 710, 712 from making noise when the transducer 650 is operating.

The first 664 and the second voice coils 670 include wire leads (not shown) that are routed up the first 668 and the second bobbin 672 and eventually lead to terminals (not shown) that are attached to the frame 694. For example, the wire leads can be routed through the dust caps 706, 708, onto each of the diaphragms 690, 692, and braided flexible wires can lead out to terminals attached to the frame 694. Alternatively, the braided flexible wires can be routed along the spiders 698, 702 and out to terminals attached to the frame 694. Skilled artisans will appreciate that there are various methods for attaching electrical terminals to the first 664 and the second voice coils 670.

In operation, an external source (not shown) such as an amplifier includes output terminals that are electrically connected to the terminals (not shown) that are attached to the frame 694. The terminals attached to the frame 694 can be connected to the same output terminal on the amplifier as long as the motor structures 654, 656 are properly configured so that the moving elements move in substantially opposite directions when an input signal is applied to the terminals.

An input signal applied to the terminals causes the first voice coil 664 to move in one direction and causes the second voice coil 670 to move in the substantially opposite direction. This causes the first diaphragm 690 to move in an opposite direction from the second diaphragm 692. The movement of the second diaphragm 692 reduces a mechanical force applied to the frame 694 by the movement of the first diaphragm 690. Thus, a reduction in the mechanical force applied to the frame 694 by the movement of the first diaphragm 690 is observed.

FIG. 20 is a cross-sectional view of an electro-acoustic transducer 750 according to another embodiment of the invention. The electro-acoustic transducer 750 is similar to the electro-acoustic transducer 650 of FIG. 19, but includes an alternate magnet assembly 752. The magnet assembly 752 includes a first motor structure 754 having a slug magnet 756 and a second motor structure 758 having a ring magnet 760. The first motor structure 754 includes a first magnetic gap 762 and the second motor structure 758 includes a second magnetic gap 764.

A first voice coil 766 is wound around a first bobbin 768. The first voice coil 766 is positioned in the first magnetic flux gap 762. A second voice coil 770 is wound around a second bobbin 772. The second voice coil 770 is positioned in the second magnetic flux gap 764. The second voice coil 770 substantially surrounds the first voice coil 766, and thus, the second magnetic flux gap 764 substantially surrounds the first magnetic flux gap 762. The two motor structures 754, 758 can have an over-hung or under-hung design. An isolator 774 can be positioned between the two motor structures 754, 758. The isolator 774 can be fabricated from plastic or any other suitable non-magnetically permeable material.

The first motor structure 754 includes a first top plate 776 that is mechanically coupled to the magnet 756. A first back plate assembly 778 is also mechanically coupled to the magnet 756. The second motor structure 758 includes a second top plate 782 that is mechanically coupled to the ring magnet 760. A second back plate assembly 784 is also mechanically coupled to the ring magnet 760.

The electro-acoustic transducer 750 also includes a first 788 and second diaphragm 790 mounted to a common frame or basket 792. The first diaphragm 788 is mechanically coupled to the first voice coil 766 through the first bobbin 768. The second diaphragm 790 is mechanically coupled to the second voice coil 770 through the second bobbin 772. The first 788 and the second diaphragms 790 can be elliptical, oval, or any other desired shape. Additionally, the first 788 and the second diaphragms 790 can have the same or different surface areas. The motor structures 754, 758 can also be circularly symmetric or any other desired shape.

An input signal applied to the first 766 and the second voice coils 770 causes the first voice coil 766 to move in one direction and causes the second voice coil 770 to move in the substantially opposite direction. This causes the first diaphragm 788 to move in an opposite direction from the second diaphragm 790. The movement of the second diaphragm 790 reduces a mechanical force applied to the frame 792 by the movement of the first diaphragm 788. Thus, a reduction in the mechanical force applied to the frame 792 by the movement of the first diaphragm 788 is observed.

It is evident that those skilled in the art may now make numerous uses and modifications of and departures from the specific apparatus and techniques herein disclosed without departing from the inventive concepts. For example, in general inverted and non-inverted motor structures can be used. Transducer orientations can be the same or inverted relative to each other. As long as the motion from the diaphragms of the transducers is such that force vectors are oriented to destructively interfere (i.e., the resultant magnitude of the force is reduced). Consequently, the invention is to be construed as embracing each and every novel feature and novel combination of features present in or possessed by the apparatus and techniques herein disclosed and limited only by the spirit and scope of the appended claims.

What is claimed is:

1. An apparatus for reducing baffle vibration in a vehicle, the apparatus comprising:

a) a baffle that is subject to vibration;

b) a first transducer that is seated in the baffle, the first transducer comprising a first diaphragm having a first surface that is acoustically coupled to a listening area in the vehicle and a second surface that is acoustically coupled to a cavity in the vehicle, the first transducer configured to react to a first input signal applied to the first transducer by causing the first diaphragm to move in a first direction, thereby generating an acoustic output; and c) a second transducer that is mechanically coupled to the first transducer, the second transducer comprising a second diaphragm having a first surface that is acoustically coupled to the second surface of the first diaphragm and to the cavity, and a second surface that is acoustically coupled to the listening area, the second transducer configured to react to a second input signal applied to the second transducer by causing the second diaphragm to move in a second direction, the movement of the second diaphragm reducing a vibration imparted to the baffle from the movement of the first diaphragm while substantially maintaining the acoustic output when the second direction is substantially opposite to the first direction.

2. The apparatus of claim 1 wherein the first and second transducers move in opposite directions when the first input signal and the second input signal have opposite relative polarity.

3. The apparatus of claim 1 wherein the first and second transducers move in opposite directions when the first input signal and the second input signal are identical.

4. The apparatus of claim 1 wherein the first surface of the first diaphragm comprises a front surface of the first diaphragm and a second surface of the first diaphragm comprises a rear surface of the first diaphragm.

5. The apparatus of claim 1 wherein the first surface of the first diaphragm comprises a rear surface of the first diaphragm and a second surface of the first diaphragm comprises a front surface of the first diaphragm.

6. The apparatus of claim 1 wherein the first surface of the second diaphragm comprises a front surface of the second diaphragm and a second surface of the second diaphragm comprises a rear surface of the second diaphragm.

7. The apparatus of claim 1 wherein the first surface of the second diaphragm comprises a rear surface of the second diaphragm and a second surface of the second diaphragm comprises a front surface of the second diaphragm.

8. The apparatus of claim 1 wherein the second transducer is inverted relative to the first transducer.

9. The apparatus of claim 1 wherein a motor structure of the first transducer is mechanically coupled to a motor structure of the second transducer.

10. The apparatus of claim 1 wherein a frame of the first transducer is mechanically coupled to a frame of the second transducer.

11. The apparatus of claim 1 wherein the second surface of the first diaphragm is acoustically coupled to a passive radiator.

12. The apparatus of claim 1 wherein the second surface of the second diaphragm is acoustically coupled to the listening area in the vehicle through an acoustic conduit.

13. The apparatus of claim 12 where the acoustic conduit comprises a smoothly varying cross-sectional area.

14. The apparatus of claim 1 wherein the second surface of the second diaphragm is acoustically coupled to the listening area in the vehicle through an acoustic port.

15. The apparatus of claim 1 wherein an acoustic output from the second surface of the second diaphragm is coupled to the listening area in the vehicle substantially in-phase with the acoustic output from the first surface of the first diaphragm.

16. The apparatus of claim 1 wherein the cavity comprises a trunk of the vehicle.

17. The apparatus of claim 1 wherein at least one of the first and the second transducers further comprises an inverted motor structure.

18. The apparatus of claim 1 further comprising at least one low pass filter that is coupled to at least one of the first and the second transducers, the at least one low pass filter restricting spectral components of at least one of the first and the second input signals above a predetermined cutoff frequency.

19. The apparatus of claim 18 wherein the at least one low pass filter comprises one of an electrical low pass filter and an acoustical low pass filter.

20. The apparatus of claim 1 wherein the baffle is mounted behind a dashboard.

21. The apparatus of claim 1 wherein the baffle is a dashboard.

22. A loudspeaker system comprising:

a) an enclosure comprising a first acoustic volume and a first acoustic element, a combination of the first acoustic volume and the first acoustic element having a first resonant frequency, the first acoustic element coupling acoustic energy from the first acoustic volume to outside the enclosure;

b) a sub-enclosure that is positioned at least partially inside the enclosure, the sub-enclosure comprising a second acoustic volume and a second acoustic element, a combination of the second acoustic volume and the second acoustic element having a second resonant frequency, the second acoustic element coupling acoustic energy from the second acoustic volume to outside the sub-enclosure;

c) a first transducer that is mounted to the sub-enclosure, the first transducer comprising a first diaphragm having a first surface that is acoustically coupled to the first acoustic volume and a second surface that is acoustically coupled to the second acoustic volume, the first transducer configured to react to a first input signal applied to the first transducer by causing the first diaphragm to move in a first direction; and d) a second transducer that is mounted to the sub-enclosure, the second transducer comprising a second diaphragm having a first surface that is acoustically coupled to the first acoustic volume and a second surface that is acoustically coupled to the second acoustic volume, the second transducer configured to react to a second input signal applied to the second transducer by causing the second diaphragm to move in a second direction, the movement of the second diaphragm reducing a vibration imparted to the sub-enclosure from the movement of the first diaphragm when the second direction is substantially opposite to the first direction.

23. The loudspeaker system of claim 22 wherein the first resonant frequency and the second resonant frequency are the same.

24. The loudspeaker system of claim 22 wherein the first resonant frequency is lower than the second resonant frequency.

25. The loudspeaker system of claim 22 wherein the second acoustic element couples acoustic energy from the second acoustic volume to outside the enclosure.

26. The loudspeaker system of claim 22 wherein the second acoustic element couples acoustic energy from the second acoustic volume to the first acoustic volume.

27. The loudspeaker system of claim 22 wherein at least one of the first and the second acoustic elements comprises an acoustic port.

28. The loudspeaker system of claim 22 wherein at least one of the first and the second acoustic elements comprises a passive radiator.

29. The loudspeaker system of claim 22 wherein the sub-enclosure is rigidly coupled to the enclosure.

30. The loudspeaker system of claim 22 wherein at least one of the first and the second transducers comprises an inverted motor structure.

31. The loudspeaker system of claim 22 wherein the first transducer is inverted relative to the second transducer.

32. The loudspeaker system of claim 22 further comprising an additional sub-enclosure that is positioned at least partially inside the enclosure.

33. The loudspeaker system of claim 22 further comprising an additional sub-enclosure that is positioned at least partially inside the sub-enclosure.

34. The loudspeaker system of claim 22 wherein the loudspeaker system is mounted behind a dashboard.

* * * * *